(12) United States Patent
Lin et al.

(10) Patent No.: US 11,855,192 B2
(45) Date of Patent: Dec. 26, 2023

(54) SEMICONDUCTOR DEVICE AND MANUFACTURING METHOD THEREOF

(71) Applicants: TAIWAN SEMICONDUCTOR MANUFACTURING COMPANY, LTD., Hsinchu (TW); TSMC Nanjing Company Limited, Nanjing (CN)

(72) Inventors: Han-Yu Lin, Nantou County (TW); Fang-Wei Lee, Hsinchu (TW); Kai-Tak Lam, Hsinchu (TW); Raghunath Putikam, Hsinchu (TW); Tzer-Min Shen, Hsinchu (TW); Li-Te Lin, Hsinchu (TW); Pinyen Lin, Rochester, NY (US); Cheng-Tzu Yang, Hsinchu County (TW); Tzu-Li Lee, Yunlin County (TW); Tze-Chung Lin, Hsinchu (TW)

(73) Assignees: TAIWAN SEMICONDUCTOR MANUFACTURING COMPANY, LTD., Hsinchu (TW); TSMC NANJING COMPANY LIMITED, Nanjing (CN)

( * ) Notice: Subject to any disclaimer, the term of this patent is extended or adjusted under 35 U.S.C. 154(b) by 103 days.

(21) Appl. No.: 17/152,432

(22) Filed: Jan. 19, 2021

(65) Prior Publication Data

US 2022/0173224 A1 Jun. 2, 2022

(30) Foreign Application Priority Data

Dec. 2, 2020 (CN) .................. 202011392694.X

(51) Int. Cl.
*H01L 29/66* (2006.01)
*H01L 21/8234* (2006.01)
*H01L 29/78* (2006.01)

(52) U.S. Cl.
CPC .. *H01L 29/6681* (2013.01); *H01L 21/823431* (2013.01); *H01L 29/785* (2013.01); *H01L 2029/7858* (2013.01)

(58) Field of Classification Search
CPC .............. H01L 29/6681; H01L 29/785; H01L 29/78696; H01L 21/823431
See application file for complete search history.

(56) References Cited

U.S. PATENT DOCUMENTS

| | | | | |
|---|---|---|---|---|
| 2014/0134827 | A1* | 5/2014 | Swaminathan | C23C 16/045 156/345.24 |
| 2015/0147873 | A1* | 5/2015 | Moriya | H01L 21/02658 438/492 |
| 2020/0273964 | A1* | 8/2020 | Lin | H01L 29/785 |

* cited by examiner

*Primary Examiner* — Christine A Enad
(74) *Attorney, Agent, or Firm* — Birch, Stewart, Kolasch & Birch, LLP

(57) ABSTRACT

A method includes forming a fin structure including a plurality of first semiconductor layers and a plurality of second semiconductor layers alternately stacked over a substrate. A dummy gate structure is formed across the fin structure. The exposed second portions of the fin structure are removed. A selective etching process is performed, using a gas mixture including a hydrogen-containing gas and a fluorine-containing gas, to laterally recess the first semiconductor layers. Inner spacers are formed on opposite end surfaces of the laterally recessed first semiconductor layers. Source/drain epitaxial structures are formed on opposite end surfaces of the second semiconductor layers. The dummy gate structure is removed to expose the first portion of the fin structure. The laterally recessed first semiconductor layers are removed. A gate structure is formed to surround each of the second semiconductor layers.

20 Claims, 49 Drawing Sheets

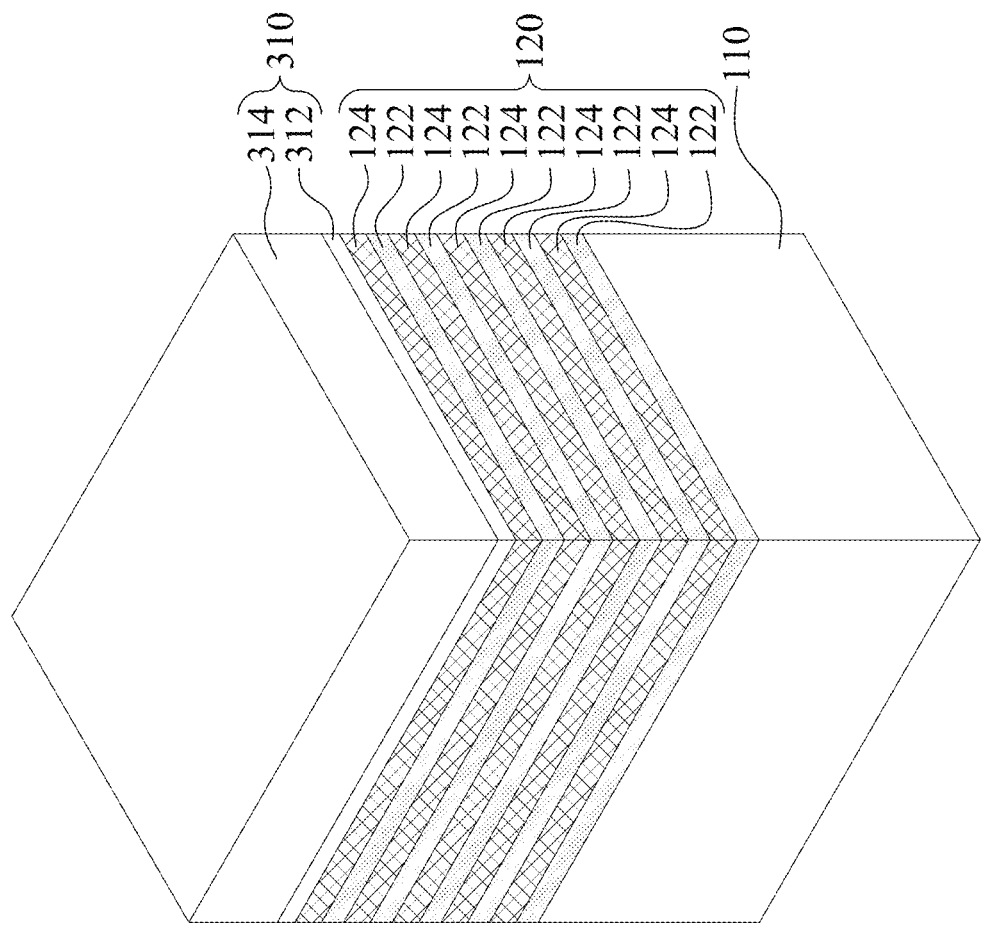
Fig. 1
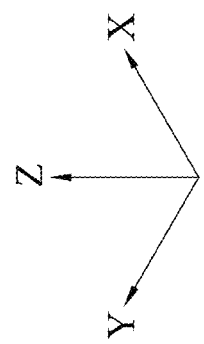

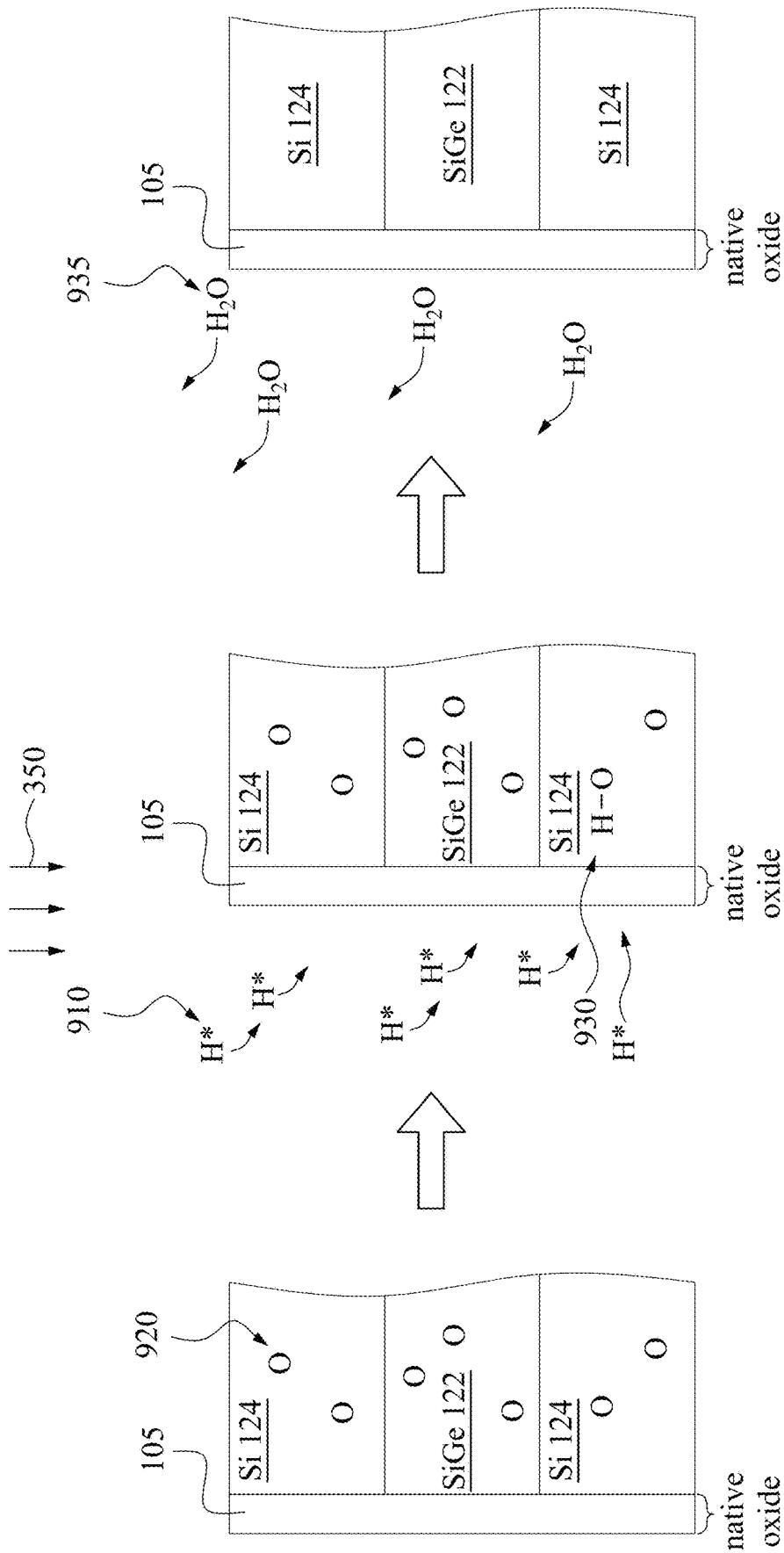

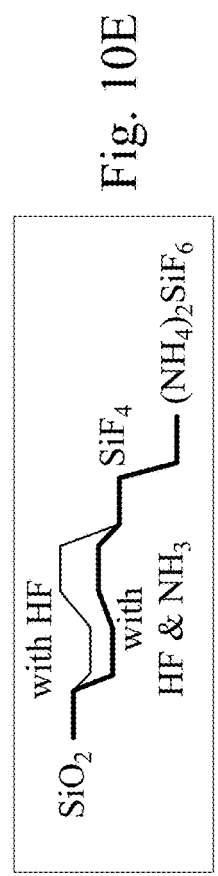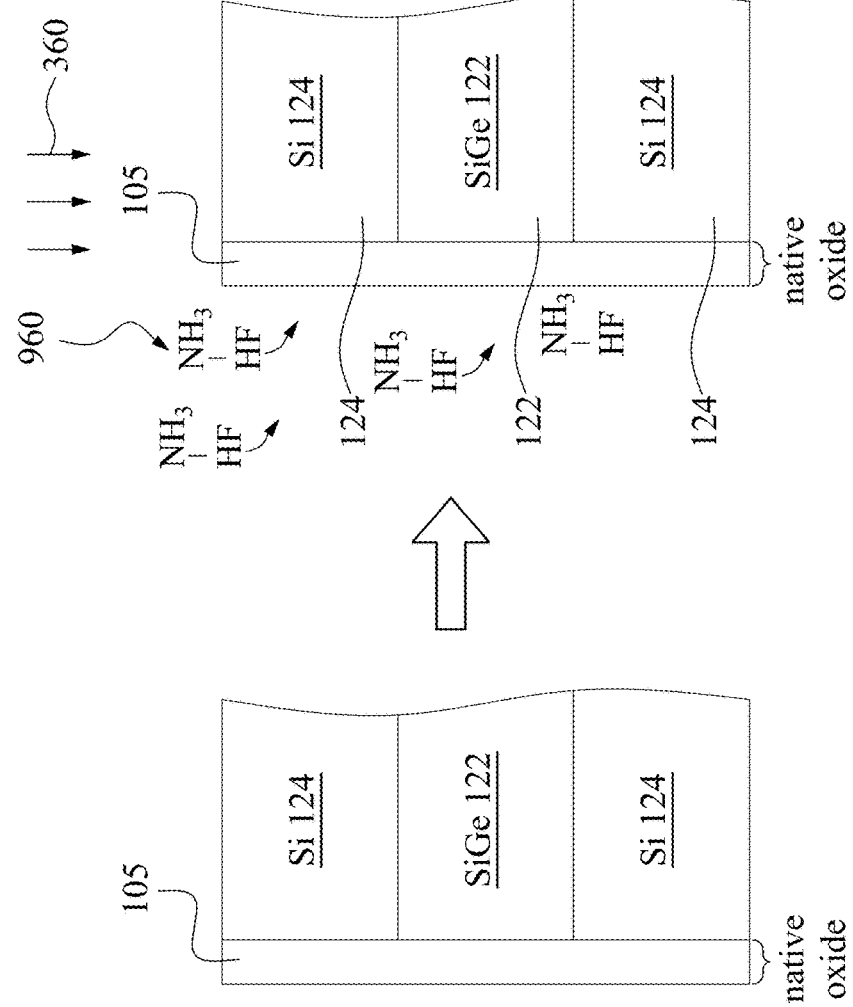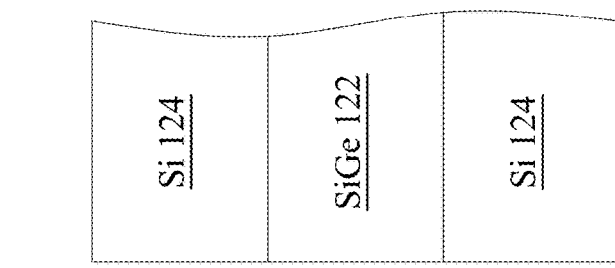

$GeF_3 + SiF_3 \rightarrow GeF_2 + SiF_4$ (g) [$E_A$ is about 0.28 eV to about 0.32 eV] (1)
$GeH_2F + SiHF_2 \rightarrow SiF_2 + GeH_3F$ (g) [$E_A$ is about 0.93 eV to about 0.97 eV] (2)
$SiF_3 + SiF_3 \rightarrow SiF_2 + SiF_4$ (g) [$E_A$ is about 1.48 eV to about 1.52 eV] (3)

SEMICONDUCTOR DEVICE AND MANUFACTURING METHOD THEREOF

PRIORITY CLAIM AND CROSS-REFERENCE

The present application claims priority to China Application Serial Number 202011392694.X, filed Dec. 2, 2020, which is herein incorporated by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1-21J illustrate a method for manufacturing a semiconductor device at various stages in accordance with some embodiments of the present disclosure.

DETAILED DESCRIPTION

Figure 2:
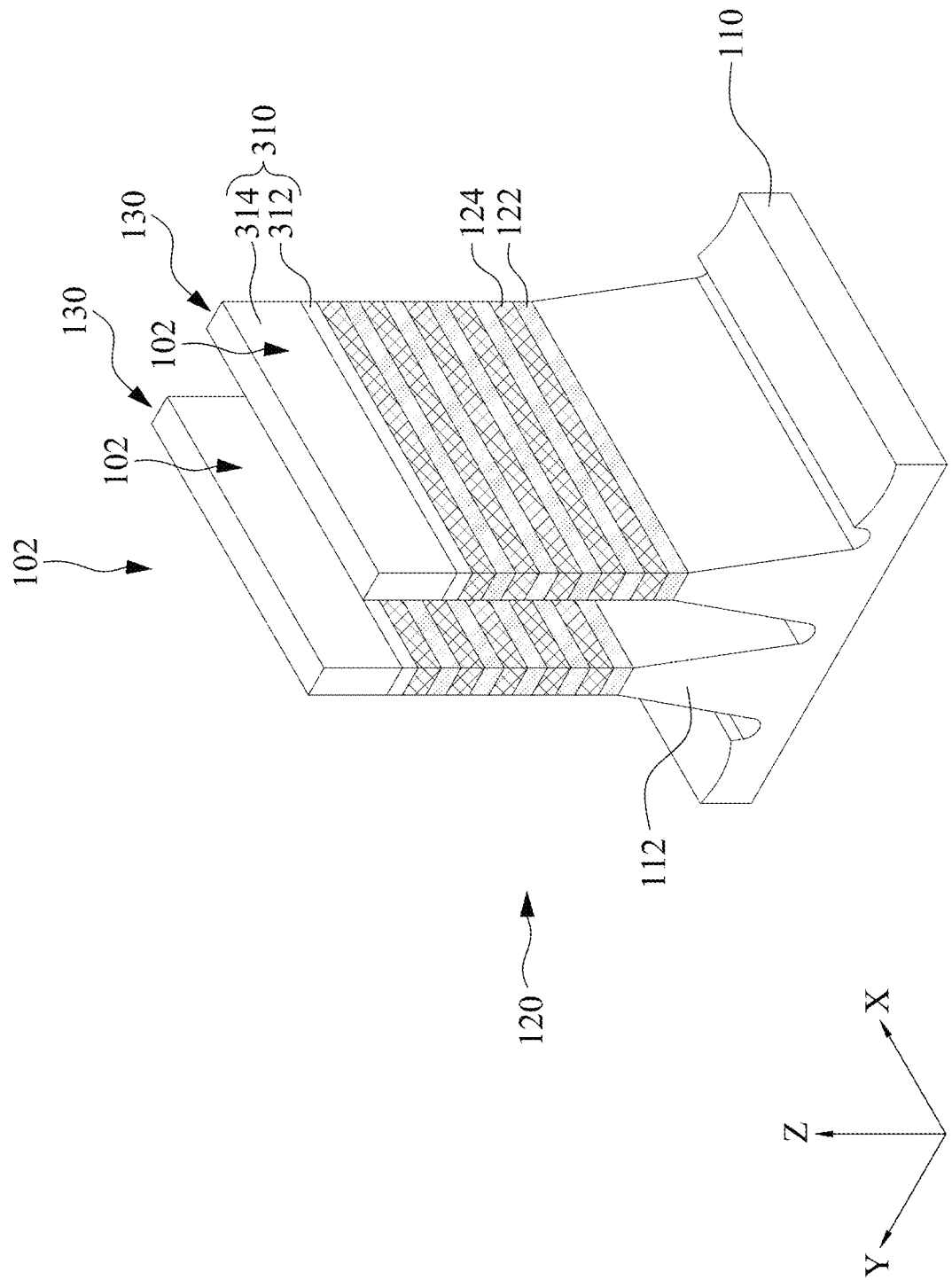

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The present disclosure is related to semiconductor devices and methods of forming the same. More particularly, some embodiments of the present disclosure are related to GAA devices including improved profiles of nanosheets and inner spacers. The GAA devices presented herein include a p-type GAA device or an n-type GAA device. Further, the GAA devices may have one or more channel regions (e.g., nanowires) associated with a single, contiguous gate structure, or multiple gate structures. One of ordinary skill may recognize other examples of semiconductor devices that may benefit from aspects of the present disclosure.

FIGS. 1-21J illustrate a method for manufacturing a semiconductor device at various stages in accordance with some embodiments of the present disclosure. In addition to the semiconductor device, FIGS. 1-21J depict X-axis, Y-axis, and Z-axis directions. In some embodiments, the semiconductor device shown in FIGS. 1-21J may be intermediate devices fabricated during processing of an integrated circuit (IC), or a portion thereof, that may include static random access memory (SRAM), logic circuits, passive components, such as resistors, capacitors, and inductors, and/or active components, such as p-type field effect transistors (PFETs), n-type FETs (NFETs), multi-gate FETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

Reference is made to FIG. 1. A substrate 110, which may be a part of a wafer, is provided. In some embodiments, the substrate 110 may include silicon (Si). Alternatively, the substrate 110 may include germanium (Ge), silicon germanium (SiGe), gallium arsenide (GaAs) or other appropriate semiconductor materials. In some embodiments, the substrate 110 may include a semiconductor-on-insulator (SOI)

structure such as a buried dielectric layer. Also alternatively, the substrate 110 may include a buried dielectric layer such as a buried oxide (BOX) layer, such as that formed by a method referred to as separation by implantation of oxygen (SIMOX) technology, wafer bonding, SEG, or another appropriate method. In various embodiments, the substrate 110 may include any of a variety of substrate structures and materials.

A stacked structure 120 is formed on the substrate 110 through epitaxy, such that the stacked structure 120 forms crystalline layers. The stacked structure 120 includes first semiconductor layers 122 and second semiconductor layers 124 stacked alternately. The first semiconductor layers 122 and the second semiconductor layers 124 are made of materials having different lattice constants, and may include one or more layers of Si, Ge, SiGe, GaAs, InSb, GaP, GaSb, InAlAs, InGaAs, GaSbP, GaAsSb or InP. In some embodiments, the first semiconductor layers 122 and the second semiconductor layers 124 are made of Si, a Si compound, SiGe, Ge or a Ge compound. In FIG. 1, five layers of the first semiconductor layer 122 and five layers of the second semiconductor layer 124 are disposed. However, the number of the layers are not limited to five, and may be as small as 1 (each layer) and in some embodiments, 2-10 layers of each of the first and second semiconductor layers are formed. By adjusting the numbers of the stacked layers, a driving current of the GAA FET device can be adjusted.

In some embodiments, the first semiconductor layers 122 can be SiGe layers having a germanium atomic percentage greater than zero. In some embodiments, the germanium percentage of the first semiconductor layers 122 is in the range between about 15 percent and about 35 percent. In some embodiments, the thickness of the first semiconductor layers 122 is in the range between about 4 nm and about 7 nm.

In some embodiments, the second semiconductor layers 124 may be pure silicon layers that are free from germanium. The second semiconductor layers 124 may also be substantially pure silicon layers, for example, with a germanium atomic percentage lower than about 1 percent. Furthermore, the second semiconductor layers 124 may be intrinsic, which are not doped with p-type and n-type impurities. In some embodiments, the thickness of the second semiconductor layers 124 is in the range between about 8 nm and about 10.5 nm.

Subsequently, a mask layer 310 is formed above the stacked structure 120. In some embodiments, the mask layer 310 includes a first mask layer 312 and a second mask layer 314. The first mask layer 312 may be a pad oxide layer made of a silicon oxide, which can be formed by a thermal oxidation. The second mask layer 314 may be made of a silicon nitride (SiN), which is formed by chemical vapor deposition (CVD), including low pressure CVD (LPCVD) and plasma enhanced CVD (PECVD), physical vapor deposition (PVD), atomic layer deposition (ALD), or other suitable process.

Reference is made to FIG. 2. The mask layer 310 (see FIG. 1) is patterned into a mask pattern by using patterning operations including photo-lithography and etching. After the patterning of the mask layer 310, the stacked structure 120 (see FIG. 1) is patterned by using the patterned mask layer 310 as an etch mask, such that the stacked structure 120 is patterned into fin structures 130 and trenches 102 extending in the X direction. In FIG. 2, two fin structures 130 are arranged in the Y direction. But the number of the fin structures is not limited to, and may be as small as one and three or more. In some embodiments, one or more dummy fin structures are formed on both sides of the fin structures 130 to improve pattern fidelity in the patterning operations.

The trenches 102 extend into the substrate 110, and have lengthwise directions substantially parallel to each other. The trenches 102 form base portions 112 in the substrate 110, where the base portions 112 protrude from the substrate 110, and the fin structures 130 are respectively formed above the base portions 112 of the substrate 110. The remaining portions of the stacked structure 120 are accordingly referred to as the fin structures 130 alternatively.

Figure 3:
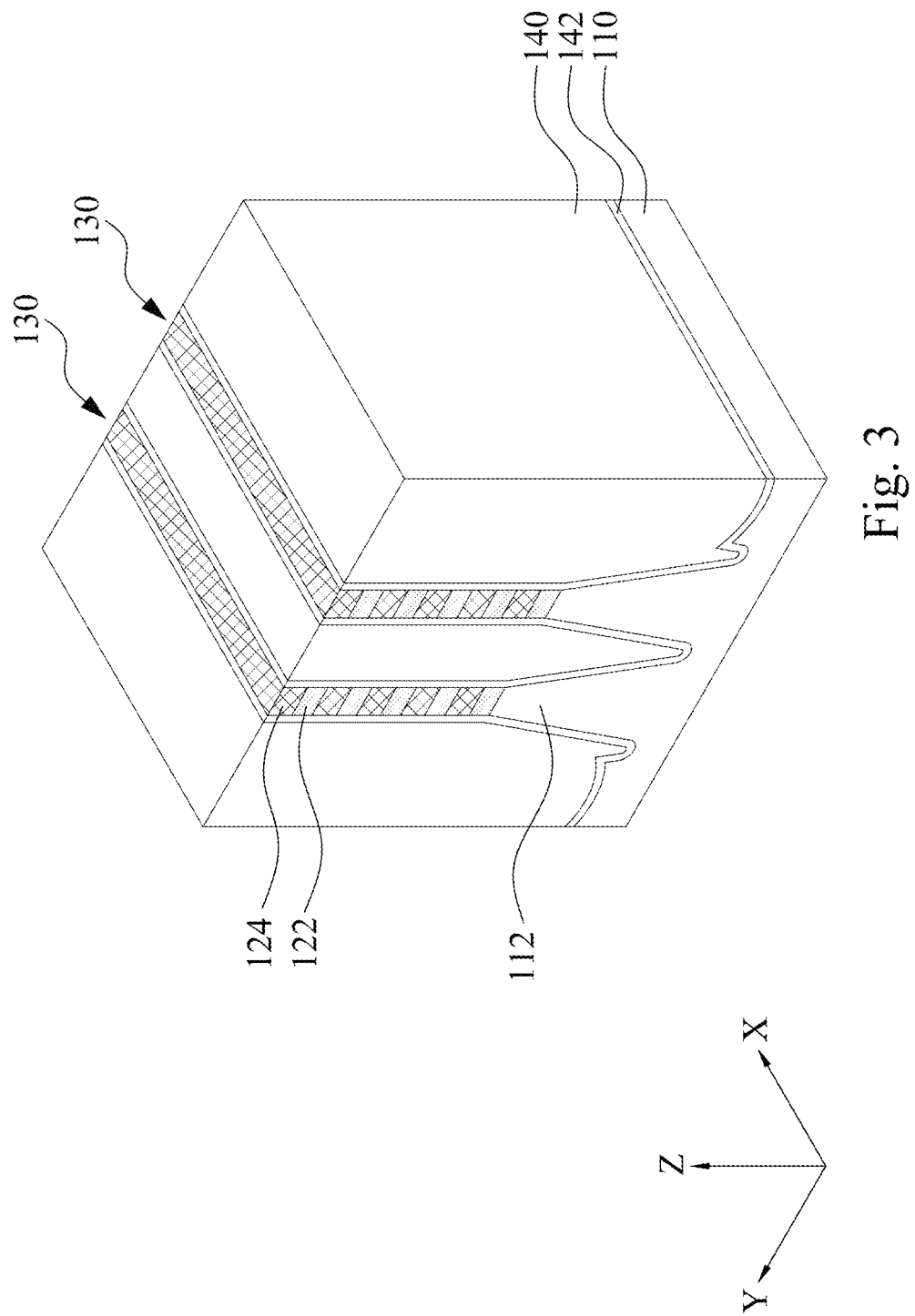

Reference is made to FIG. 3. After the fin structures 130 are formed, an insulating material layer 140 including one or more layers of insulating material is formed over the substrate 110 so that the fin structures 130 are fully embedded in the insulating material layer 140. The insulating material for the insulating material layer 140 may include silicon oxide, silicon nitride, silicon oxynitride (SiON), SiOCN, SiCN, fluorine-doped silicate glass (FSG), or a low-K dielectric material, formed by LPCVD (low pressure chemical vapor deposition), plasma-CVD or flowable CVD. An anneal operation may be performed after the formation of the insulating material layer 140, especially when the insulating material layer 140 is formed using flowable CVD. Then, a planarization operation, such as a chemical mechanical polishing (CMP) method or an etch-back method, is performed such that the upper surface of the uppermost second semiconductor layer 124 is exposed from the insulating material layer 140. In some embodiments, a first liner layer 142 is formed over the structure of FIG. 2 before forming the insulating material layer 140. The first liner layer 142 is made of SiN or a silicon nitride-based material (e.g., SiON, SiCN or SiOCN).

Figure 4:
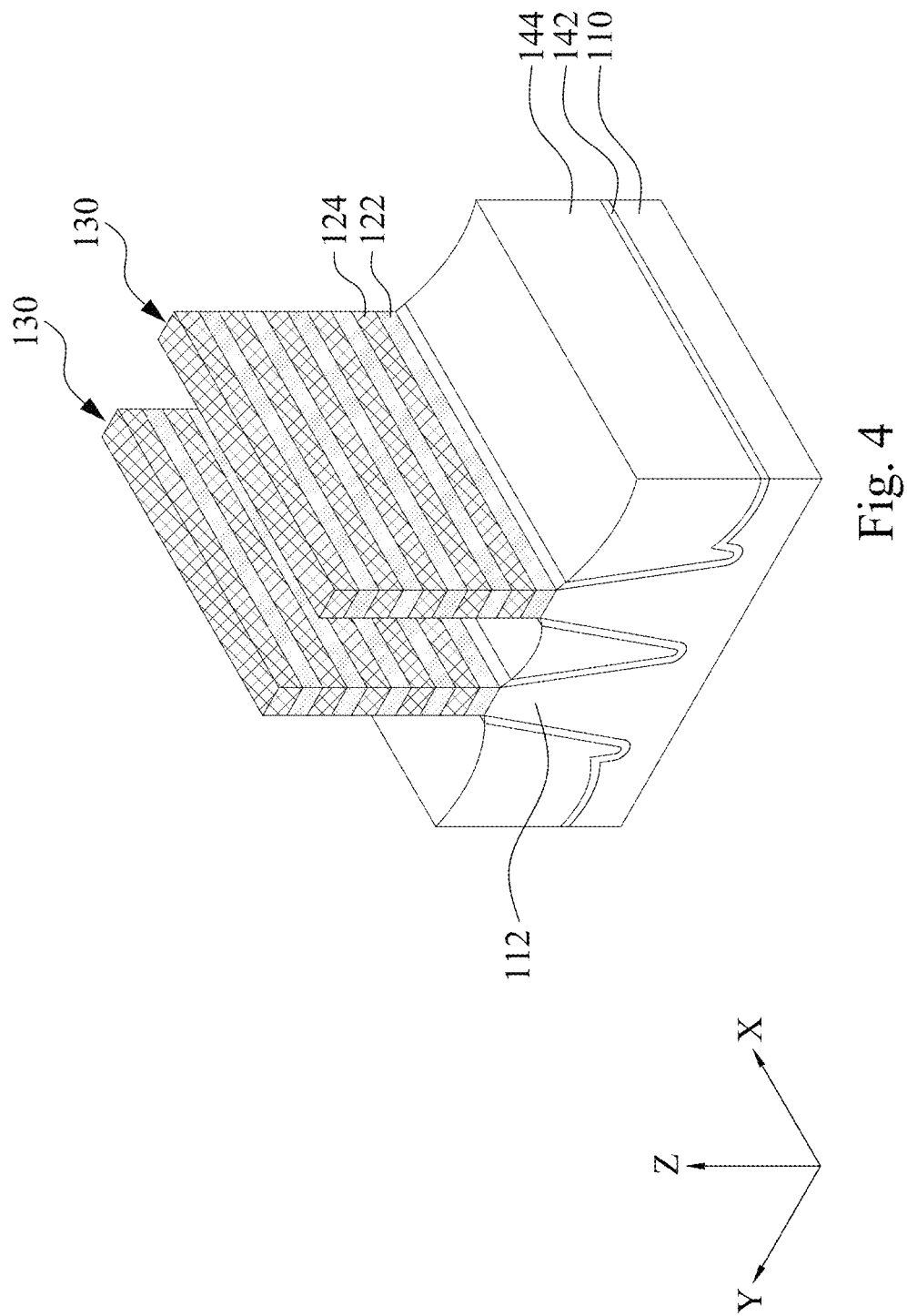

Reference is made to FIG. 4. The insulating material layer 140 (see FIG. 3) is recessed to form an isolation insulating layer 144 so that the upper portions of the fin structures 130 are exposed. With this operation, the fin structures 130 are electrically insulated from each other by the isolation insulating layer 144, which is also referred to as an STI structure. In some embodiments, the insulating material layer 140 is recessed until the bottommost first semiconductor layer 122 is exposed. The first semiconductor layers 122 are sacrificial layers which are subsequently partially removed, and the second semiconductor layers 124 will serve as channel regions of a GAA FET.

Figure 5:
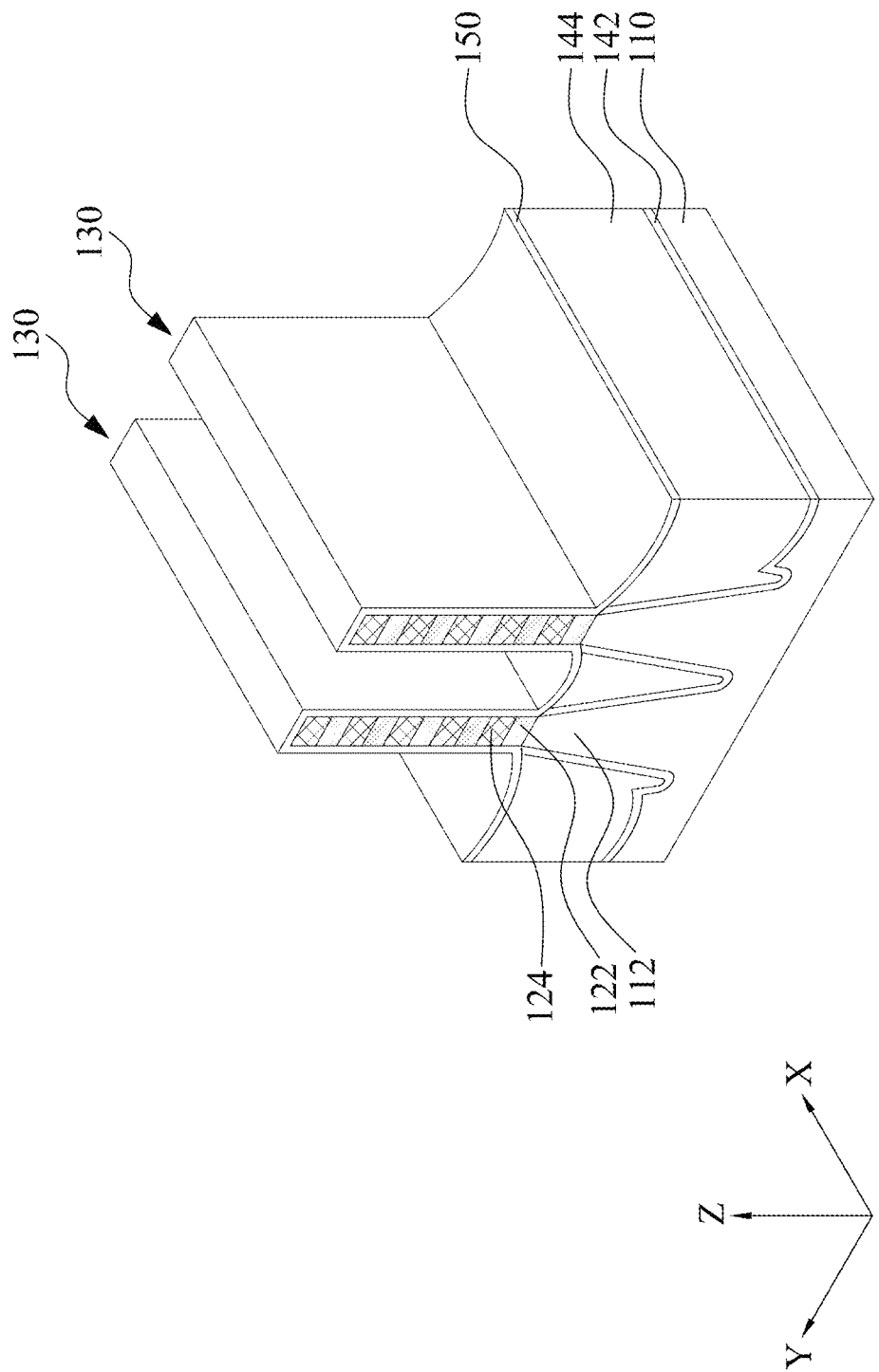

Reference is made to FIG. 5. A sacrificial gate dielectric layer 150 is conformally formed above the structure of FIG. 4. In some embodiments, the sacrificial gate dielectric layer 150 may include silicon dioxide, silicon nitride, a high-k dielectric material or other suitable material. In various examples, the sacrificial gate dielectric layer 150 may be deposited by an ALD process, a CVD process, a subatmospheric CVD (SACVD) process, a flowable CVD process, a PVD process, or other suitable process. By way of example, the sacrificial gate dielectric layer 150 may be used to prevent damage to the fin structures 130 by subsequent processing (e.g., subsequent formation of the dummy gate structure).

Figure 6:
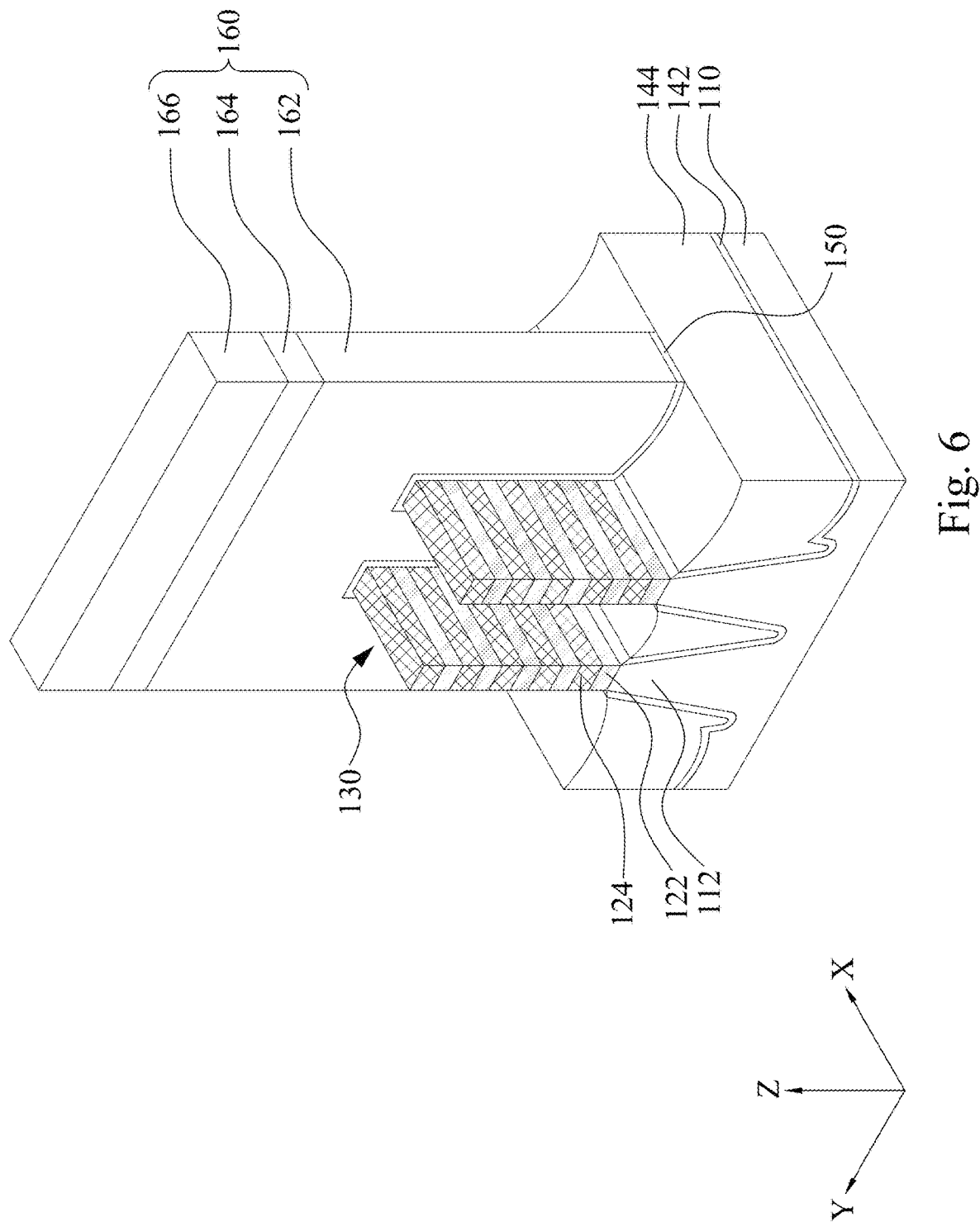

Reference is made to FIG. 6. At least one dummy gate structure 160 is formed above the sacrificial gate dielectric layer 150. The dummy gate structure 160 includes a dummy gate layer 162, a pad layer 164 formed over the dummy gate layer 162, and a mask layer 166 formed over the pad layer 164. Formation of the dummy gate structure 160 includes depositing in sequence a dummy gate layer, a pad layer and a mask layer over the substrate 110, patterning the pad layer and mask layer into patterned pad layer 164 and mask layer 166 using suitable photolithography and etching techniques, followed by patterning the dummy gate layer using the pad layer 164 and the mask layer 166 as masks to form the patterned dummy gate layer 162. As such, the dummy gate layer 162, the pad layer 164, and the mask layer 166 are referred to as the dummy gate structure 160. In some embodiments, the dummy gate layer 162 may be made of polycrystalline-silicon (poly-Si), poly-crystalline silicon-germanium (poly-SiGe), or other suitable materials. The pad layer 164 may be made of silicon nitride or other suitable materials, and the mask layer 166 may be made of silicon dioxide or other suitable materials. After the patterning of the dummy gate layer 162, the sacrificial gate dielectric layer 150 is patterned as well to expose portions of the fin structures 130, thereby defining source/drain (S/D) regions. In this disclosure, a source and a drain are interchangeably used and the structures thereof are substantially the same.

Figure 7:
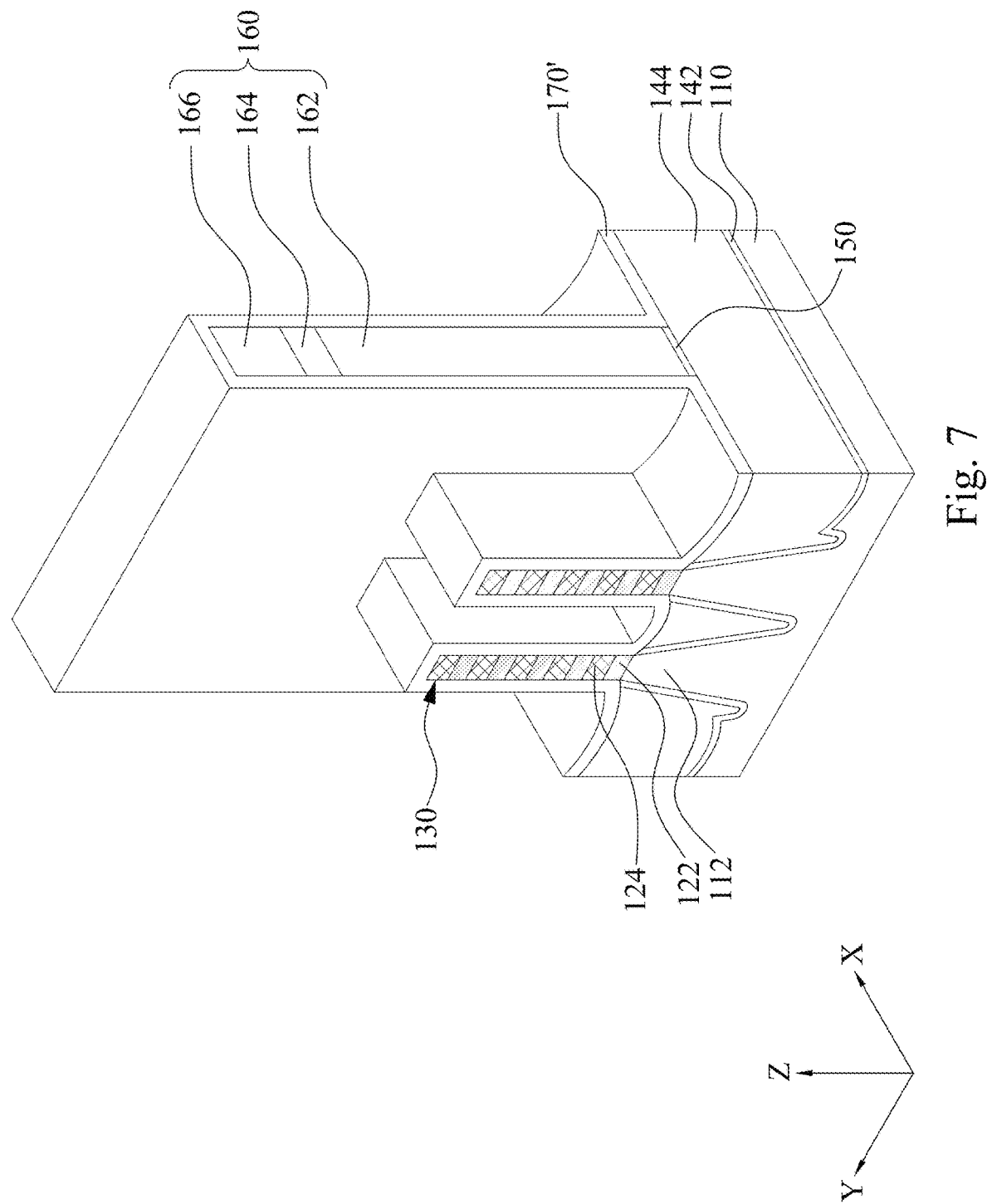

Reference is made to FIG. 7. A blanket layer 170' of an insulating material for sidewall spacers is conformally formed on the structure of FIG. 6 by using plasma enhanced chemical vapor deposition (PECVD), low-pressure chemical vapor deposition (LPCVD), sub-atmospheric chemical vapor deposition (SACVD), or the like. The blanket layer 170' is deposited in a conformal manner so that it is formed to have substantially equal thicknesses on vertical surfaces, such as the sidewalls, horizontal surfaces, and the top of the dummy gate structure 160. In some embodiments, the insulating material of the blanket layer 170' is a silicon nitride-based material, such as SiN, SiON, SiOCN or SICN and combinations thereof.

Figure 8A:
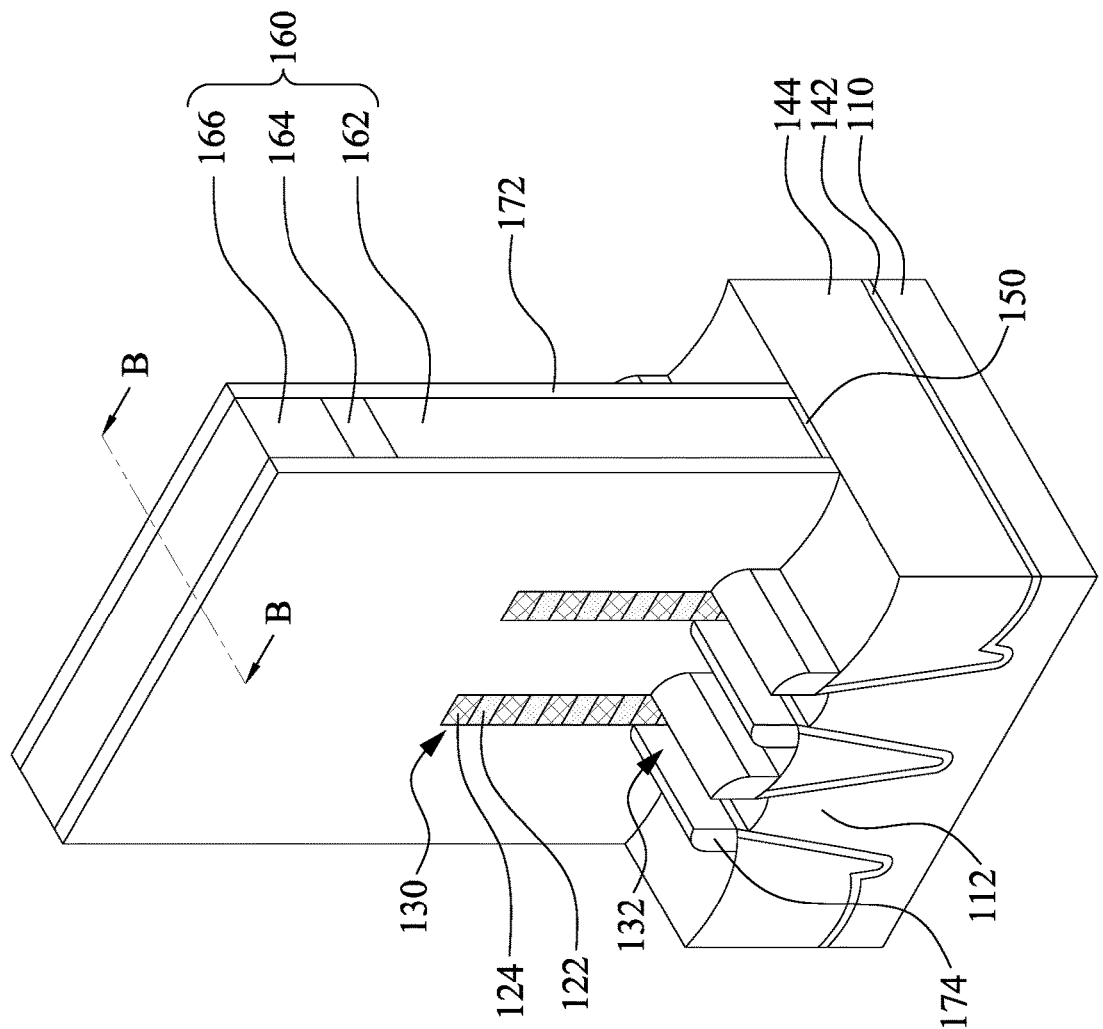
Figure 8B:
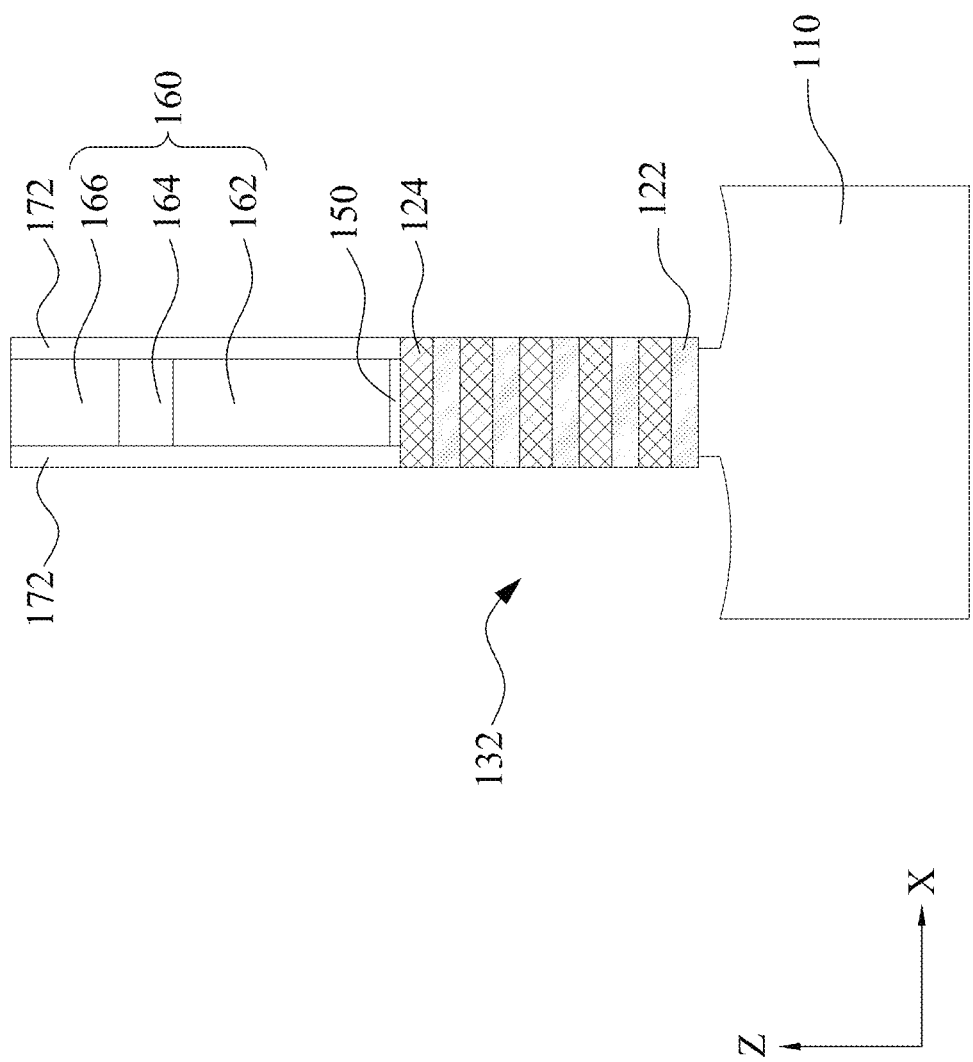

Reference is made to FIGS. 8A and 8B, where FIG. 8B is a cross-sectional view taken along line B-B in FIG. 8A. The blanket layer 170' (see FIG. 7) is then etched using an anisotropic process to form gate spacers 172 on opposite sidewalls of the dummy gate structure 160 and fin sidewall spacers 174 on opposite sidewalls of the fin structures 130, followed by etching exposed portions of the fin structures 130 that extend laterally beyond the gate spacers 172 by one or more etching steps using suitable etchant(s) that etches silicon and silicon germanium at a faster etching rate than it etches the spacer material (e.g., nitride-based material).

The gate spacers 172 and the fin sidewall spacers 174 may include a seal spacer and a main spacer (not shown). The seal spacers may be formed on sidewalls of the dummy gate structure 160 and the main spacers are formed on the seal spacers. In some embodiments, the anisotropic process can be controlled such that no fin sidewall spacers 174 remain on the isolation insulating layer 144. The anisotropic etching performed on the blanket layer 170' can be, for example, reactive ion etching (RIE). During the anisotropic etching process, most of the insulating material is removed from horizontal surfaces, leaving the dielectric spacer layer on the vertical surfaces such as the sidewalls of the dummy gate structures 160 and the sidewalls of the exposed fin structures 130.

In some embodiments, the exposed portions of the fin structures 130 are removed to form recesses 132 by using a strained source/drain (SSD) etching process. The SSD etching process may be performed in a variety of ways. In some embodiments, the SSD etching process may be performed by a dry chemical etch with a plasma source and a reaction gas. The plasma source may be an inductively coupled plasma (ICR) etch, a transformer coupled plasma (TCP) etch, an electron cyclotron resonance (ECR) etch, a reactive ion etch (RIE), or the like and the reaction gas may be a fluorine-based gas (such as $SF_6$, $CH_2F_2$, $CH_3F$, $CHF_3$, or the like), chloride ($Cl_2$), hydrogen bromide (HBO, oxygen ($O_2$), the like, or combinations thereof. In some other embodiments, the SSD etching process may be performed by a wet chemical etch, such as ammonium peroxide mixture (APM), $NH_4OH$, TMAH, combinations thereof, or the like. In yet some other embodiments, the SSD etch step may be performed by a combination of a dry chemical etch and a wet chemical etch.

In some embodiments, when the oxygen gas is involved in the SSD etching process, some oxygen atoms may be non-intentionally doped into the remaining semiconductor layers 122 and 124 to form oxygen impurities and/or oxide materials (e.g., $SiO_x$ and/or $GeO_x$) (see FIG. 9B) therein, such that the remaining semiconductor layers 122 and 124 includes oxygen impurities and/or oxide. Further, native oxide (e.g., the oxide layer 105 shown in FIG. 9B) may be formed on exposed surfaces of the remaining first semiconductor layers 122 and second semiconductor layers 124 after the SSD etching process.

Figure 9A:
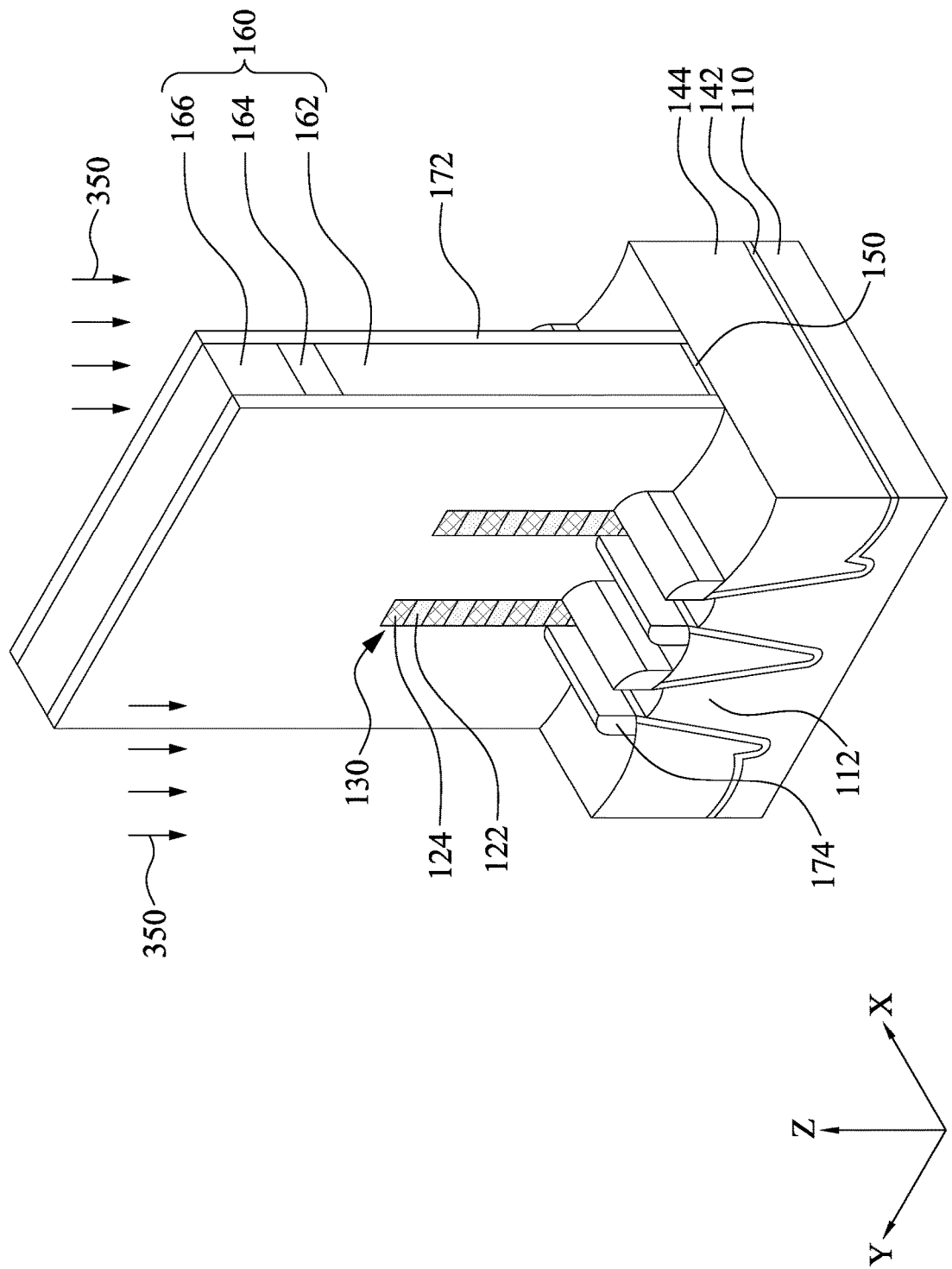
Figure 22:
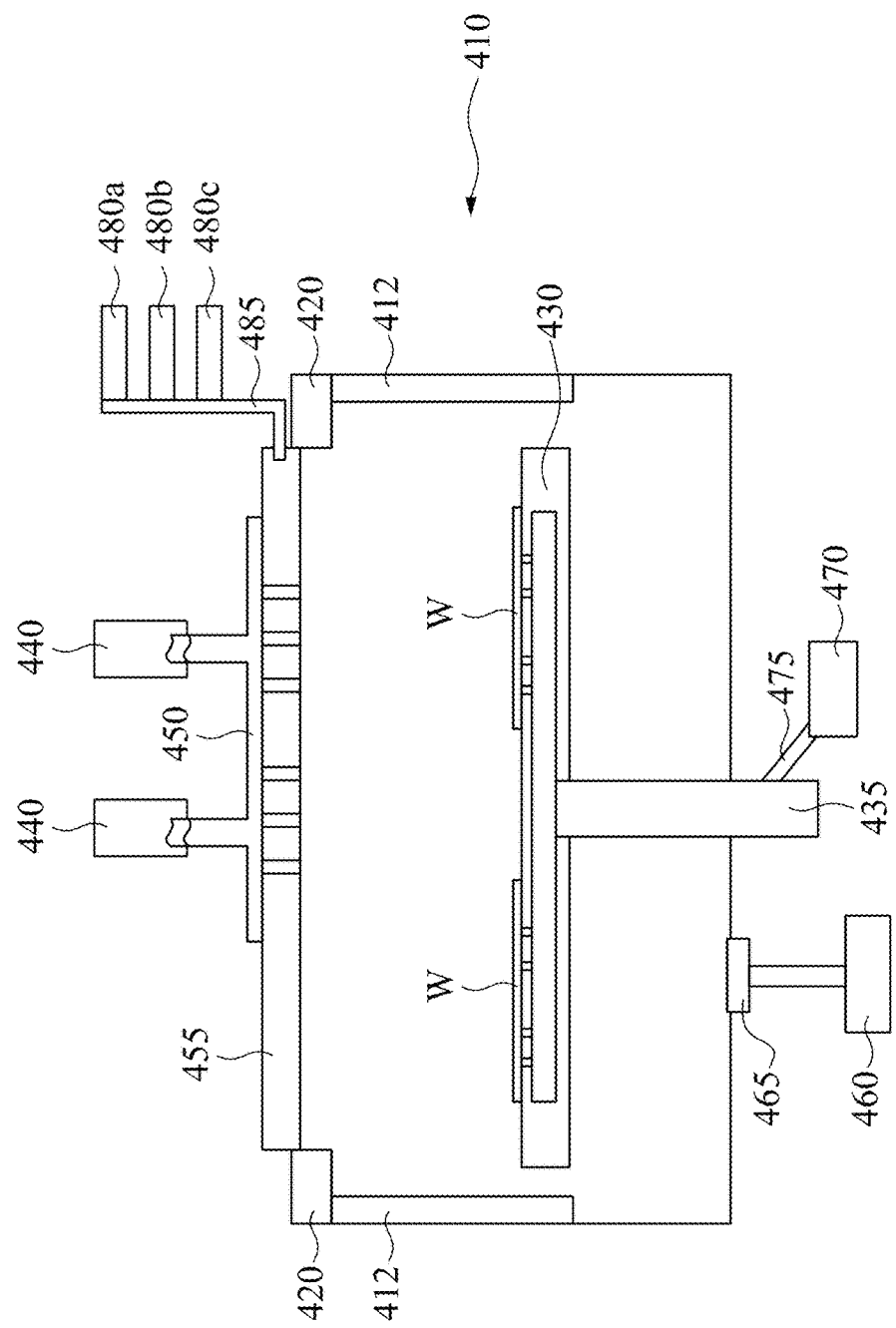
FIG. 22 is a side view of a processing tool in accordance with some embodiments of the present disclosure.

Once the SSD etching process is complete, a hydrogen radical treatment is performed on the remaining first and second semiconductor layers 122 and 124 to remove oxygen therein. In some embodiments, the hydrogen radical treatment may be performed using a processing tool 400 as shown in FIG. 22. Reference is made to FIGS. 9A and 22. In some embodiments, a wafer W including the structure of FIG. 8A is disposed in the processing tool 400 to perform the hydrogen radical treatment 350. The processing tool 400 includes a processing chamber 410 having a chamber wall 412. The processing chamber 410 is closed by a removable lid (or a cover) 420 and contains a pedestal assembly 430 which can be lifted and lowered on a shaft 435 by actuation of a pedestal lift assembly. One or more remote plasma source(s) 440 are located above the processing chamber 410 to provide remote plasma into the processing chamber 410 through a gas line 450 and a gas distribution plate 455. During operation of the processing tool 400, the pedestal assembly 430 supports the wafer W in the processing chamber 410. One or more plasma species are supplied from the remote plasma sources 440 into the processing chamber 410.

FIGS. 9B-9D represent enlarged views of a portion of the etched first and second semiconductor layers 122 and 124 shown in FIG. 9A during the hydrogen radical treatment 350, according to some embodiments. Reference is made to FIGS. 9B-9D and 22. As discussed above, in some embodiments, the hydrogen radical treatment 350 is performed by using the processing tool 400. The wafer W is disposed on the pedestal assembly 430, and hydrogen radicals 910 generated from ionized hydrogen-containing gas (e.g., $H_2$ or the other suitable hydrogen-containing gas) is introduced into the processing chamber 410 from the remote plasma sources 440. The hydrogen radicals 910 react with the oxides 920 in the remaining semiconductor layers 122 and 124 to form —OH 930, thereby removing the oxygen (e.g., in the form of $H_2O$ 935 or other suitable forms) in the remaining first and second semiconductor layers 122 and 124. More specifically, hydrogen radicals 910 have low activation energy for reacting with the oxide (e.g., $SiO_x$ and $GeO_x$) 920 in the first and second semiconductor layers 122 and 124. Further, the hydrogen radicals 910 have small size that benefits for penetrating deep into the first and second semiconductor layers 122 and 124 to react with the oxide 920. As such, hydrogen radicals 910 can act as a promising candidate for removing the oxygen deep in the semiconductor layers 122 and 124 (e.g., removing oxygen at at least 2 nm depth in SiGe layer), which will be explained in greater detail below with respect to FIG. 24. After the hydrogen radical treatment 350, the thickness of the oxide layer 105 (native oxide) substantially remains the same. In some embodiments, the remote plasma power of the remote plasma sources 440 for providing the hydrogen radicals is in a range of about 500 W to about 5000 W. If the remote plasma power is lower than about 500 W, the oxygen in the remaining first and second semiconductor layers 122 and 124 may not be removed effectively; if the remote plasma power is greater than about 5000 W, the remote plasma may damage the structure formed on the wafer W.

In some embodiments, the processing temperature can be tuned during the hydrogen radical treatment 350 is performed. For example, the removable lid 420 and/or the chamber wall 412 include(s) heaters to adjust the temperature of the processing chamber 410 (and the wafer W). The processing tool 400 may further include a cooler 470 to adjust the temperature of the pedestal assembly 430 (and the wafer W). For example, the cooler 470 may transfer cooling liquid to the pedestal assembly 430 through a tube 475. In some embodiments, the processing temperature of the processing chamber 410 is in a range of about 80 degrees Celsius to about 350 degrees Celsius, and the processing temperature of the pedestal assembly 430 is in a range of about 80 degrees Celsius to about 350 degrees Celsius to active the hydrogen radicals. If the processing temperature is out of the above range, the oxygen in the remaining first and second semiconductor layers 122 and 124 may not be removed effectively.

In some embodiments, the processing tool 400 further includes a pressure controller 460 to control the pressure of the processing chamber 410 through a valve 465. In some embodiments, when the wafer W is positioned in the processing chamber 410, a vacuum is applied to the processing chamber 410 by the pressure controller 460 to remove oxygen and moisture, such that the pressure controller 460 is configured to control the pressure inside the processing chamber 410. In some embodiments, the processing pressure of the processing chamber 410 is in a range of about 500 mT to about 10000 mT during the hydrogen radical treatment 350. If the processing pressure is out of the above range, the oxygen in the remaining first and second semiconductor layers 122 and 124 may not be removed effectively.

The hydrogen radical treatment 350 as illustrated in FIG. 9A is configured to remove oxygen in the remaining first and second semiconductor layers 122 and 124. The hydrogen radical treatment 350 can be omitted if the SSD etching process is performed in an oxygen-free environment and/or without oxygen gases.

Figure 10A:
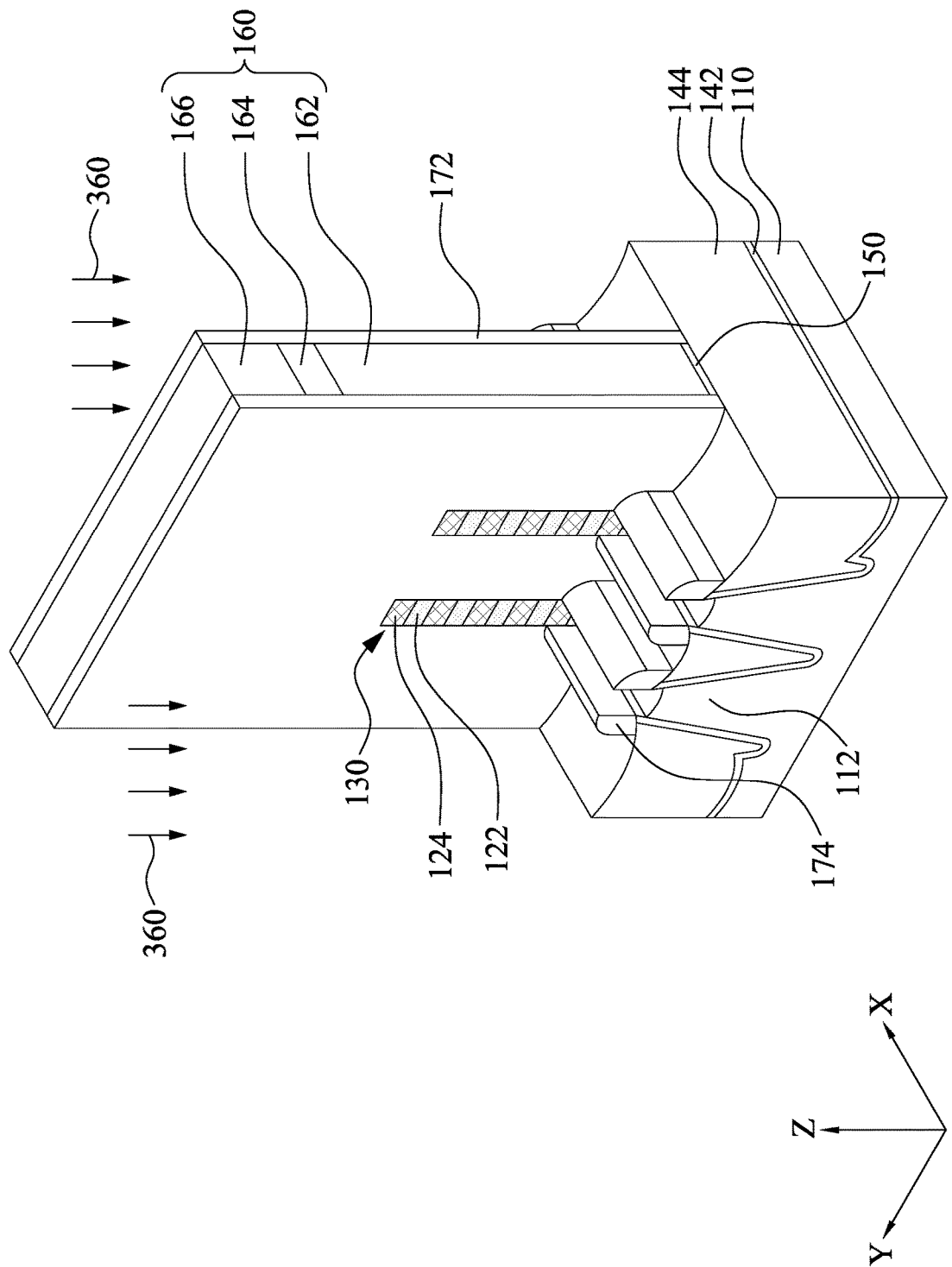

Reference is made to FIG. 10A. After the oxygen in the first and second semiconductor layers 122 and 124 are removed using the hydrogen radical treatment 350, a surface cleaning process 360 is optionally performed to remove native oxides (e.g., the oxide layer 105 shown in FIGS. 9B-9D) on exposed surfaces of the remaining first and second semiconductor layers 122 and 124, if there are native oxides natively formed on the semiconductor surfaces after the hydrogen radical treatment 350 is complete.

FIGS. 10B-10D represent enlarged views of a portion of the etched first and second semiconductor layers 122 and 124 shown in FIG. 10A during the surface cleaning process 360, according to some embodiments, and FIG. 10E is a band diagram of $SiO_2$ with/without $NH_3$ gas during the surface cleaning process 360. Reference is made to FIGS. 10B-10D and 22. In some embodiments, the surface cleaning process 360 includes applying a gas mixture 960 of hydrofluoric gas (HF gas) and $NH_3$ gas to the surfaces of the first and second semiconductor layers 122 and 124 for about several tens of seconds. With the $NH_3$ gas as catalyst, the activation energy of the chemical reaction between the etching gas (e.g., HF+$NH_3$ gas mixture 960 in this case) and oxide (i.e., $SiO_x$ and $GeO_x$) of the oxide layer 105 is reduced (see FIG. 10E), such that the native oxides can be removed more effectively. The surface cleaning process 360 may be a dry (e.g., HF vapor and/or H-containing gas (e.g., $NH_3$) annealing) or wet (e.g., HF dip) etching process.

Reference is made to FIGS. 10A and 22. In some embodiments, the cleaning process 360 is performed in the processing tool 400. That is, the hydrogen radical treatment 350 and the cleaning process 360 are performed in-situ, which in turn will reduce (oxygen) contamination of the remaining first and second semiconductor layers 122 and 124.

As used herein, the term "in-situ" is used to describe processes that are performed while a wafer or substrate remains within a processing system (e.g., including a load lock chamber, transfer chamber, processing chamber, or any other fluidly coupled chamber), and where for example, the processing system allows the wafer W to remain under vacuum conditions. As such, the term "in-situ" may also generally be used to refer to processes in which the device or wafer W being processed is not exposed to an external environment (e.g., external to the processing system).

Prior to the surface cleaning process 360, the remote plasma source 440 stops providing plasma (e.g., stopping providing hydrogen radicals), and the heaters in the removable lid 420, the chamber wall 412, and/or the cooler 470 control the temperature of the processing chamber 410 for performing the surface cleaning process 360. Also, the pressure of the processing chamber 410 is adjusted by the pressure controller 460 for processing the cleaning process 360. In some embodiments, the processing temperature of the processing chamber 410 is in a range of about 80 degrees Celsius to about 250 degrees Celsius, and the processing temperature of the pedestal assembly 430 is in a range of about 0 degrees Celsius to about 250 degrees Celsius to perform the cleaning process 360. In some embodiments, the processing pressure of the processing chamber 410 is in a range of about 20 mT to about 10000 mT during the cleaning process 360. If the processing temperature/processing pressure are out of the above range, the native oxide may not be removed effectively.

In some embodiments, the processing tool 400 further includes gas sources 480a-480c configured to inject different reaction gases into the processing chamber 410. For example, during the surface cleaning process 360, HF gases are injected from the gas source 480a, and $NH_3$ gases are injected from the gas source 480b to remove the native oxide. In some embodiments, the gas sources 480a-480c are connected to the gas distribution plate 455 through a gas line 485, such that the gases injected from the gas sources 480a-480c can be distributed in the processing chamber 410 uniformly.

The surface cleaning process 360 as illustrated in FIG. 10A is configured to remove native oxide on surfaces of the remaining first and second semiconductor layers 122 and 124. The surface cleaning process 360 may be omitted if no or barely native oxides are formed on the surfaces of the remaining first and second semiconductor layers 122 and 124. Further, in some other embodiments, the surface cleaning process 360 can be performed before the hydrogen radical treatment 350.

Figure 24:
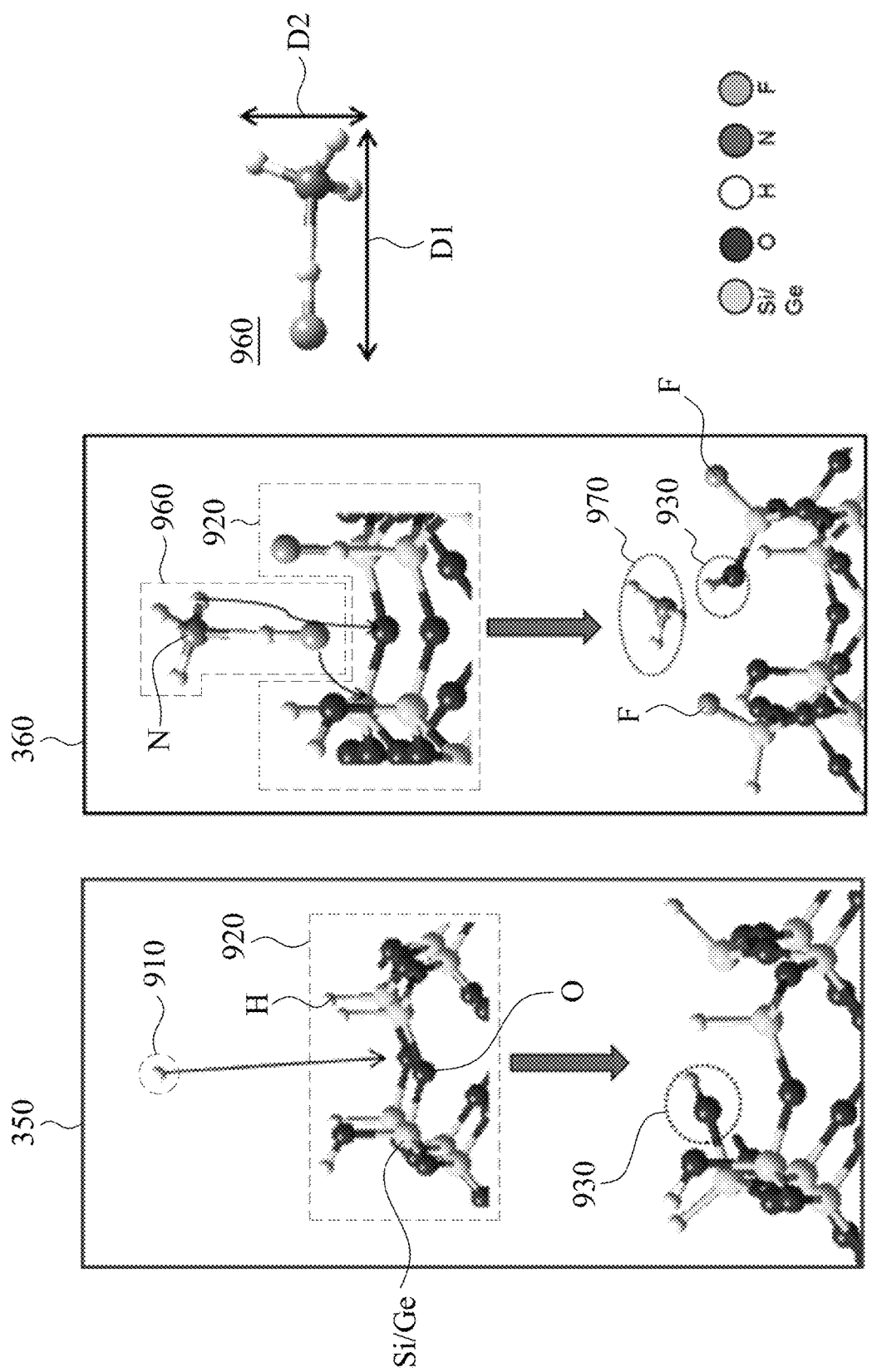
FIG. 24 is a schematic diagram of chemical molecules used in a hydrogen radical treatment and a surface cleaning process in accordance with some embodiments of the present disclosure.

FIG. 24 is a schematic diagram of chemical molecules used in the hydrogen radical treatment 350 and the surface cleaning process 360 in accordance with some embodiments of the present disclosure. In some embodiments, the hydrogen radical treatment 350 is performed by using the hydrogen radicals 910, and the surface cleaning process 360 is performed by using a gas mixture 960 including HF gases and NH₃ gases. As shown in FIG. 24, the hydrogen radicals 910 can react with oxides 920 (e.g., SiO$_x$ and/or GeO$_x$) to form —OH 930. The activation energy of the reaction between the hydrogen radicals 910 and SiO$_x$ is from about 0.15 eV to about 0.19 eV (e.g., about 0.17 eV), and the activation energy of the reaction between the hydrogen radicals 910 and GeO$_x$ is from about 0.00 eV to about 0.03 eV (e.g., about 0.00 eV). That is, the hydrogen radicals 910 are prone to react with oxides. Therefore, the hydrogen radicals 910 can be used to remove oxygen from the first and second semiconductor layers 122 and 124 (see FIG. 9D).

Further, the gas mixture 960 including HF gases and NH₃ gases can react with the oxides 920 to form —OH 930 and NH₃ 970. The activation energy of the reaction between the gas mixture 960 and SiO$_x$ is from about 1.75 eV to about 1.9 eV (e.g., about 1.81 eV), and the activation energy of the reaction between the gas mixture 960 and GeO$_x$ is from about 2.5 eV to about 2.8 eV (e.g., about 2.69 eV). As such, the gas mixture 960 can be used to remove the native oxides formed on the surfaces of the first and second semiconductor layers 122 and 124.

Moreover, the hydrogen radicals 910 has a radius from about 0.08 nm to about 0.15 nm (e.g., about 0.11 nm), and the gas mixture 960 has a size with dimensions D1 and D2, where the dimension D1 is from about 0.35 nm to about 0.48 nm (e.g., about 0.40 nm) and the dimension D2 is from about 0.25 nm to about 0.29 nm (e.g., about 0.27 nm). Since the size of the hydrogen radicals 910 is smaller than the size of the HF/NH₃ gas mixture 960, the hydrogen radicals 910 can penetrate deeper into the first and second semiconductor layers 122 and 124 than the HF/NH₃ gas mixture 960 does. Therefore, hydrogen radicals 910 can act as a promising candidate for reacting with the oxides deep in the Si layers and the SiGe layers (e.g., SiO$_x$/GeO$_x$ at least 2 nm depth in Si layers and SiGe layers), so as to remove oxygen impurities deep in the Si layers and SiGe layers. On the contrary, the gas mixture 960 can act as a suitable candidate for removing the native oxides on surfaces of the Si layers and SiGe layers, when native oxidation takes place after the hydrogen radical treatment 350 is complete, and/or native oxides remains on the Si/SiGe surfaces during the hydrogen radical treatment 350.

Figure 11A:
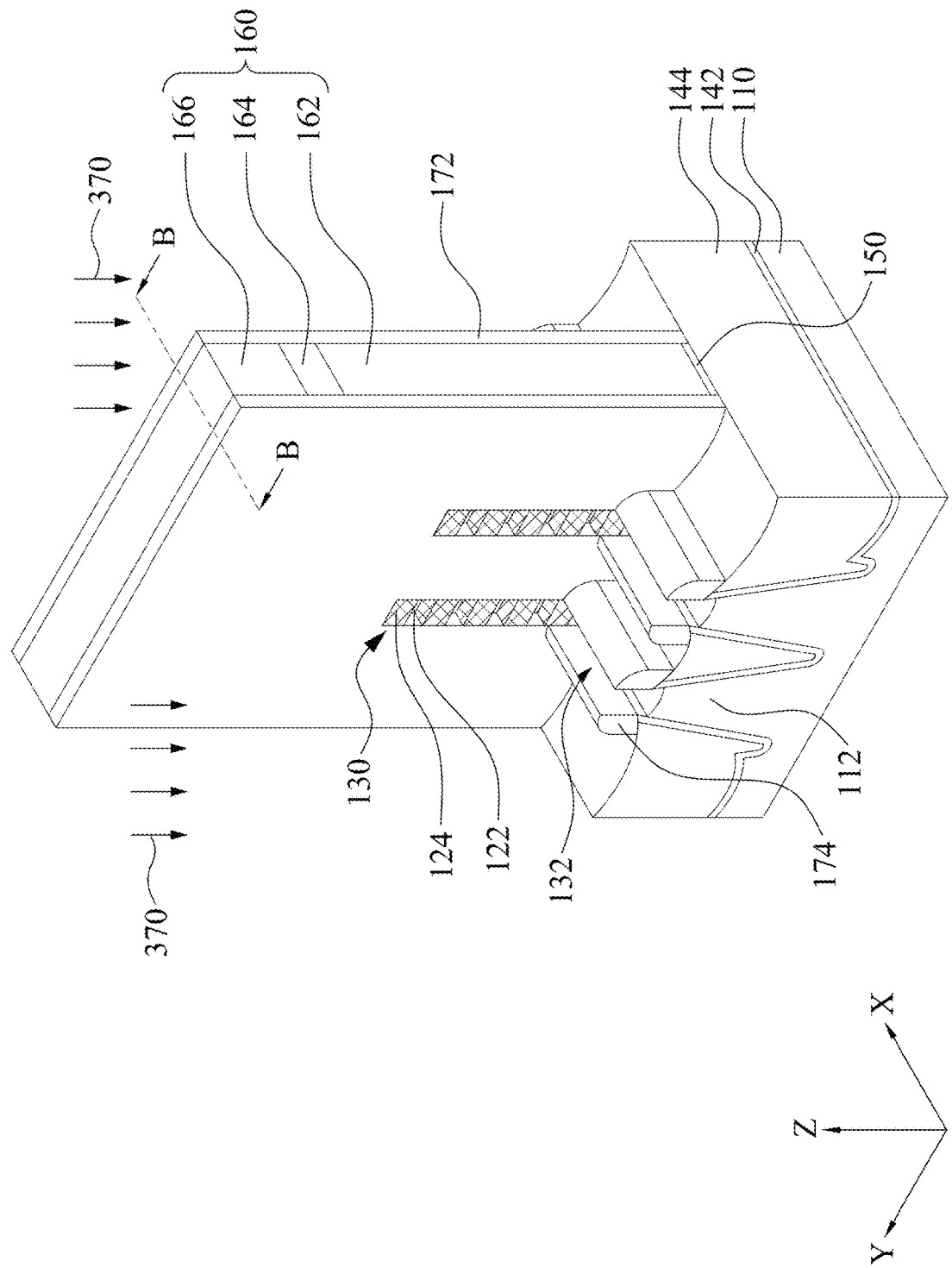
Figure 11B:
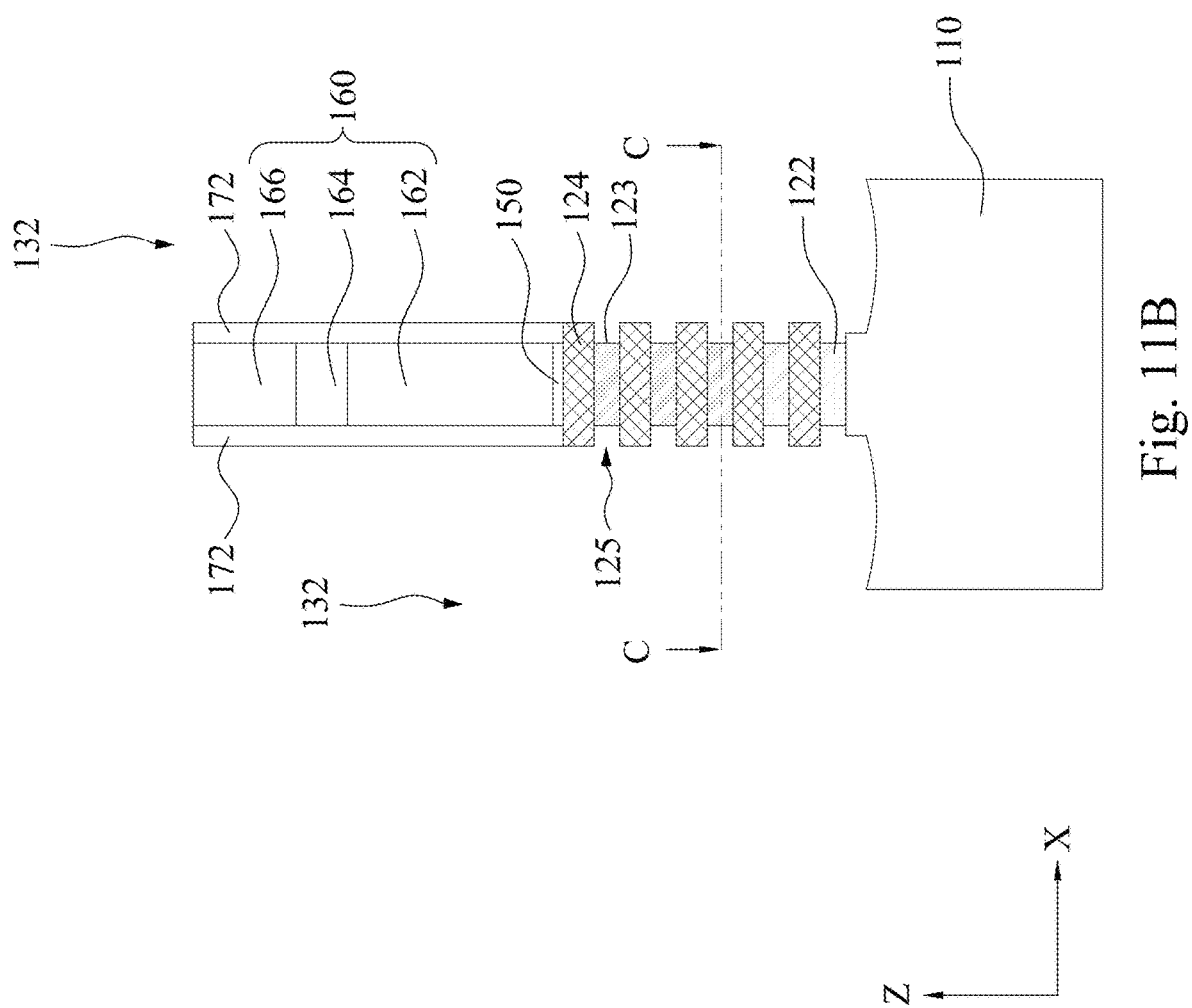
Figure 11C:
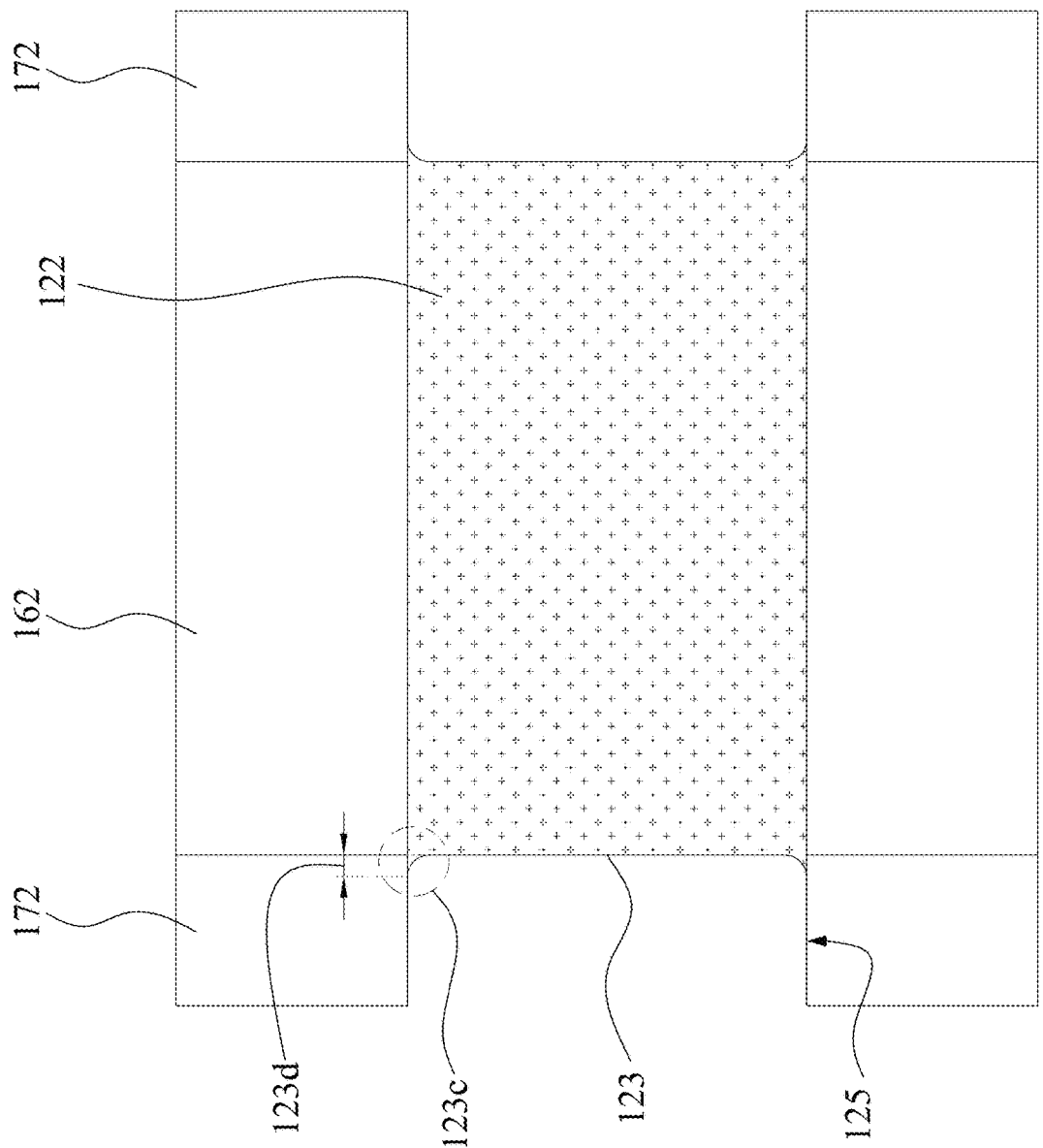

Reference is made to FIGS. 11A-11C, where FIG. 11B is a cross-sectional view taken along line B-B in FIG. 11A, and FIG. 11C is a top view taken along line C-C in FIG. 11B. The first semiconductor layers 122 are horizontally recessed (etched) to form recesses 125 so that the second semiconductor layers 124 laterally extend past opposite end surfaces of the first semiconductor layers 122. In some embodiments, as shown in FIG. 11B, end surfaces 123 of the first semiconductor layers 122 may be substantially vertically aligned with the side surfaces of the dummy gate layer 162. Here, "substantially vertically alignment" means the horizontal offset is less than about 1 nm.

Figures 11D, 11E:
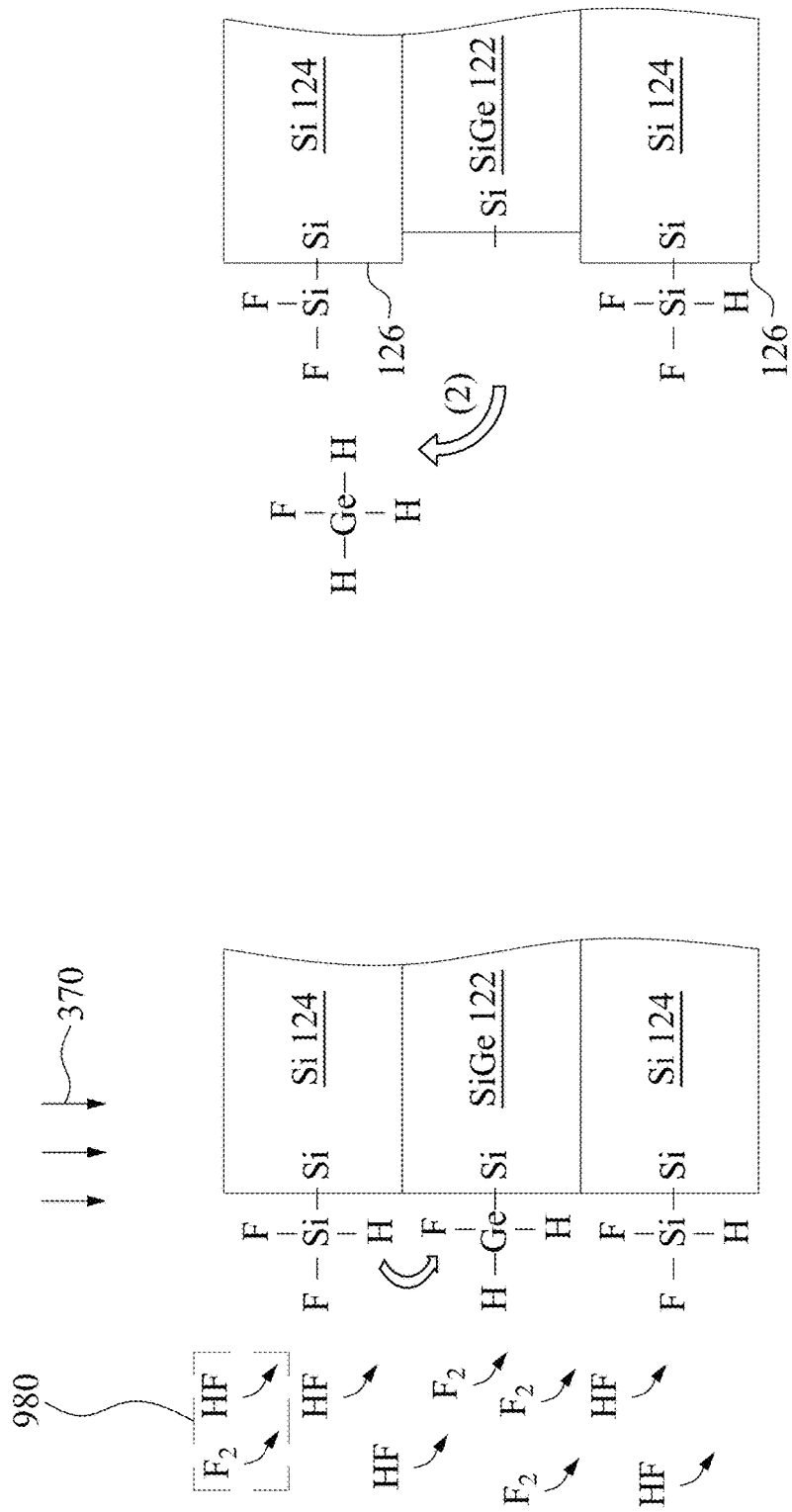

In some embodiments, the first semiconductor layers 122 are etched/recessed by a selective chemical dry etching (CDE) process 370 that is tuned to remove the first semiconductor layers 122 while the second semiconductor layers 124 remain substantially intact. FIG. 11D is an enlarged view of a portion of the etched first and second semiconductor layers 122 and 124 shown in FIG. 11B during the selective chemical dry etching process 370, according to some embodiments. In some embodiments, the selective chemical dry etching process 370 may include a gas mixture 980 of a fluorine-containing gas (e.g., a fluorine (F₂) gas) and a hydrogen-containing gas (e.g., a hydro fluoride (HF) gas). In some embodiments where the first semiconductor layers 122 include SiGe and the second semiconductor layers 124 include Si, the fluorine-containing gas and the hydrogen-containing gas react with the first semiconductor layers 122 (i.e., SiGe in this case) as the following equations (1) and (2):

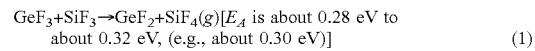

$$GeF_3 + SiF_3 \rightarrow GeF_2 + SiF_4(g) [E_A \text{ is about 0.28 eV to about 0.32 eV, (e.g., about 0.30 eV)}] \quad (1)$$

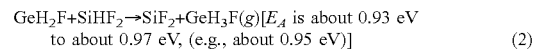

$$GeH_2F + SiHF_2 \rightarrow SiF_2 + GeH_3F(g) [E_A \text{ is about 0.93 eV to about 0.97 eV, (e.g., about 0.95 eV)}] \quad (2)$$

, where $E_A$ is the activation energy of the corresponding reaction, and the SiF₄ and GeH₃F gas can be exhausted. The equation (1) represents F migration from Ge to Si, and the equation (2) represents Ge removal with HF.

The fluorine-containing gas and the hydrogen-containing gas further react with the second semiconductor layers 124 (i.e., Si in this case) as the following equation (3):

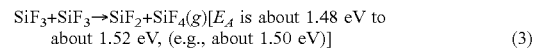

$$SiF_3 + SiF_3 \rightarrow SiF_2 + SiF_4(g) [E_A \text{ is about 1.48 eV to about 1.52 eV, (e.g., about 1.50 eV)}] \quad (3)$$

, where $E_A$ is the activation energy of the corresponding reaction, and the SiF₄ gas can be exhausted.

As shown in the equations (1)-(3), since the activation energies of the equations (1) and (2) are lower than the activation energy of equation (3), the reactions described in the equations (1) and (2) are easier to be activated than the reaction described in the equation (3). That is, the gas mixture 980 of fluorine-containing gas and the hydrogen-containing gas is much easier to react with the first semiconductor layers 122 (i.e., SiGe layers) than with the second semiconductor layers 124 (i.e., Si layers) as shown in FIG. 11E. As such, the etching rate of the first semiconductor layers 122 is much higher than the etching rate of the second semiconductor layers 124 during the selective chemical dry etching process 370. For example, the loss of the second semiconductor layers (Si layers) 124 (i.e., a depth of a recess formed in the second semiconductor layers 124) is less than about 1 nm using the gas mixture of fluorine-containing gas and the hydrogen-containing gas as the etching gas. The loss of the second semiconductor layers 124 may be greater than about 1.5 nm if F radicals are used to etch the second semiconductor layers 124.

Further, since the activation energy of equation (3) is higher than the activation energies of the equations (1) and (2), SiF₂H— may remain on the sidewall 126 of the second semiconductor layers 124. As such, SiF₂H— may be detected on the sidewalls 126 of the second semiconductor layers 124. Or, the second semiconductor layers 124 include F and/or H on their sidewalls 126. Or, the second semiconductor layers 124 include Si—H bonds and/or Si—F bonds on their sidewalls 126.

Figures 11F, 11G:
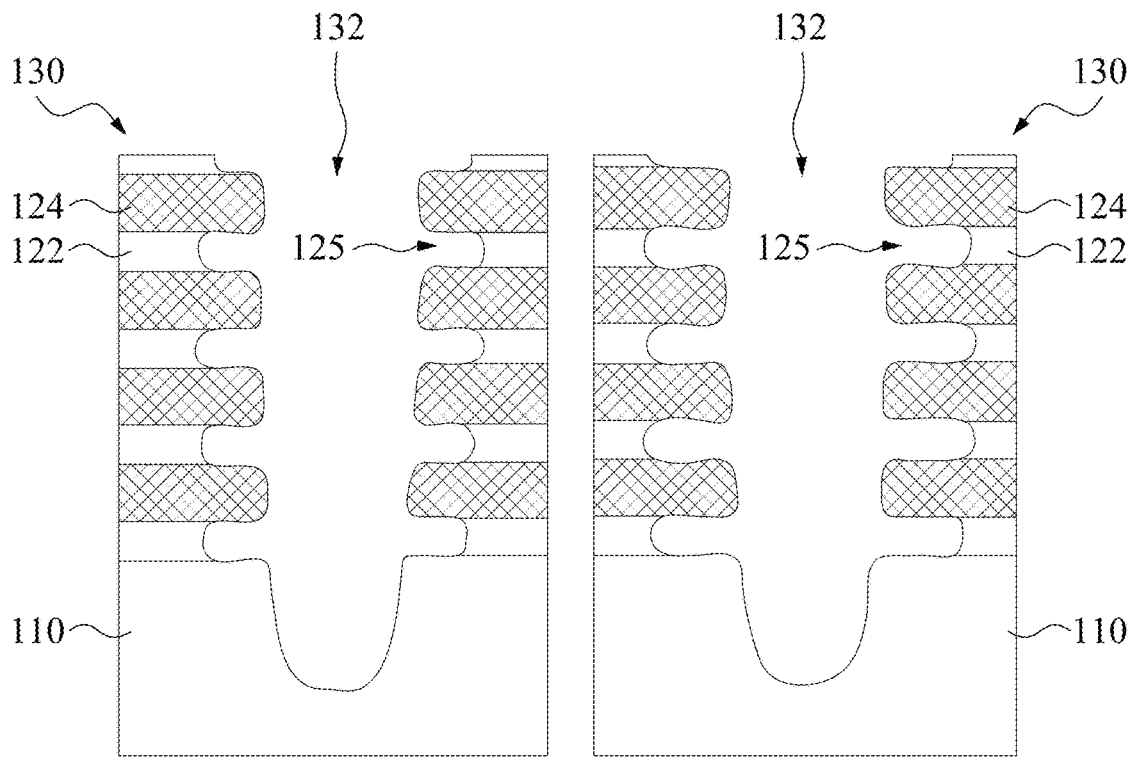
Figures 11H, 11I:
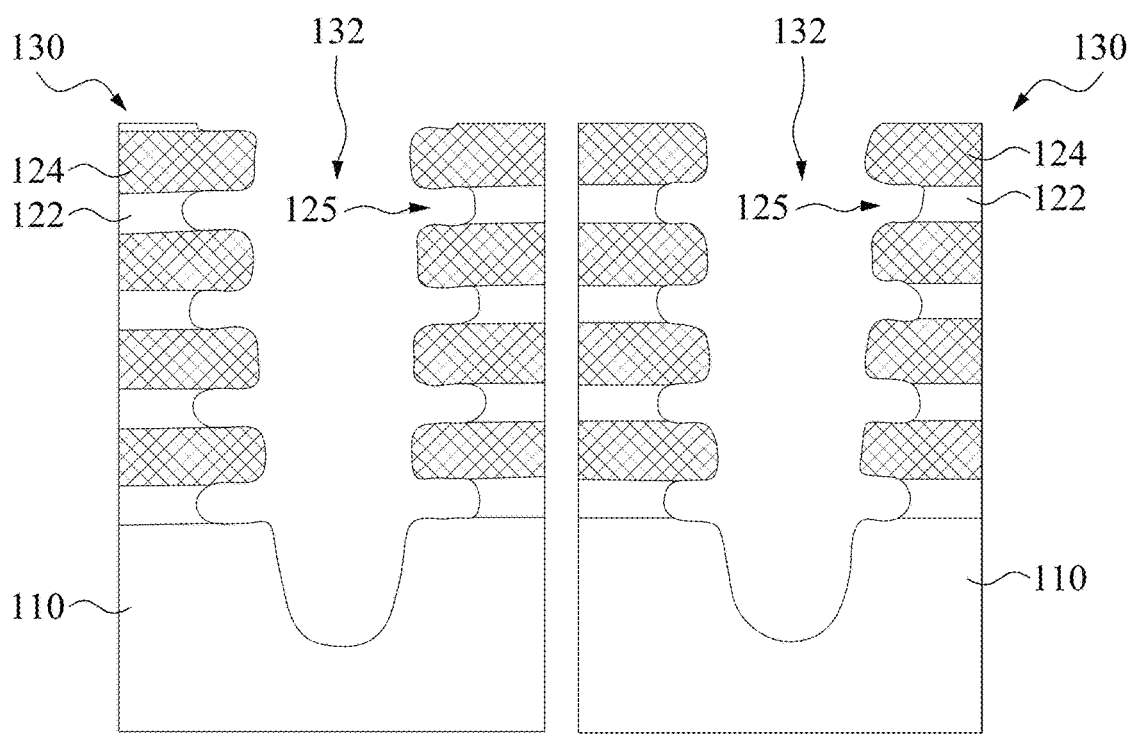
Figure 11J:
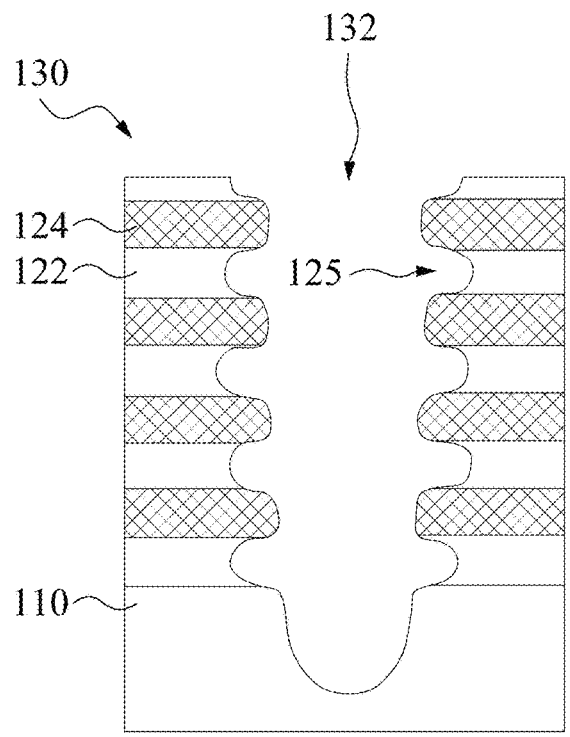
Figure 11K:
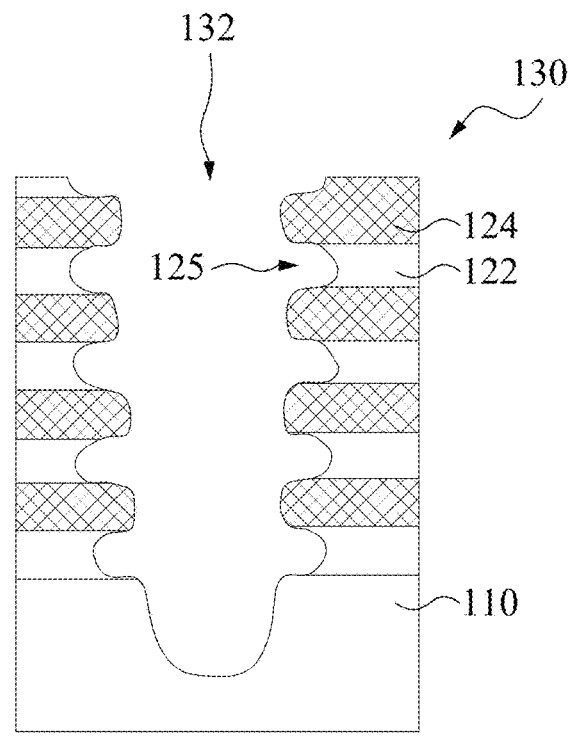
Figure 11L:
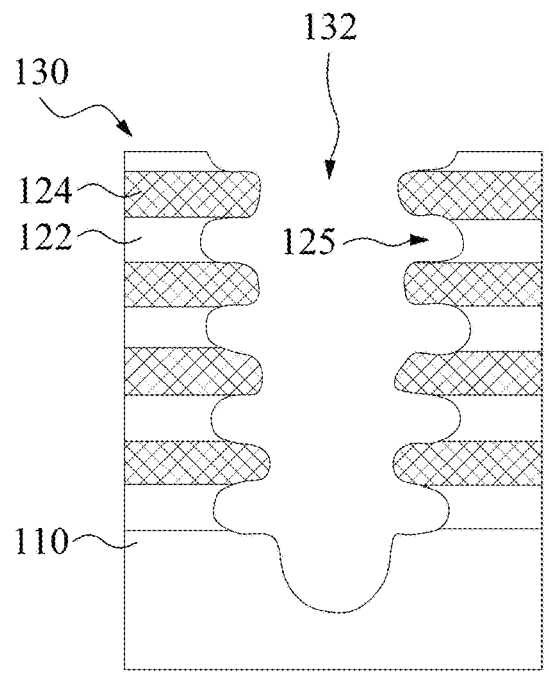

FIGS. 11F-11L are enlarged views of a portion of the etched fin structure shown in FIG. 11B during the selective chemical dry etching process 370, according to some other embodiments. In FIGS. 11F-11L, the recess 132 is formed in the etched fin structure 130 such that the etched fin structure 130 is cut into at least two parts. In FIG. 11F, the selective chemical dry etching process 370 was performed by using a gas mixture with a F₂ gas/HF gas flow rate ratio about 20 at about 40 degrees Celsius. In FIG. 11G, the selective chemical dry etching process 370 was performed by using a gas mixture with a F₂ gas/HF gas flow rate ratio about 40 at about 40 degrees Celsius. In FIG. 11H, the selective chemical dry etching process 370 was performed by using a gas mixture with a $F_2$ gas/HF gas flow rate ratio about 60 at about 40 degrees Celsius. In FIG. 11I, the selective chemical dry etching process 370 was performed by using a gas mixture with a $F_2$ gas/HF gas flow rate ratio about 80 at about 40 degrees Celsius. In FIG. 11J, the selective chemical dry etching process 370 was performed at a temperature about 40 degrees Celsius. In FIG. 11K, the selective chemical dry etching process 370 was performed at a temperature about 60 degrees Celsius. In FIG. 11L, the selective chemical dry etching process 370 was performed at a temperature about 80 degrees Celsius.

In some embodiments, the equations (1)-(3) are satisfied at a temperature range of about 0 degrees Celsius to about 90 degrees Celsius, or at a temperature range of about 20 degrees Celsius to about 80 degrees Celsius. That is, the selective chemical dry etching process 370 shown in FIGS. 11A and 11B can be performed at room temperature (e.g., about 20 degrees Celsius) or higher with good etching selectivity between the first and second semiconductor layers 122 and 124 (as shown in FIGS. 11J-11L), thereby benefiting on chamber maintenance (for mass production). In some embodiments, the selective chemical dry etching process 370 is performed at a temperature in a range of about 20 degrees Celsius to about 65 degrees Celsius, resulting in good silicon loss control.

In some embodiments, the first semiconductor layers 122 are horizontally recessed by using the processing tool 400 of FIG. 22. That is, the cleaning process 360 and the selective chemical dry etching process 370 of the first semiconductor layers 122 are performed in-situ, which in turn will prevent (oxygen) contamination of the remaining first and second semiconductor layers 122 and 124.

Prior to the selective chemical dry etching process 370, the gas sources 480a and 480b stop providing gases, and the heaters in the removable lid 420, the chamber wall 412, and/or the cooler 470 control the temperature of the processing chamber 410 for processing the recessing process. Also, the pressure of the processing chamber 410 is adjusted by the pressure controller 460 for processing the recessing process. In some embodiments, the processing temperature of the processing chamber 410 is in a range of about 80 degrees Celsius to about 250 degrees Celsius, and the processing temperature of the pedestal assembly 430 is in a range of about 20 degrees Celsius to about 100 degrees Celsius to perform the selective chemical dry etching process 370. In some embodiments, the processing pressure of the processing chamber 410 is in a range of about 20 mT to about 10000 mT during the selective chemical dry etching process 370. If the processing temperature/processing pressure are out of the above range, the selective chemical dry etching process 370 may not have good etching selectivity between the first and second semiconductor layers 122 and 124.

Figure 11M:
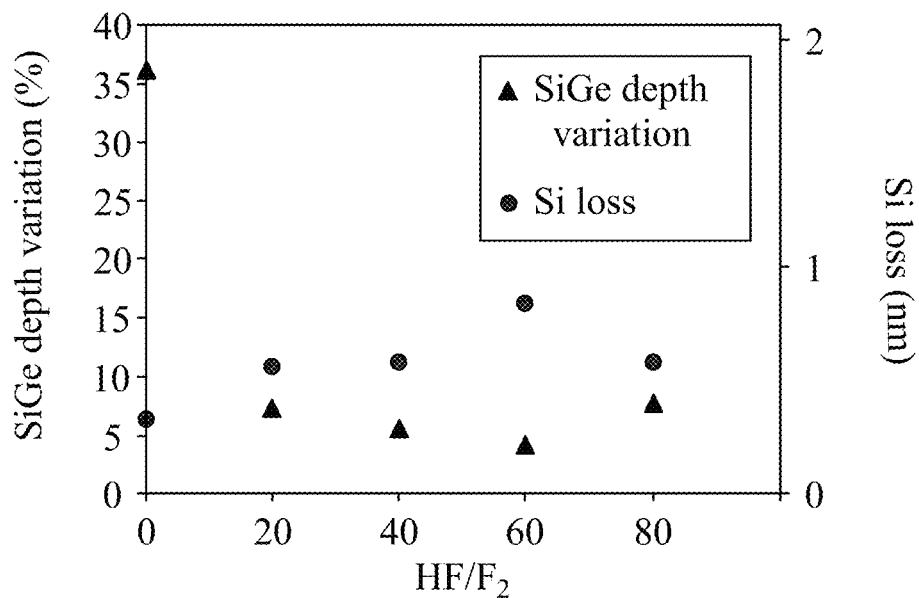

During the selective chemical dry etching process 370, hydrogen-containing gases (e.g., HF gases) are injected from the gas source 480a, and fluorine-containing gases (e.g., $F_2$ gases) are injected from the gas source 480c to recessing the first semiconductor layers 122. In some embodiments, the flow rate ratio of hydrogen-containing gas to fluorine-containing gas (e.g., HF gas/$F_2$ gas) may be in a range of about 0.2 to about 120. Selection of flow rate ratio of HF gas to $F_2$ gas depends on a desired depth variation of the recesses 125. For example, as shown in FIG. 11M, the depth variation of the recesses 125 is less than about 15% when the gas ratio is between 0.2 to about 50, and the depth variation of the recesses 125 is less than about 6% when the gas ratio is between 20 to about 120. In some embodiments, the depth variation of the recesses 125 is increased when the gas ratio is higher than about 120 and lower than about 20. For example, the lower recesses 125 are much deeper than the higher recesses 125 when the gas ratio is higher than about 120. In some other embodiments, the depth variation of the recesses 125 is greater than about 35% when the flow rate ratio is about 0 (i.e., HF gas is omitted). In some embodiments, the gas source 480a provides the hydrogen-containing gases at a flow rate of about 5 sccm to about 5000 sccm, and the gas source 480c provides the fluorine-containing gases at a flow rate of about 5 sccm to about 5000 sccm.

Figure 11N:
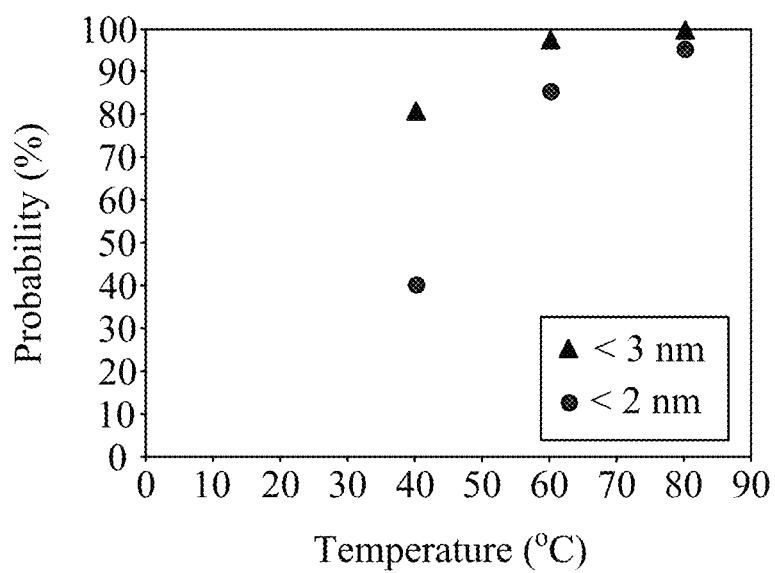

In some embodiments, the end surfaces 123 of the recessed first semiconductor layers 122 may have a curved corner 123c in a plan view as shown in FIG. 11C. A lateral distance 123d between the farthest points of the curved corner 123c of the end surface 123 (also referred to as an unwanted smiling profile) is attributed to at least the processing temperature (of the processing chamber 410) during the selective chemical dry etching process 370. For example, as the processing temperature increases, the lateral distance 123d between the farthest points of the curved corner 123c of the end surface 123 decreases. In some embodiments, as shown in FIG. 11N, which shows probabilities of lateral distance lower than about 2 nm and lower than about 3 nm under different processing temperatures, when the processing temperature is in a range of about 30 degrees Celsius to about 90 degrees Celsius, the lateral distance 123d may be lower than about 3 nm, e.g., lower than about 2 nm. As such, increasing the processing temperature improves the smiling issue of the first semiconductor layers 122.

In some embodiments where the etching gases of the selective chemical dry etching process 370 includes HF gas and $F_2$ gas, surface native oxides on SiGe layers and/or oxygen impurities deep in SiGe layers might block the etching gases, such that the etching rate of the selective chemical dry etching process 370 may be slow down. However, because the hydrogen radical treatment 350 (see FIG. 9A) and/or the surface cleaning process 360 (see FIG. 10A) remove the oxygen impurities deep in SiGe layers and/or surface native oxides on the SiGe layers as discussed previously, the etching rate of the selective chemical dry etching process 370 can be improved. In some other embodiments, the hydrogen radical treatment 350 and/or the surface cleaning process 360 can be omitted as mentioned above.

Figure 12A:
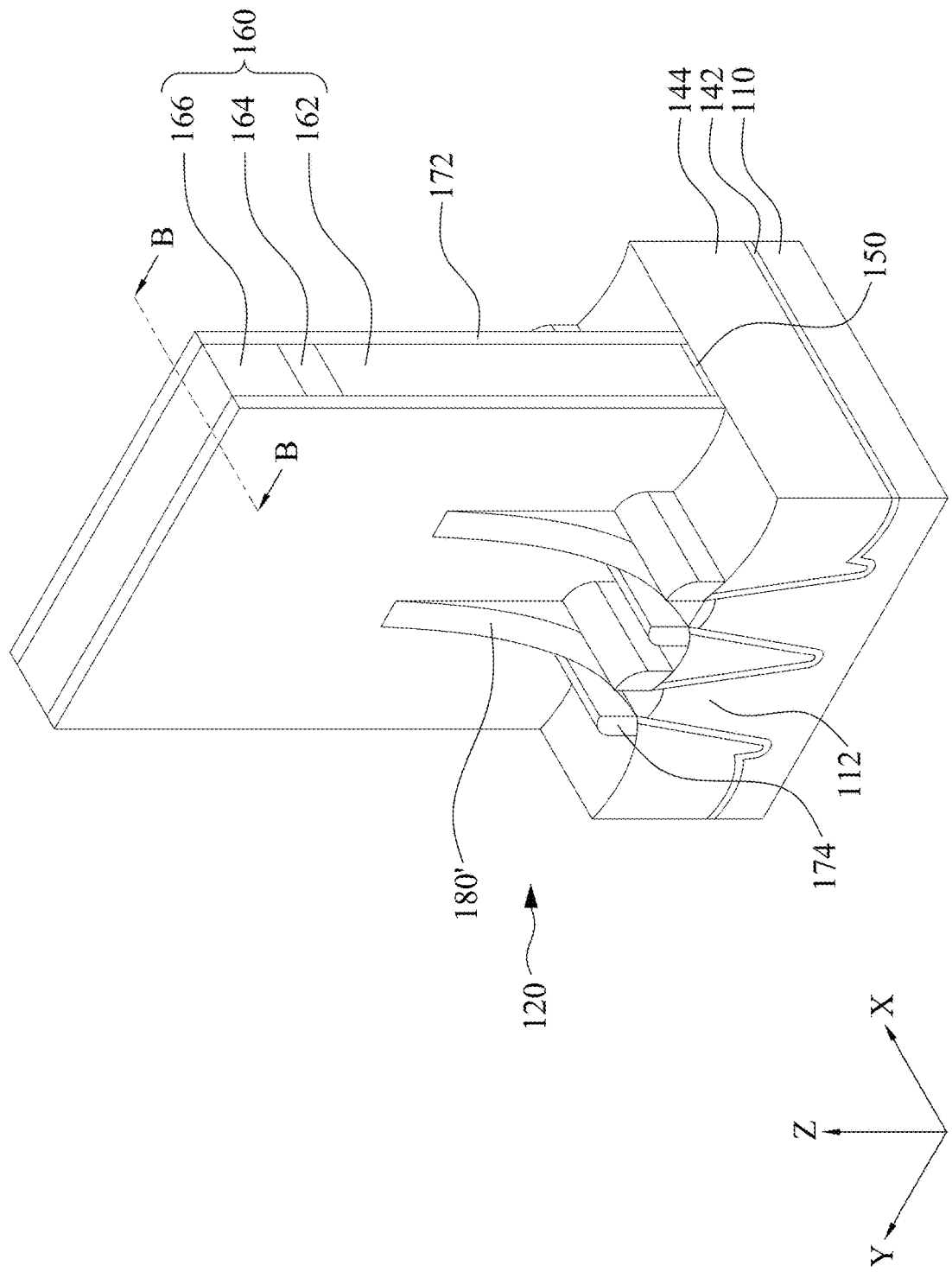
Figure 12B:
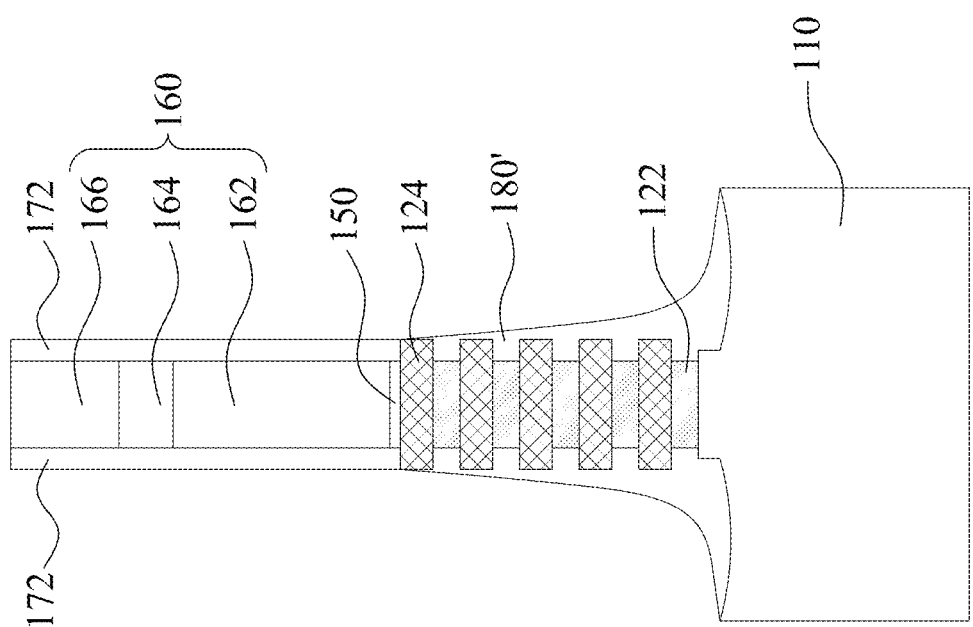

Reference is made to FIGS. 12A and 12B, where FIG. 12B is a cross-sectional view taken along line B-B in FIG. 12A. a dielectric material layer 180' is formed over the structure of FIGS. 11A and 11B. In some embodiments, the dielectric material layer 180' includes a silicon nitride-based material, such as SIN, SION, SiOCN or SiCN and combinations thereof and is different from the material of the gate spacers 172. In some embodiments, the dielectric material layer 180' is silicon nitride. The dielectric material layer 180' may fully fill the recesses 125 as shown in FIG. 12B. The dielectric material layer 180' can be formed using CVD, including LPCVD and PECVD, PVD, ALD, or other suitable processes.

Figures 12C, 12D:
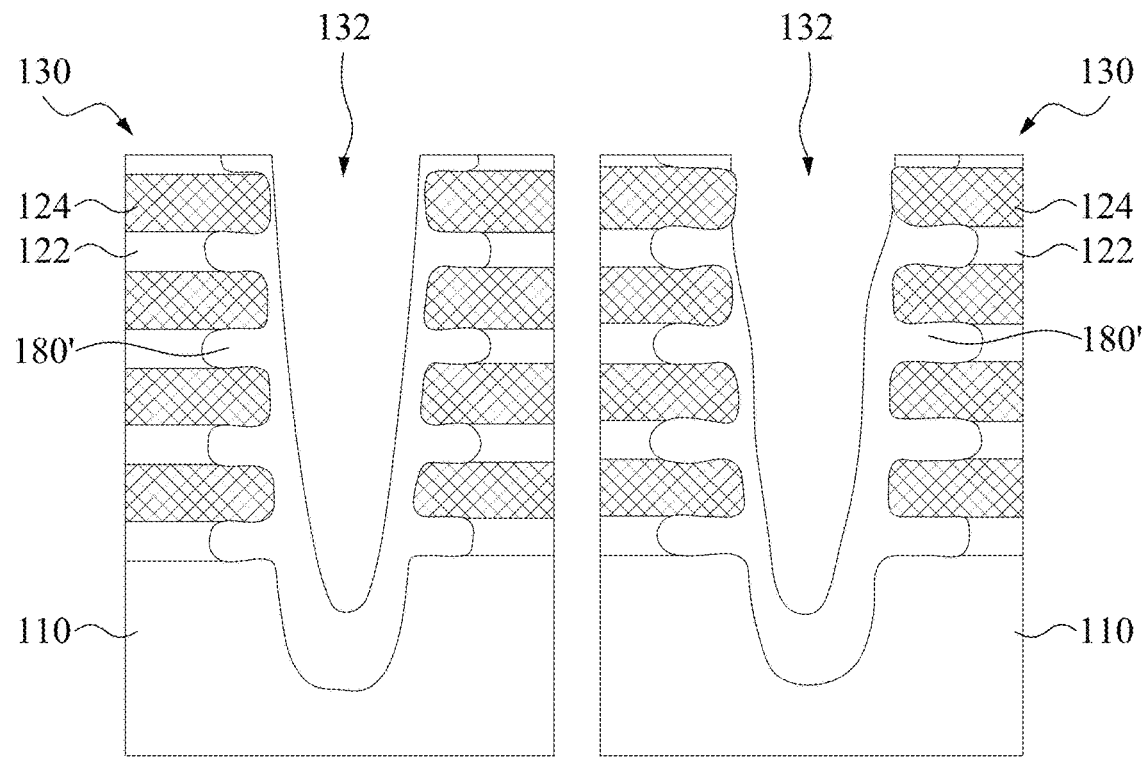
Figures 12E, 12F:
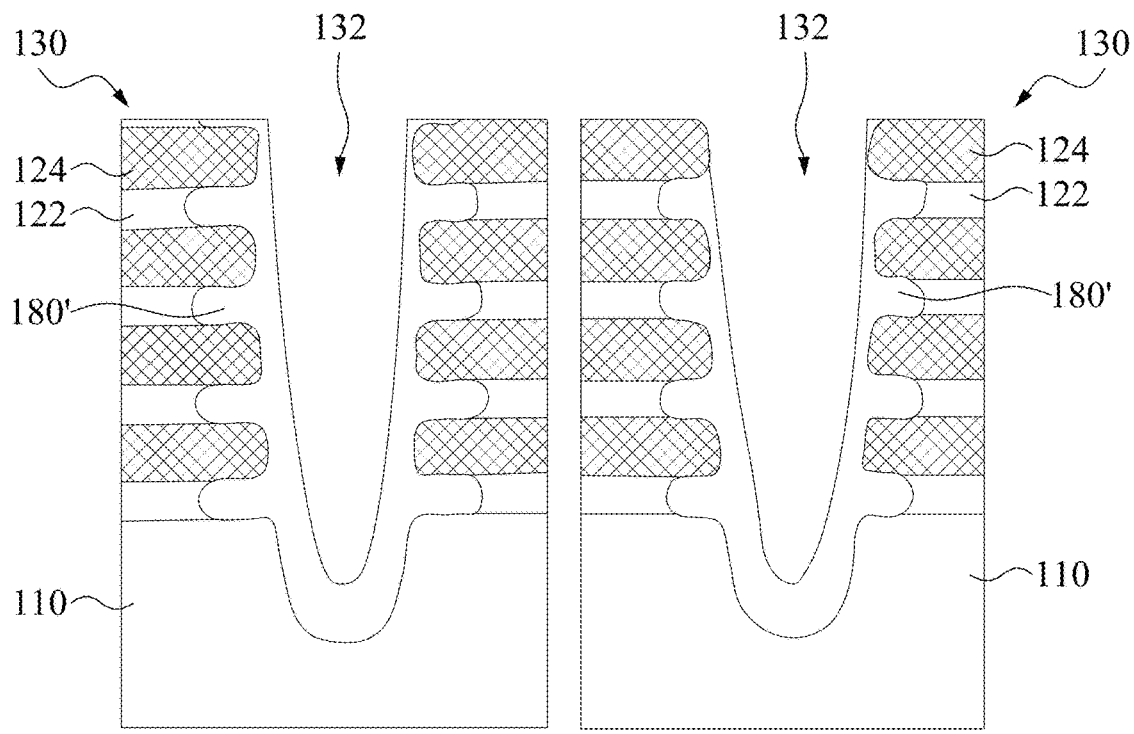
Figure 12G:
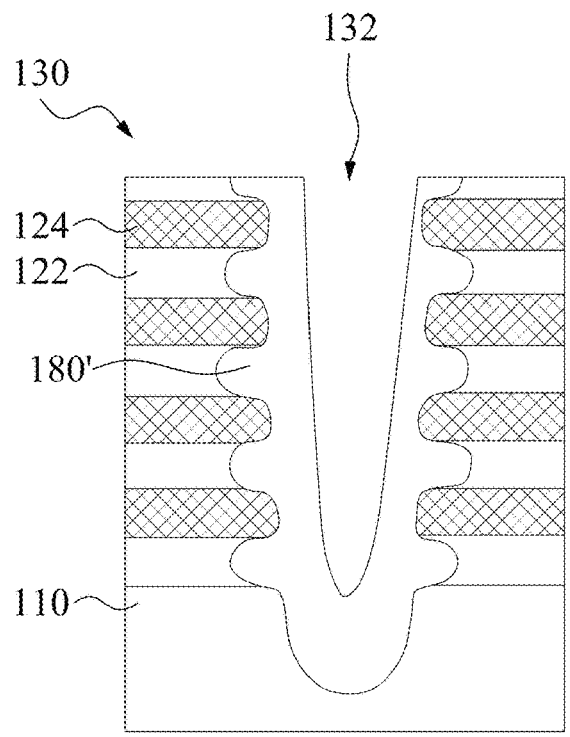
Figure 12H:
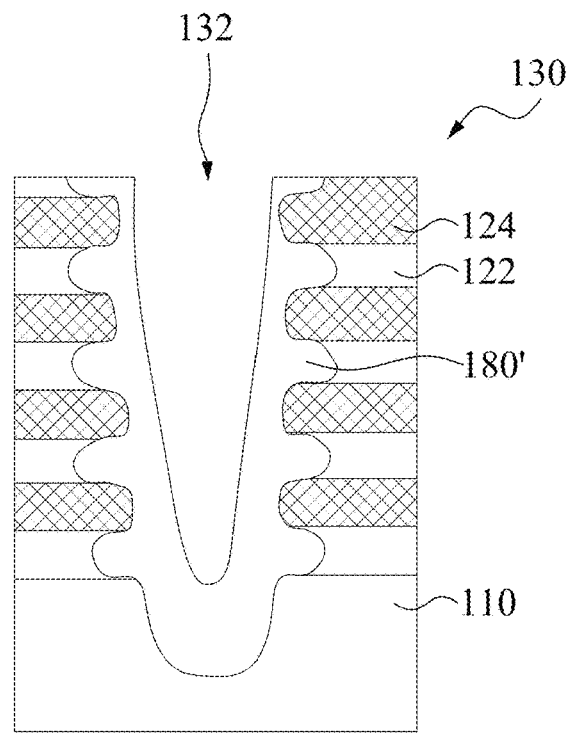
Figure 12I:
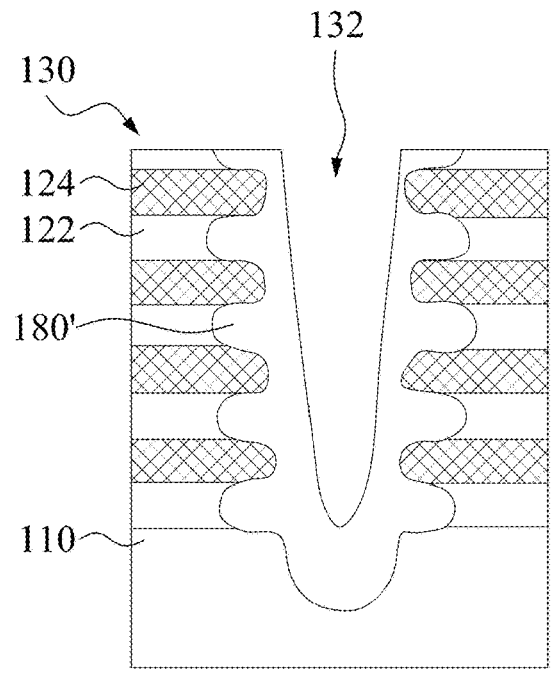

FIGS. 12C-12I are enlarged views of a portion of the etched fin structure shown in FIG. 12B during the selective chemical dry etching process 370, according to some other embodiments. In FIGS. 12C-12I, the recess 132 is formed in the etched fin structure 130 such that the etched fin structure 130 is cut into at least two parts. In FIG. 12C, the selective chemical dry etching process 370 was performed by using a gas mixture with a $F_2$ gas/HF gas flow rate ratio about 20 at about 40 degrees Celsius. In FIG. 12D, the selective chemical dry etching process 370 was performed by using a gas mixture with a $F_2$ gas/HF gas flow rate ratio about 40 at about 40 degrees Celsius. In FIG. 12E, the selective chemical dry etching process 370 was performed by using a gas mixture with a $F_2$ gas/HF gas flow rate ratio about 60 at about 40 degrees Celsius. In FIG. 12F, the selective chemical dry etching process 370 was performed by using a gas mixture with a $F_2$ gas/HF gas flow rate ratio about 80 at about 40 degrees Celsius. In FIG. 12G, the selective chemical dry etching process 370 was performed at a temperature about 40 degrees Celsius. In FIG. 12H, the selective chemical dry etching process 370 was performed at a temperature about 60 degrees Celsius. In FIG. 12I, the selective chemical dry etching process 370 was performed at a temperature about 80 degrees Celsius.

Figure 13A:
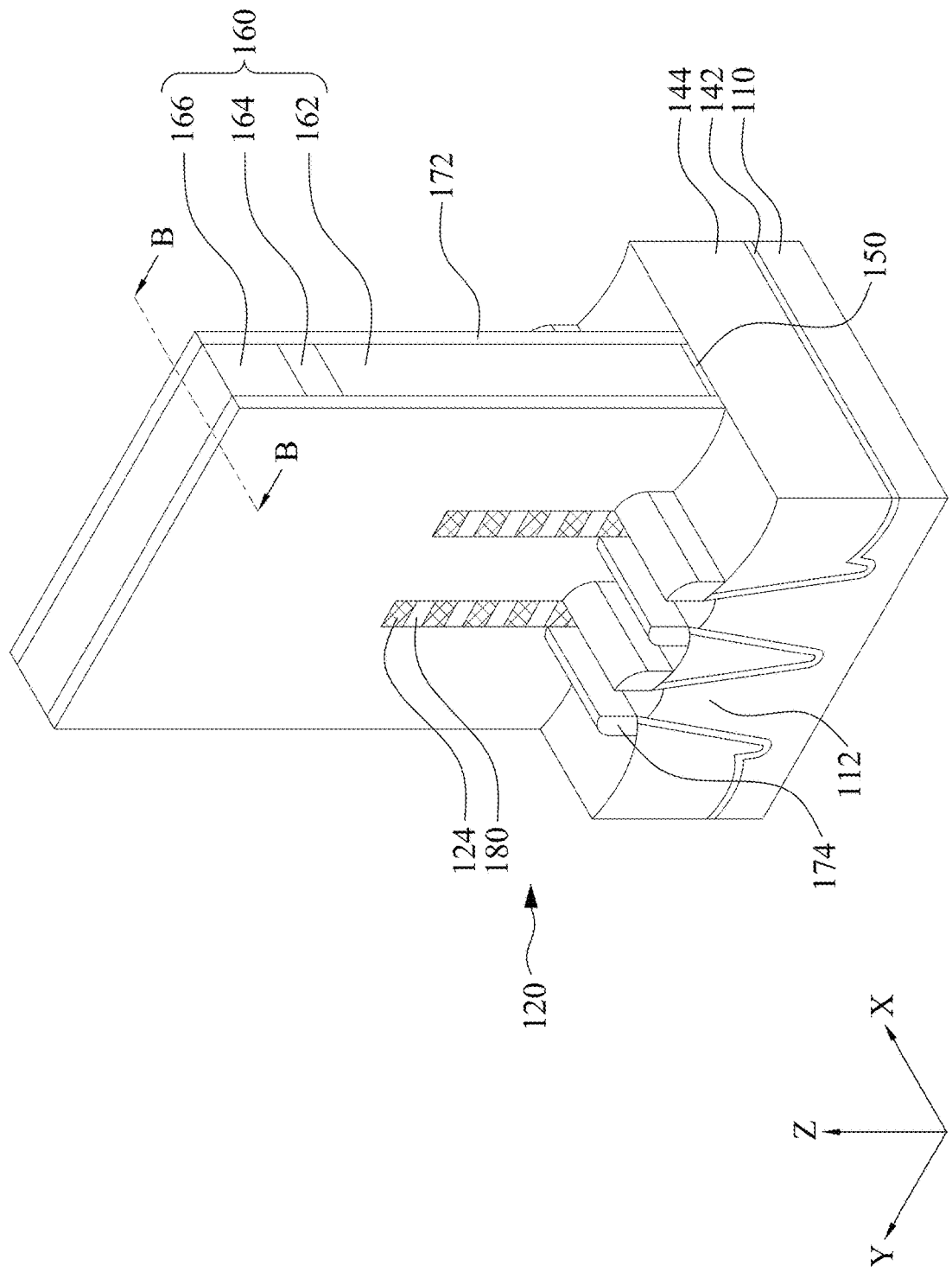
Figure 13B:
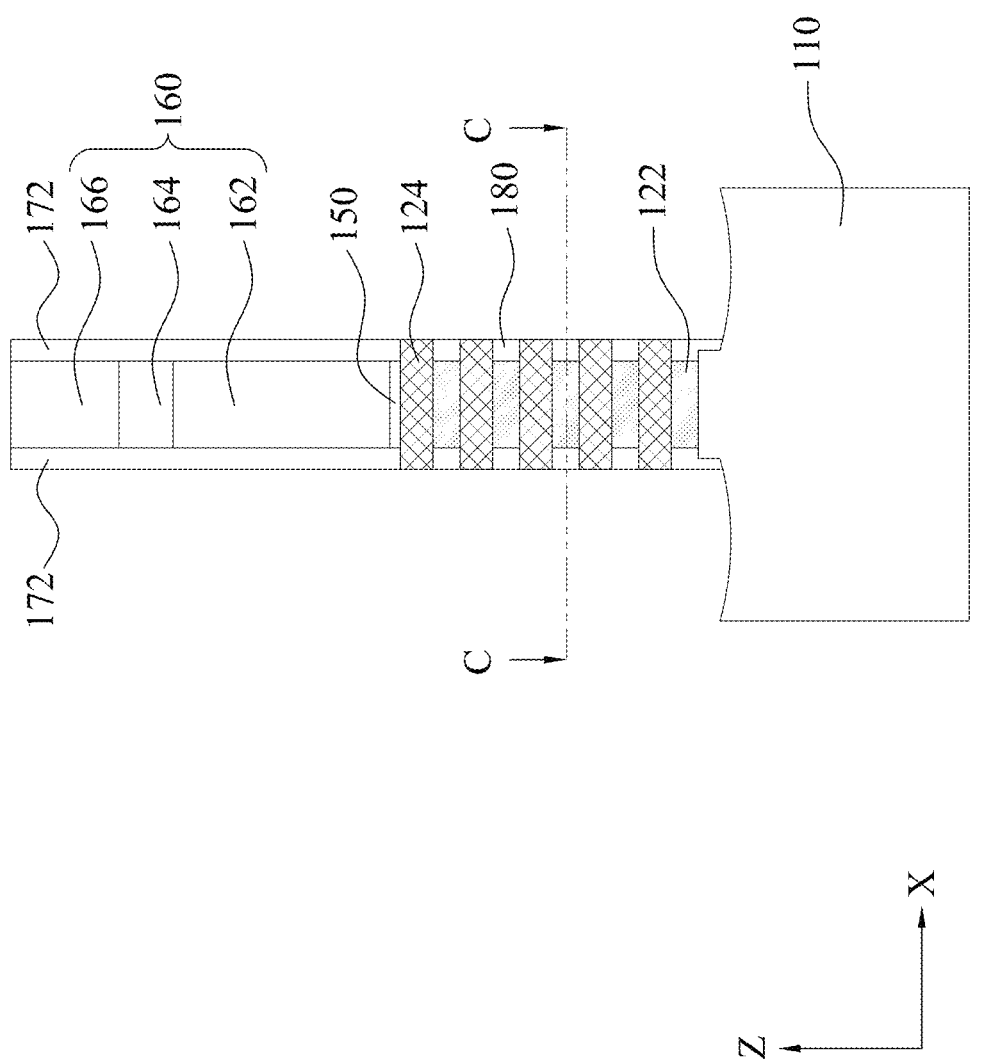

Reference is made to FIGS. 13A and 13B, where FIG. 13B is a cross-sectional view taken along line B-B in FIG. 13A. Inner spacers 180 are respectively formed in the recesses 125 (see FIG. 11B) of the semiconductor layers 122 by etching the dielectric material layer 180'. The etching operations include one or more wet and/or dry etching operations. In some embodiments, the etching is an isotropic etching. The inner spacers 180 may fully fill the recesses 125 as shown in FIG. 13B.

Figure 13C:
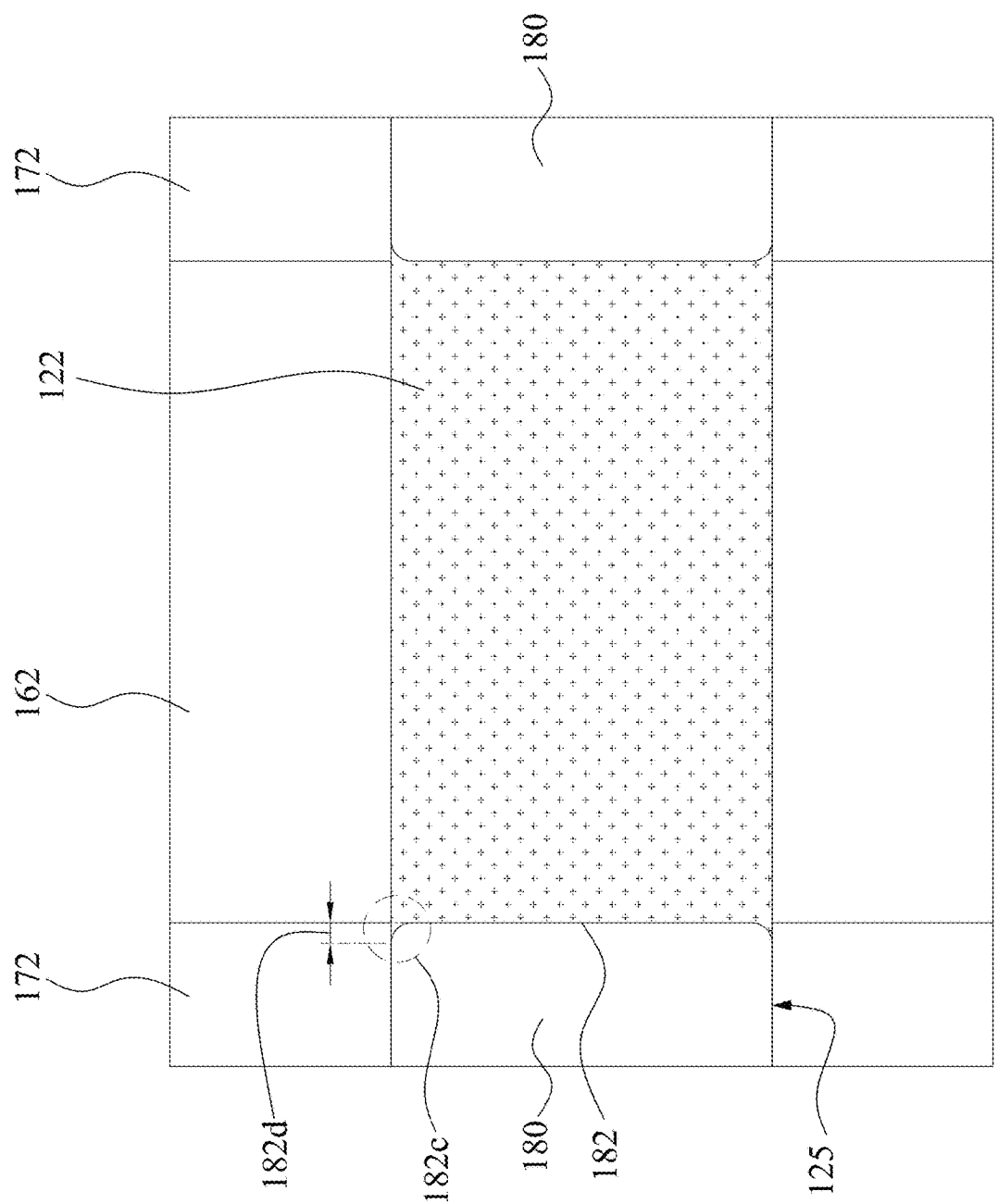

Reference is made to FIG. 13C, where FIG. 13C is a top view taken along line C-C in FIG. 13B. The inner spacers 180 may inherit the profiles of the recesses 125 (see FIG. 11C), such that an inner surface 182 of the inner spacer 180 may have a curved corner 182c. A lateral distance 182d between the farthest points of the curved corner 182c of the inner surface 182 (i.e., the interface between the inner spacer 180 and the first semiconductor layer 122) is lower than about 3 nm, e.g., lower than about 2 nm.

Figures 13D, 13E:
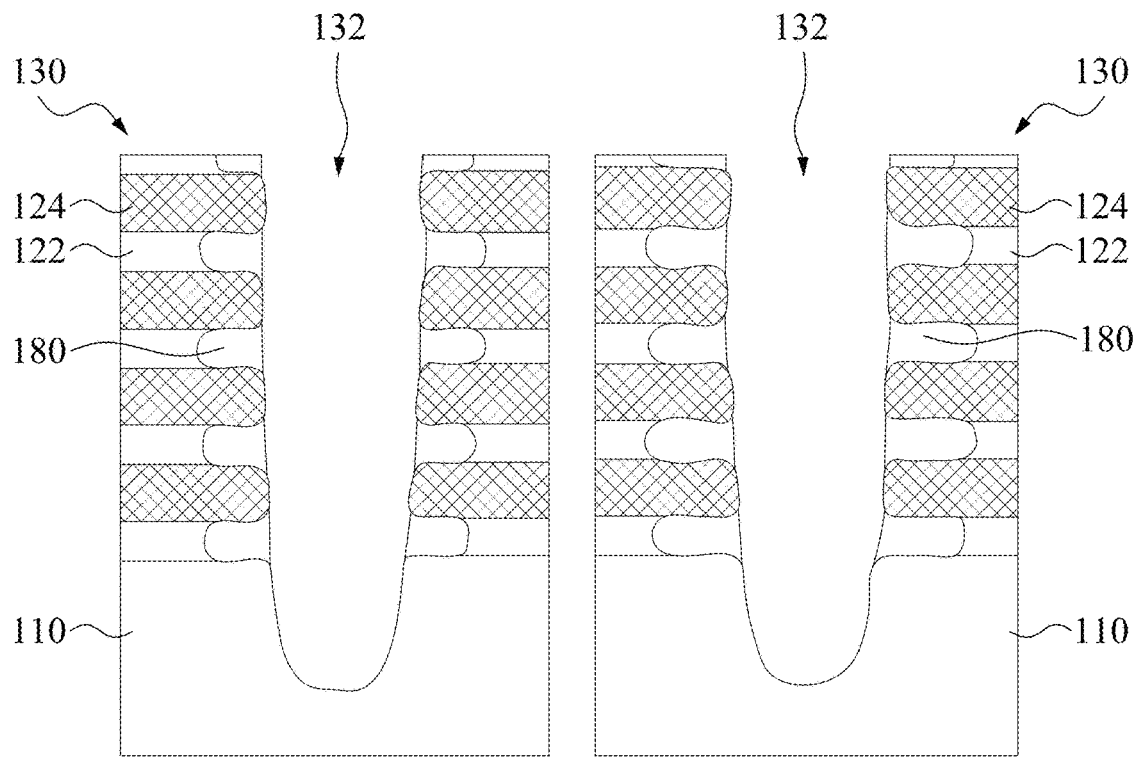
Figures 13F, 13G:
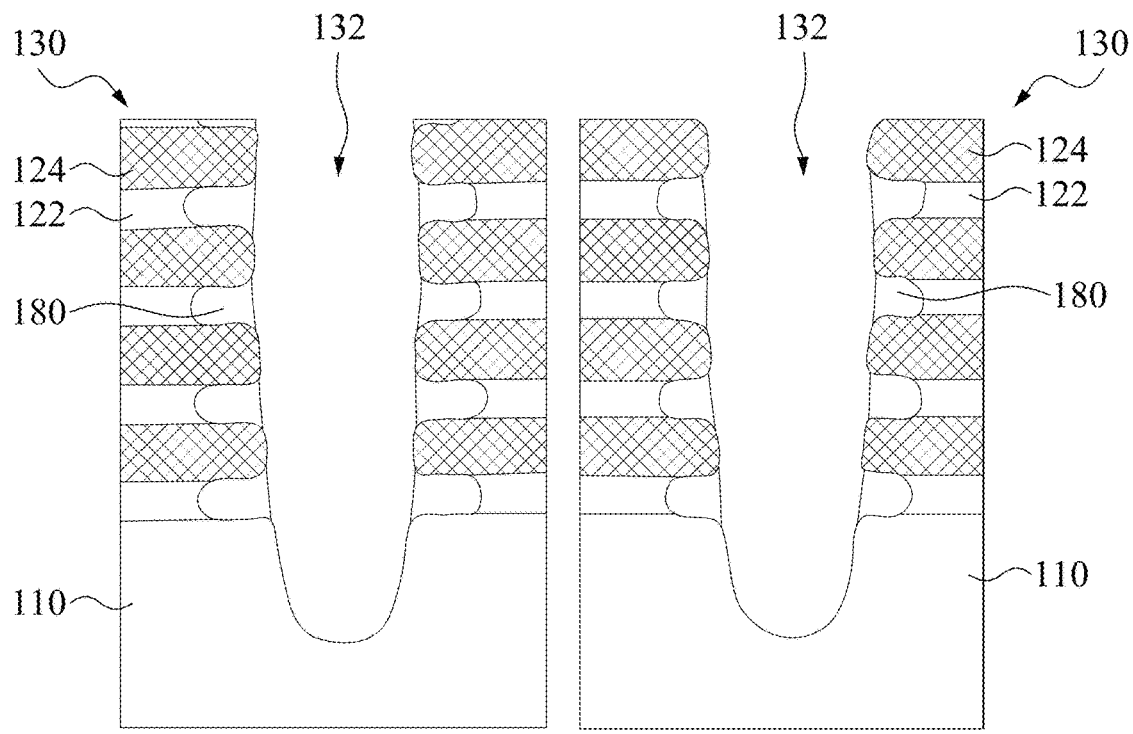
Figure 13H:
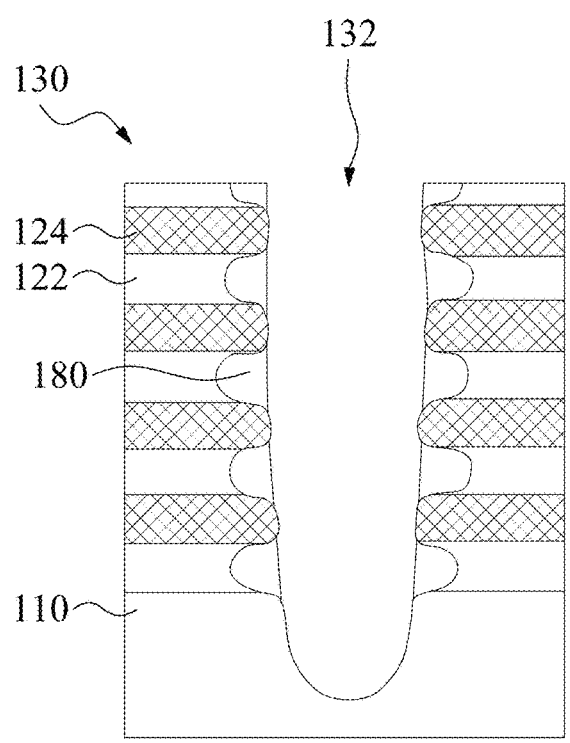
Figure 13I:
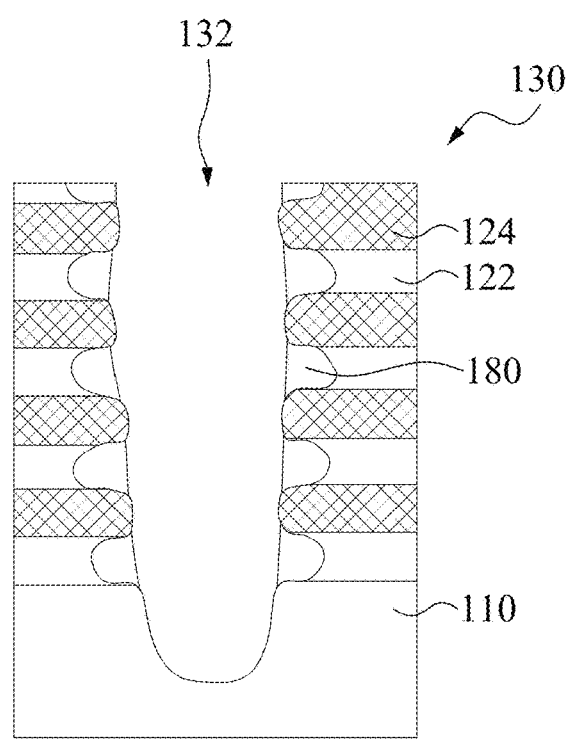
Figure 13J:
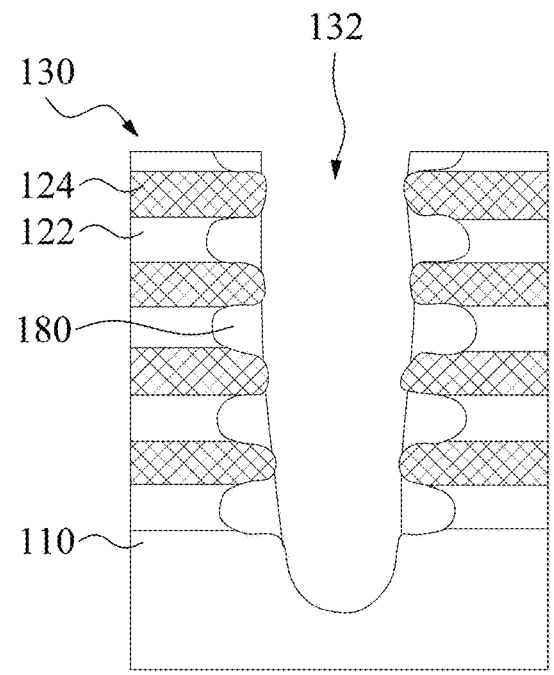

FIGS. 13D-13J are enlarged views of a portion of the etched fin structure shown in FIG. 13B during the selective chemical dry etching process 370, according to some other embodiments. In FIGS. 13D-13J, the recess 132 is formed in the etched fin structure 130 such that the etched fin structure 130 is cut into at least two parts. In FIG. 13D, the selective chemical dry etching process 370 was performed by using a gas mixture with a $F_2$ gas/HF gas flow rate ratio about 20 at about 40 degrees Celsius. In FIG. 13E, the selective chemical dry etching process 370 was performed by using a gas mixture with a $F_2$ gas/HF gas flow rate ratio about 40 at about 40 degrees Celsius. In FIG. 13F, the selective chemical dry etching process 370 was performed by using a gas mixture with a $F_2$ gas/HF gas flow rate ratio about 60 at about 40 degrees Celsius. In FIG. 13G, the selective chemical dry etching process 370 was performed by using a gas mixture with a $F_2$ gas/HF gas flow rate ratio about 80 at about 40 degrees Celsius. In FIG. 13H, the selective chemical dry etching process 370 was performed at a temperature about 40 degrees Celsius. In FIG. 13I, the selective chemical dry etching process 370 was performed at a temperature about 60 degrees Celsius. In FIG. 13J, the selective chemical dry etching process 370 was performed at a temperature about 80 degrees Celsius.

Figure 14:
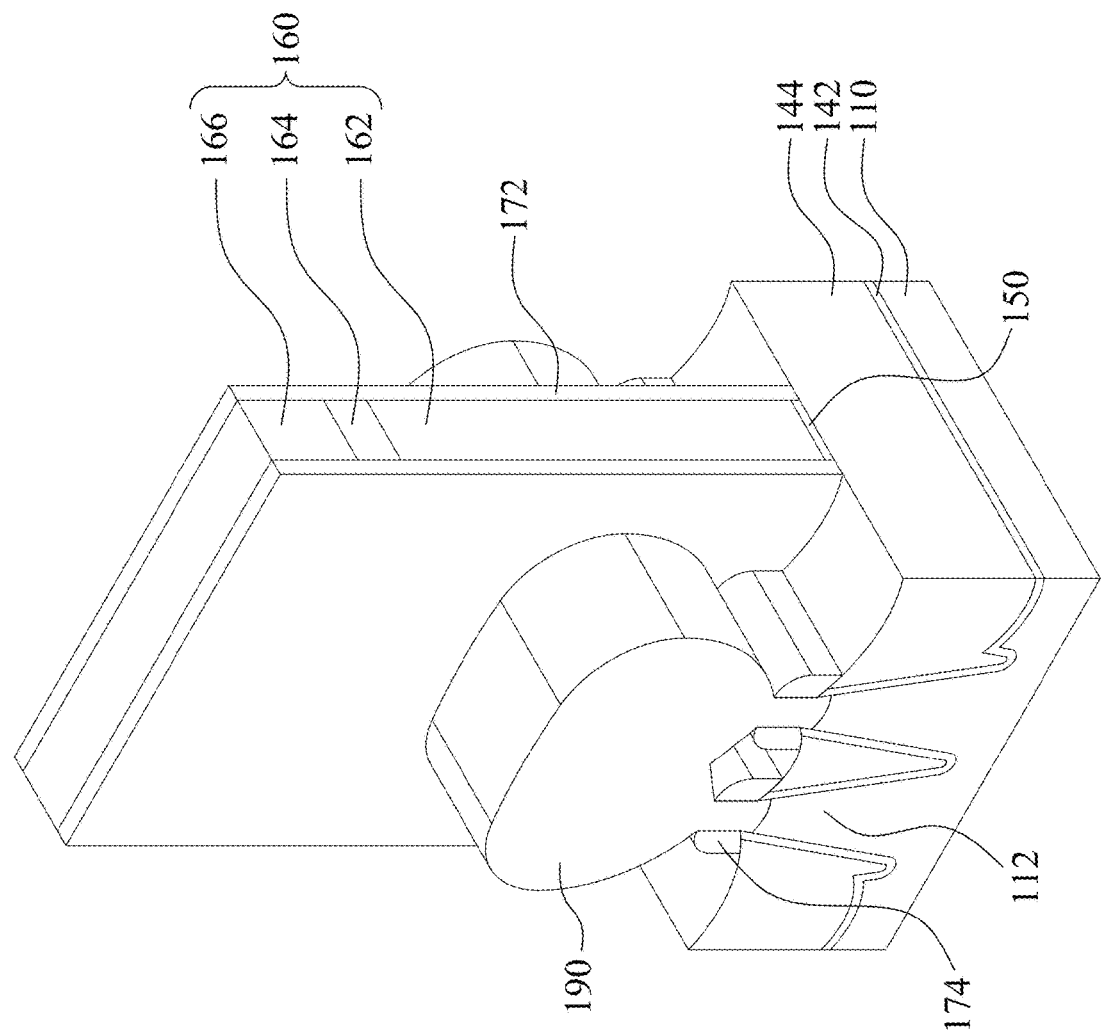

Reference is made to FIG. 14. Source/drain (S/D) epitaxial structures 190 are epitaxially grown from the base portions 112 between the fin sidewall spacers 174. The S/D epitaxial structure 190 includes one or more layers of Si, SiP, SiC and SiCP for an n-channel FET or Si, SiGe, Ge for a p-channel FET. The S/D epitaxial structures 190 are formed by an epitaxial growth method using CVD, ALD or molecular beam epitaxy (MBE). In some embodiments as depicted in FIG. 14, the SID epitaxial structures 190 grown from neighboring base portions 112 of the substrate 110 merge above the isolation insulating layer 144 and form a void in some embodiments. In some other embodiments, the S/D epitaxial structures 190 grown from neighboring base portions 112 do not merged.

Figure 15:
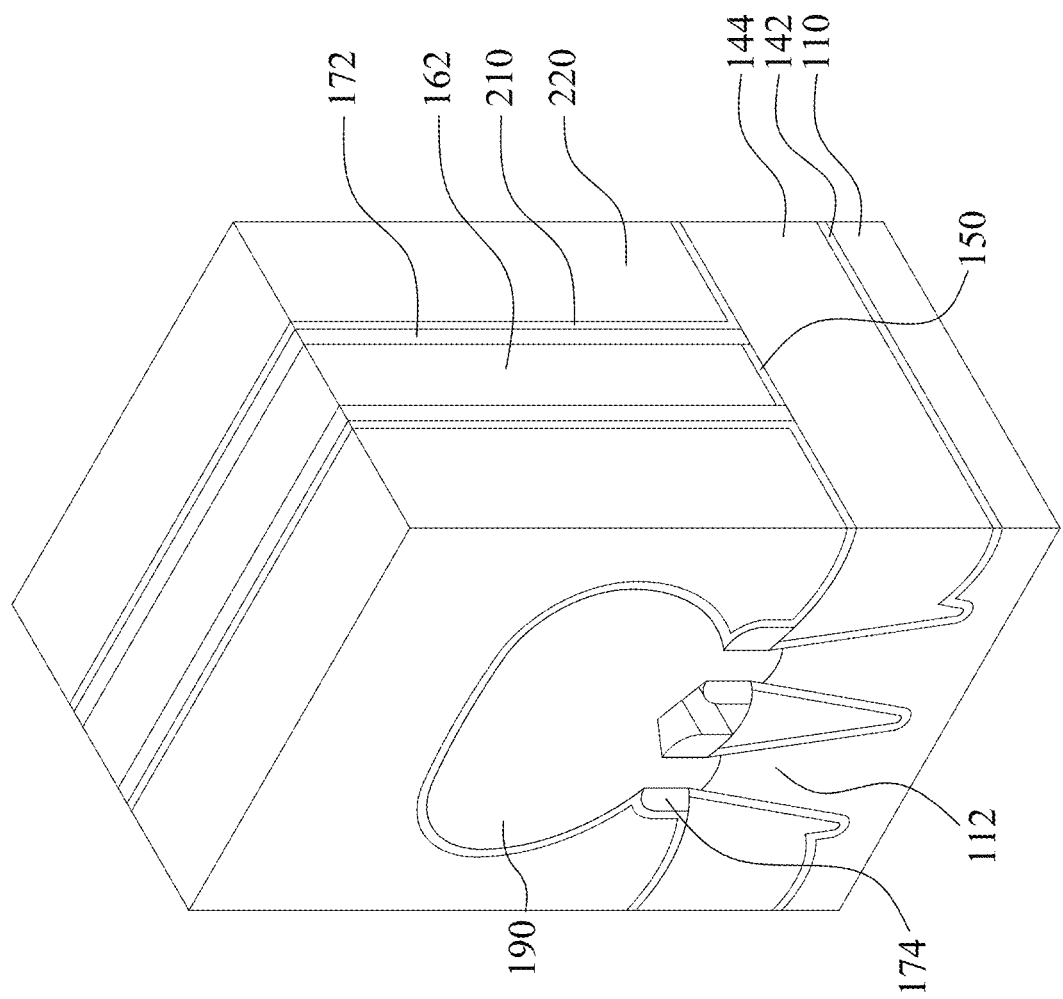

Reference is made to FIG. 15. A contact etch stop layer (CESL) 210 is conformally formed over the structure of FIG. 14. In some embodiments, the CESL 210 can be a stressed layer or layers. In some embodiments, the CESL 210 has a tensile stress and is formed of $Si_3N_4$. In some other embodiments, the CESL 210 includes materials such as oxynitrides. In yet some other embodiments, the CESL 210 may have a composite structure including a plurality of layers, such as a silicon nitride layer overlying a silicon oxide layer. The CESL 210 can be formed using plasma enhanced CVD (PECVD), however, other suitable methods, such as low pressure CVD (LPCVD), atomic layer deposition (ALD), and the like, can also be used.

An interlayer dielectric (ILD) 220 is then formed on the CESL 210. The ILD 220 may be formed by chemical vapor deposition (CVD), high-density plasma CVD, spin-on, sputtering, or other suitable methods. In some embodiments, the ILD 220 includes silicon oxide. In some other embodiments, the ILD 220 may include silicon oxy-nitride, silicon nitride, compounds including Si, O, C and/or H (e.g., silicon oxide, SiCOH and SiOC), a low-k material, or organic materials (e.g., polymers). After the ILD 220 is formed, a planarization operation, such as CMP, is performed, so that the pad layer 164 and the mask layer 166 (see FIG. 14) are removed and the dummy gate layer 162 is exposed.

Figure 16:
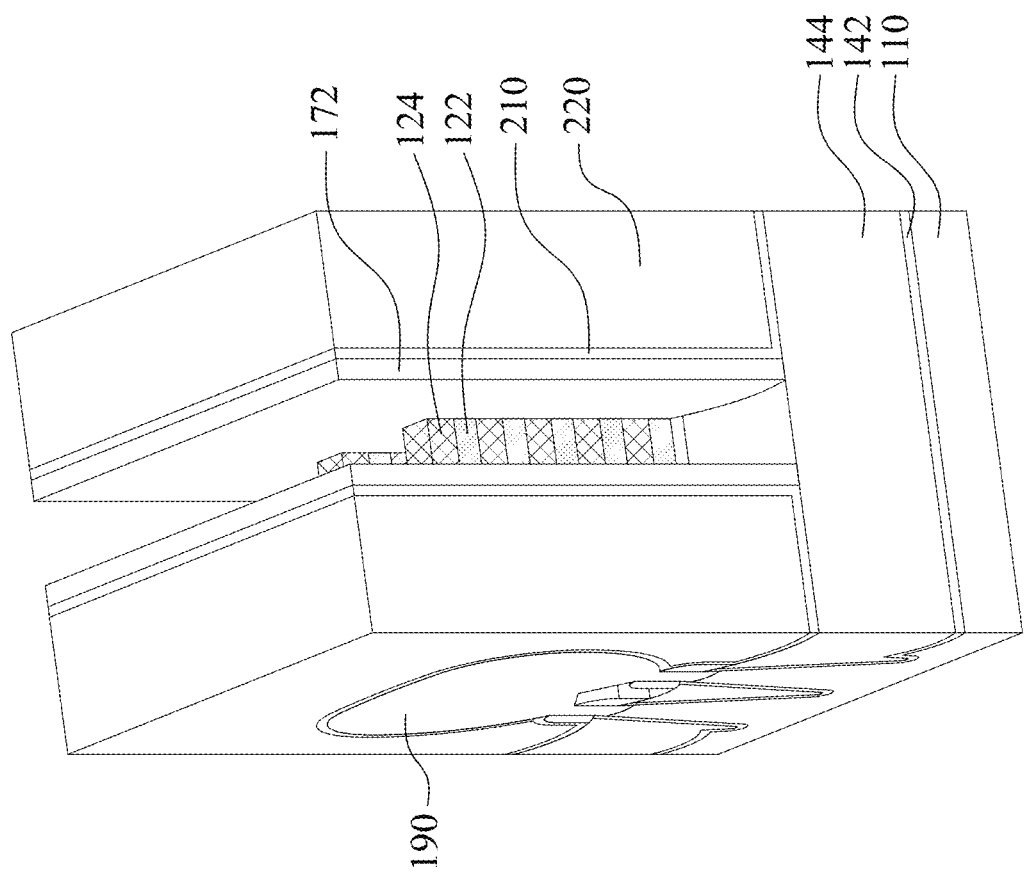

Reference is made to FIG. 16. The dummy gate layer 162 and the sacrificial gate dielectric layer 150 (see FIG. 15) are then removed, thereby exposing the first and second semiconductor layers 122 and 124. The ILD 220 protects the S/D epitaxial structures 190 during the removal of the dummy gate layer 162. The dummy gate layer 162 can be removed using plasma dry etching and/or wet etching. When the dummy gate layer 162 is polysilicon and the ILD 220 is silicon oxide, a wet etchant such as a TMAH solution can be used to selectively remove the dummy gate layer 162. The dummy gate layer 162 can be removed using plasma dry etching and/or wet etching. Subsequently, the sacrificial gate dielectric layer 150 is removed as well. As such, the first and second semiconductor layers 122 and 124 are exposed.

Figure 17:
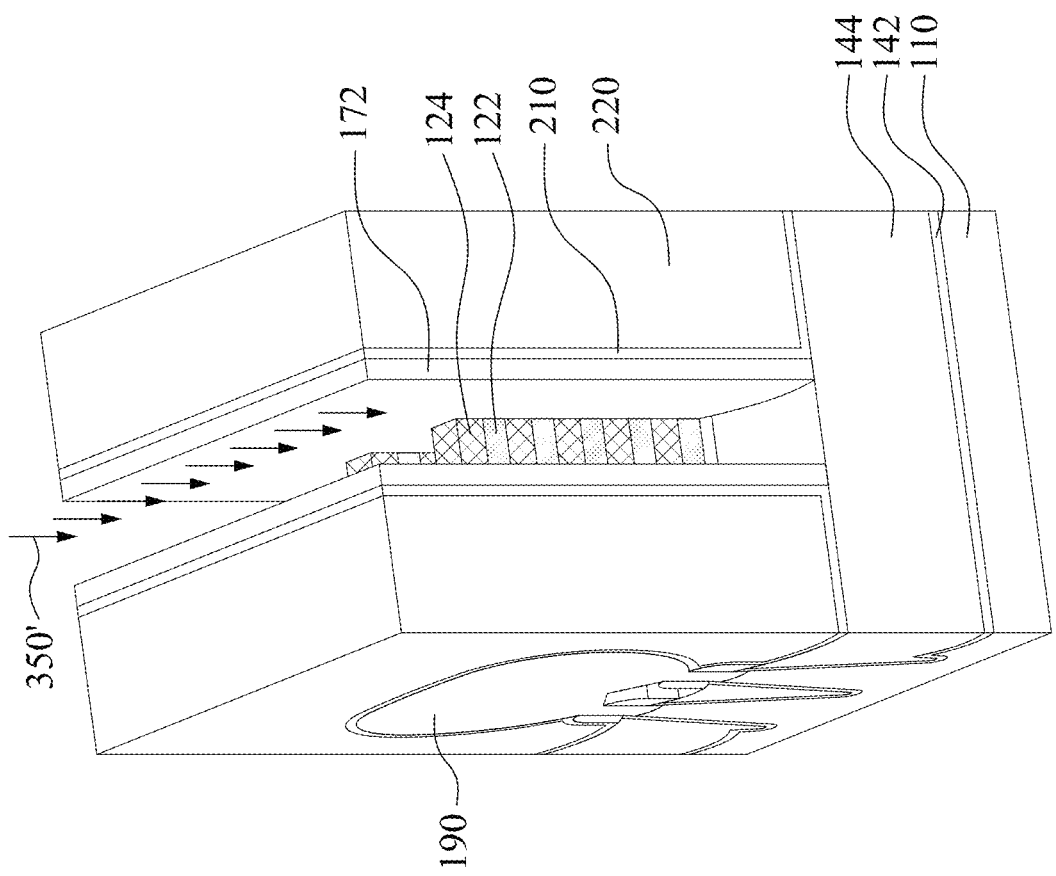

Reference is made to FIG. 17. In some embodiments, another hydrogen radical treatment 350' is optionally performed to the first and second semiconductor layers 122 and 124 to remove oxygen deep in the first and second semiconductor layers 122 and 124. In some embodiments, the hydrogen radical treatment 350' may be performed using the processing tool 400 as shown in FIG. 22. The hydrogen radical treatment 350' may be similar to or the same as the hydrogen radical treatment 350 of FIG. 9A, and, therefore, the detailed descriptions thereof are not repeated herein. The hydrogen radical treatment 350' can be omitted if the first and second semiconductor layers 122 and 124 includes no or ignorable oxygen impurities/oxides.

Figure 18:
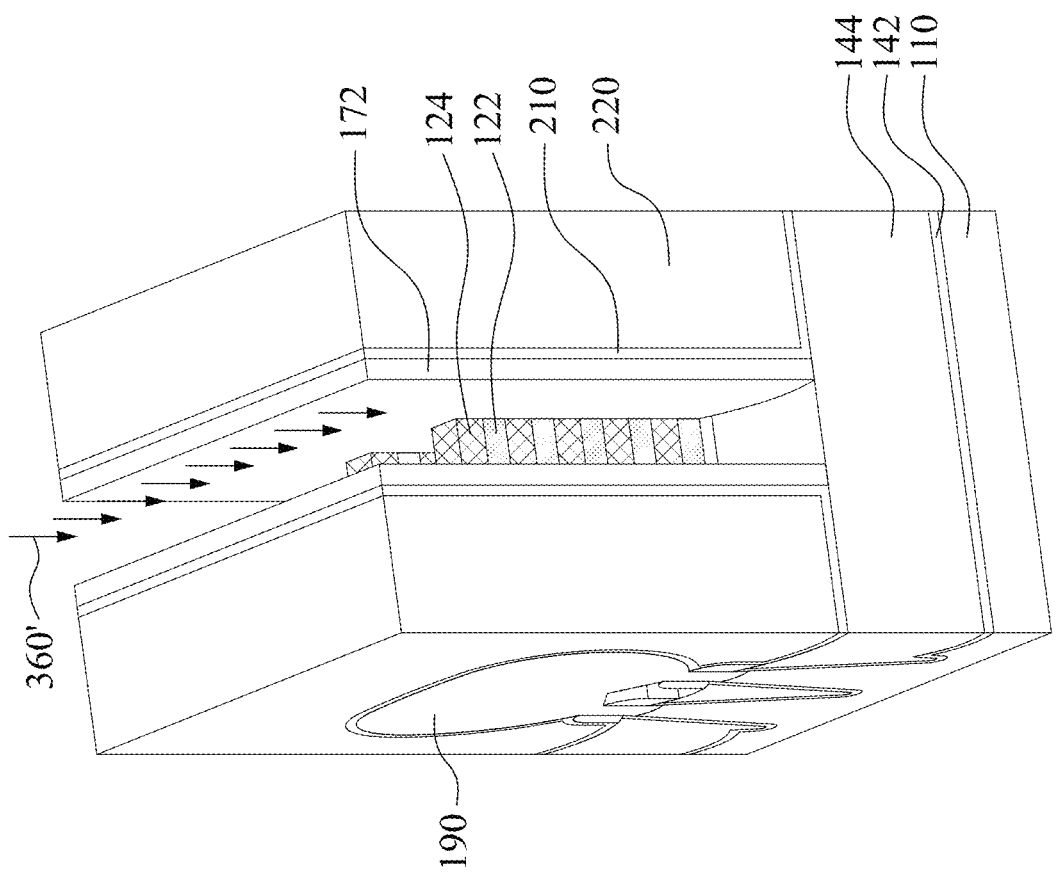

Reference is made to FIG. 18. In some embodiments, another surface cleaning process 360' is optionally performed to the first and second semiconductor layers 122 and 124 to remove native oxide on exposed surfaces of the first and second semiconductor layers 122 and 124. In some embodiments, the surface cleaning process 360' may be performed using the processing tool 400 as shown in FIG. 22. The cleaning process 360' may be similar to or the same as the cleaning process 360 of FIG. 10A, and, therefore, the detailed descriptions thereof are not repeated herein. The cleaning process 360' can be omitted if the first and second semiconductor layers 122 and 124 includes no or ignorable native oxides.

Figure 19A:
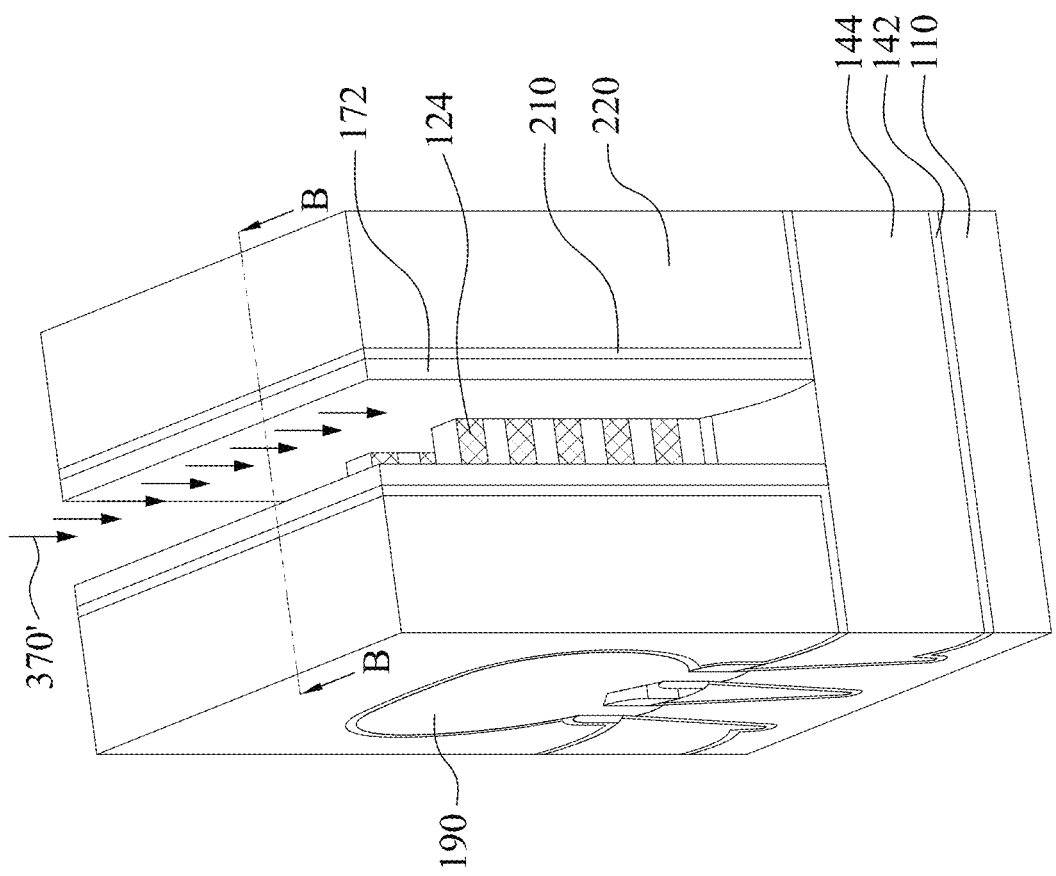
Figure 19B:
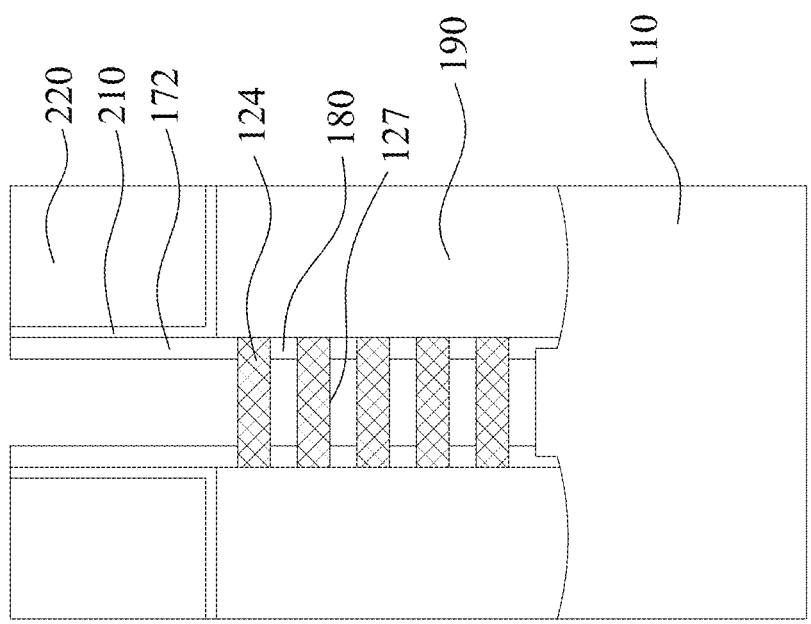

Reference is made to FIGS. 19A and 19B, where FIG. 19B is a cross-sectional view taken along line B-B in FIG. 19A. The first semiconductor layers 122 (as shown in FIG. 18) in the fin structures 130 are removed, thereby forming nanosheets (or nanowires or nanorods or nano-columns) of the second semiconductor layers 124. The first semiconductor layers 122 can be removed or etched using an etchant that can selectively etch the first semiconductor layers 122 at a faster etching rate than etching the second semiconductor layers 124. For example, another selective chemical dry etching process 370' can be performed to remove the first semiconductor layers 122. In some embodiments, the selective chemical dry etching process 370' may be performed using the processing tool 400 as shown in FIG. 22. The selective chemical dry etching process 370' may be similar to or the same as the selective chemical dry etching process 370 of FIG. 11A, and, therefore, the detailed descriptions thereof are not repeated herein.

Similarly, $SiF_2H$— may remain on the exposed surfaces 127 of the second semiconductor layers 124. As such, $SiF_2H$— may be detected on the exposed surfaces 127 of the second semiconductor layers 124. Or, the second semiconductor layers 124 include F and/or H on the exposed surfaces 127. Or, the second semiconductor layers 124 include Si—H bonds and/or Si—F bonds on the exposed surfaces 127.

In FIG. 19B, since the inner spacers 180 is made of a material that has etching selectivity to that of the first semiconductor layers 122, the inner spacers 180 protect the S/D epitaxial structures 190 from the etchant used in etching the first semiconductor layers 122.

Figure 20A:
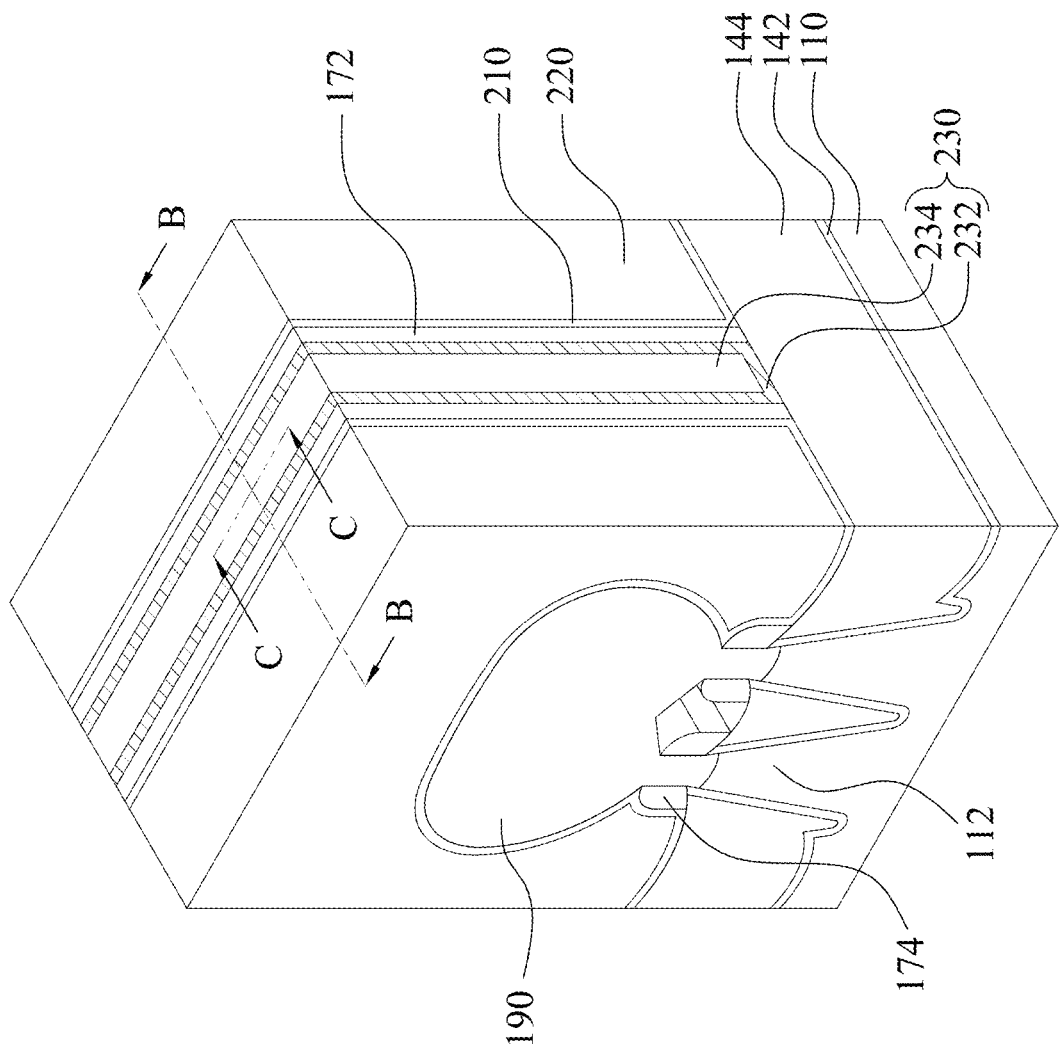
Figure 20B:
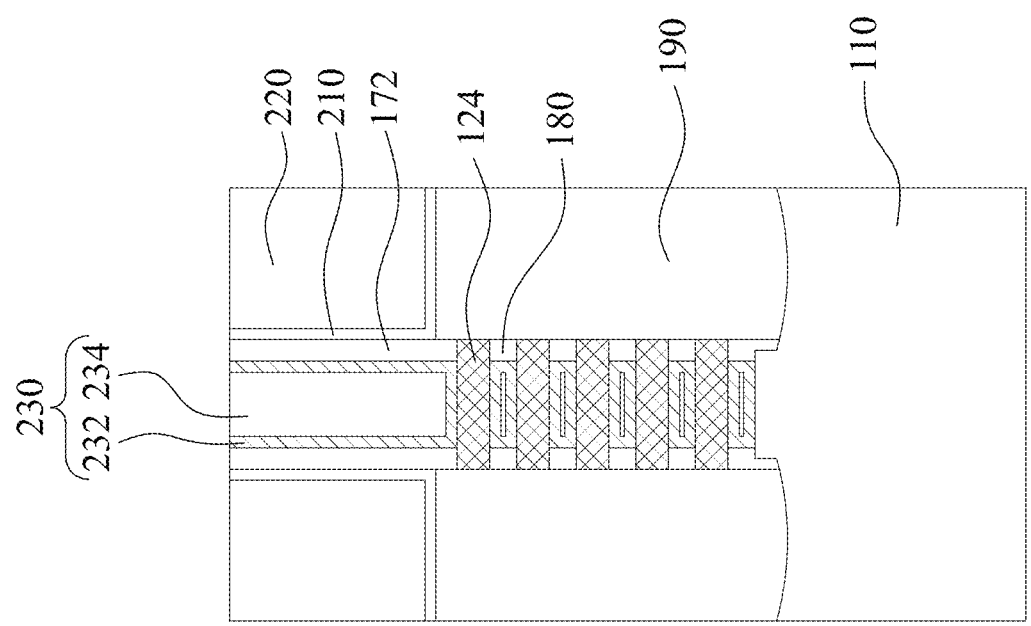
Figure 20C:
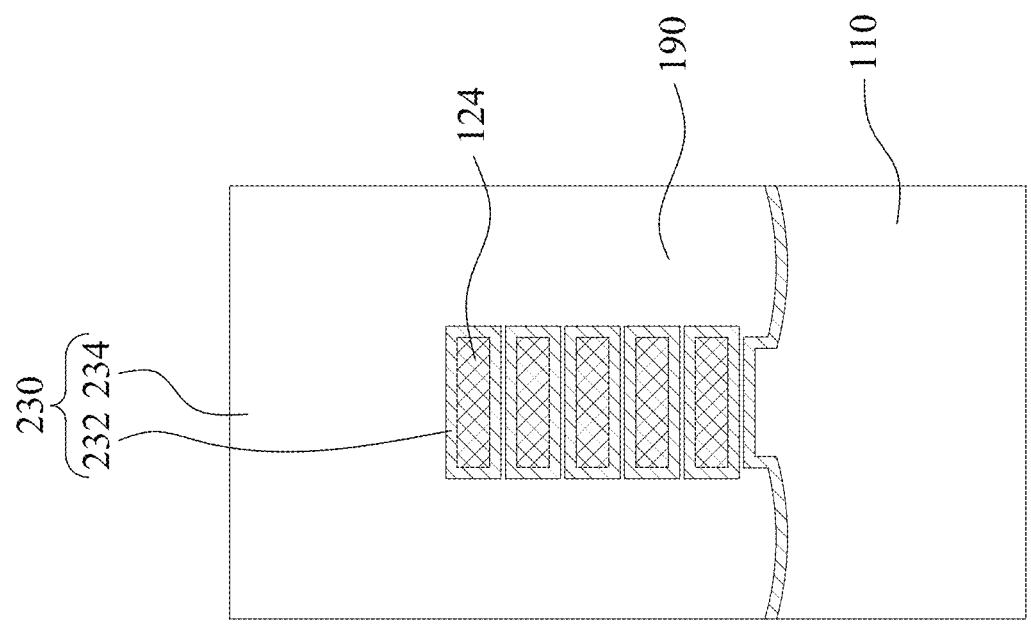

Reference is made to FIGS. 20A-20C, where FIG. 20B is a cross-sectional view taken along line B-B in FIG. 20A, and FIG. 20C is a cross-sectional view taken along line C-C in FIG. 20A. A gate structure 230 is formed and/or filled between the gate spacers 172 or the inner spacers 180. That is, the gate structure 230 encircles (wraps) the semiconductor layers 124. The gate spacers 172 are disposed on opposite sides of the gate structure 230. The gate structure 230 includes a gate dielectric layer 232 and a gate electrode 234. The gate electrode 234 includes one or more work function metal layer (s) and a filling metal. The gate dielectric layer 232 is conformally formed. That is, the gate dielectric layer 232 is in contact with the isolation structures 144 and the second semiconductor layers 124, in which the second semiconductor layers 124 are referred to as channels of the semiconductor device. Furthermore, the gate dielectric layer 232 surrounds the second semiconductor layers 124, and spaces between the second semiconductor layers 124 are still left after the deposition of the gate dielectric layer 232. In some embodiments, the gate dielectric layer 232 includes a high-k material (k is greater than 7) such as hafnium oxide ($HfO_2$), zirconium oxide ($ZrO_2$), lanthanum oxide ($La_2O_3$), hafnium aluminum oxide ($HfAlO_2$), hafnium silicon oxide ($HfSIO_2$), aluminum oxide ($Al_2O_3$), or other suitable materials. In some embodiments, the gate dielectric layer 232 may be formed by performing an ALD process or other suitable process.

The work function metal layer is conformally formed on the gate dielectric layer 232, and the work function metal layer surrounds the second semiconductor layers 124 in some embodiments. The work function metal layer may include materials such as TiN, TaN, TiAlSi, TiSiN, TiAl, TaAl, or other suitable materials. In some embodiments, the work function metal layer may be formed by performing an ALD process or other suitable process.

The filling metal fills the remained space between the gate spacers 172 and between the inner spacers 180. That is, the work function metal layer(s) is in contact with and between the gate dielectric layer 232 and the filling metal. The filling metal may include material such as tungsten or aluminum. After the deposition of the gate dielectric layer 232 and the gate electrode 234, a planarization process, such as a CMP process, may be then performed to remove excess portions of the gate dielectric layer 232 and the gate electrode 234 to form the gate structure 230.

Figure 21A:
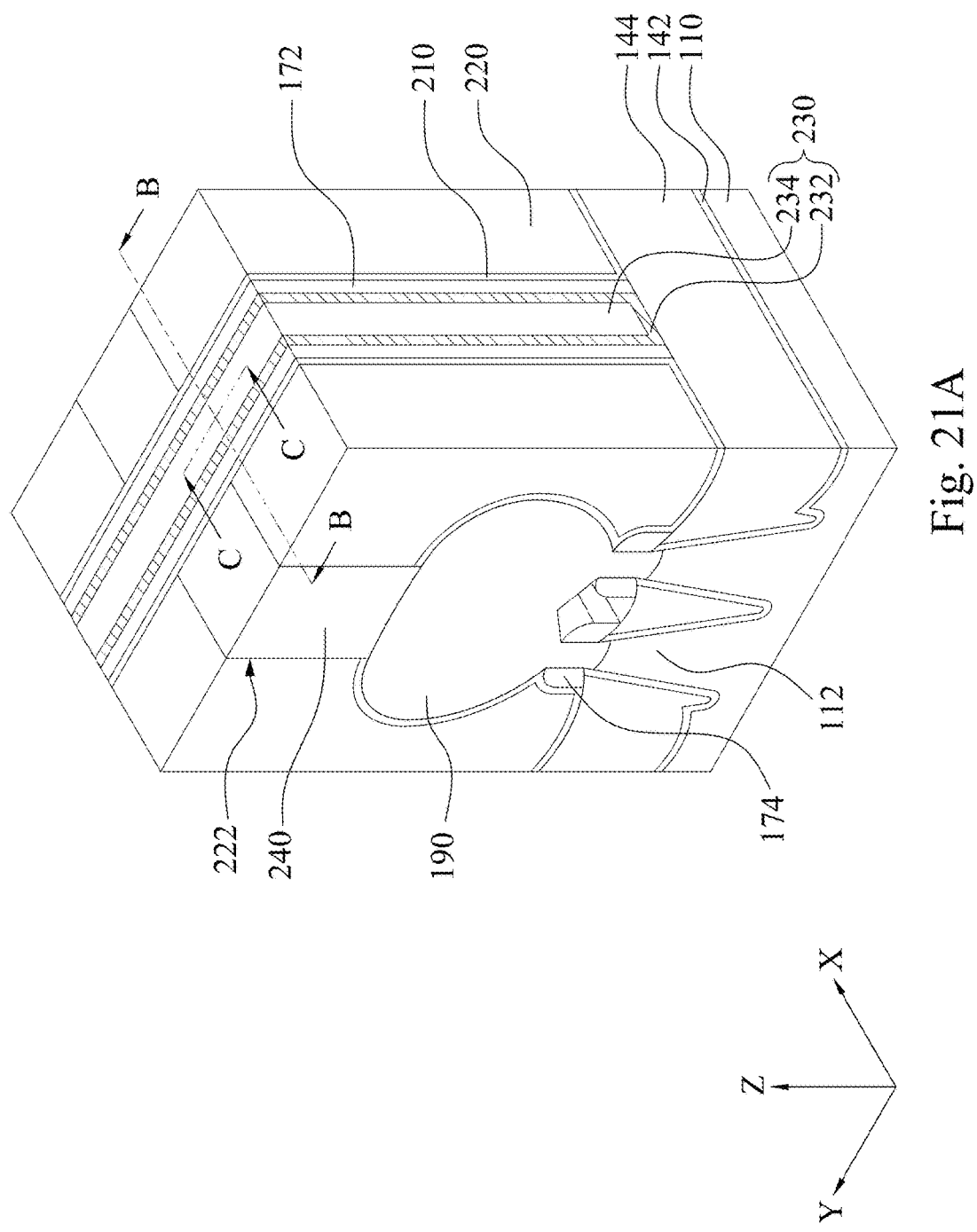
Figure 21B:
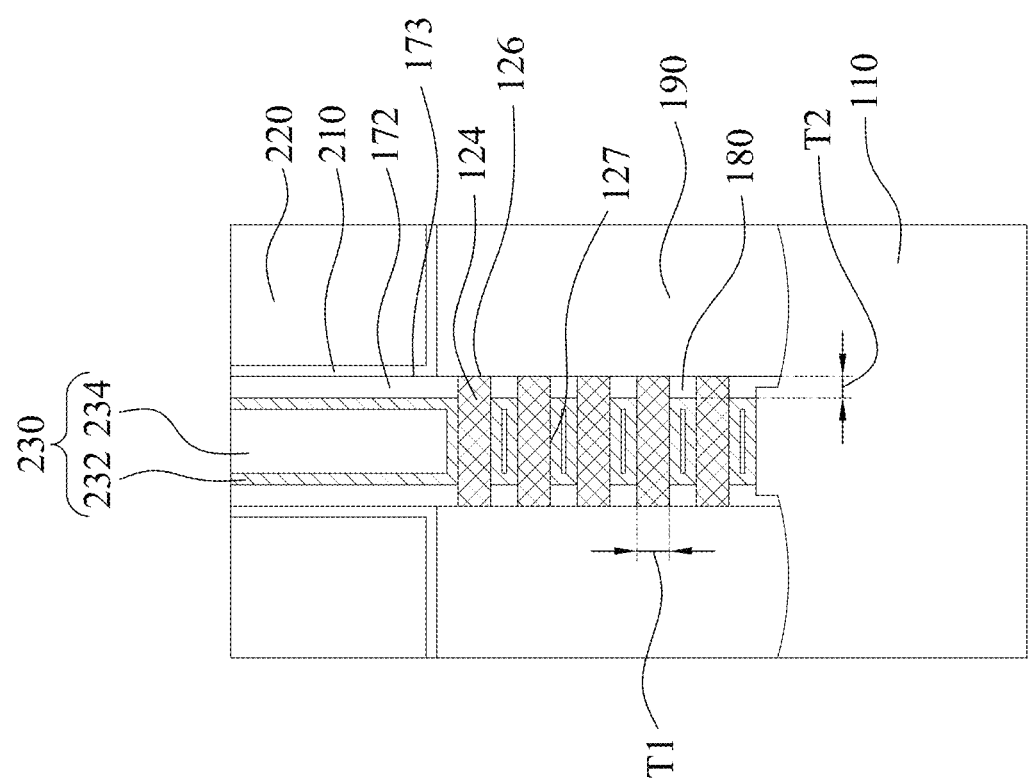
Figure 21C:
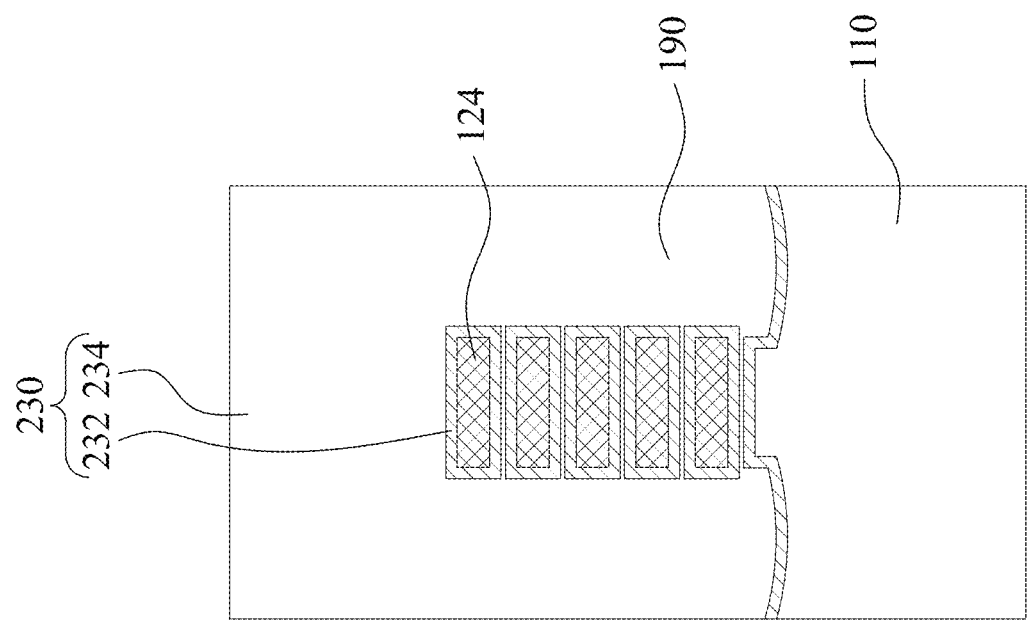

Reference is made to FIGS. 21A-21C, where FIG. 21B is a cross-sectional view taken along line B-B in FIG. 21A, and FIG. 21C is a cross-sectional view taken along line C-C in FIG. 21A. The ILD 220 is patterned to form trenches 222 on opposite sides of the gate structure 230, and then the CESL 210 is patterned to expose the S/D epitaxial layers. In some embodiments, multiple etching processes are performed to pattern the ILD 220 and the CESL 210. The etching processes include dry etching process, wet etching process, or combinations thereof.

Contacts 240 are then formed in the trenches 222. As such, the contacts 240 are respectively in contact with the S/D epitaxial structures 190. In some embodiments, the contacts 330 may be made of metal, such as W, Co, Ru, Al, Cu, or other suitable materials. After the deposition of the contacts 240, a planarization process, such as a chemical mechanical planarization (CMP) process, may be then performed. In some embodiments, metal alloy layers (such as silicide) may be formed between the contacts 240 and the SID epitaxial structures 190. Further, barrier layers may be formed in the trenches 222 before the formation of the contacts 240. The barrier layers may be made of TiN, TaN, or combinations thereof.

In FIG. 21A, the semiconductor device may be a (HGAA) transistor 100. As shown in FIG. 21B, the transistor 100 includes the second semiconductor layers 124 as its channels and the second semiconductor layers 124 are each surrounded by the gate structure 230. An outer edge (or sidewall) 126 of the (topmost) second semiconductor layer 124 is substantially vertically aligned with an outer edge 173 of the gate spacer 172. Here, "substantially vertically alignment" means the horizontal offset is less than about 1.2 nm. As mentioned above, the selective chemical dry etching process 370 in FIG. 11A barely removes the second semiconductor layers 124, such that the length of the second semiconductor layers 124 is substantially unchanged after the selective chemical dry etching process 370, thereby boosting electric mobility of the transistor 100 and enlarging the epitaxial growth window for forming the SID epitaxial layers. The gate structure 230 includes the gate dielectric layer 232 and the gate electrode 234. The dielectric layer 232 surrounds (wraps around) the semiconductor layers 124.

In some embodiments, each of the second semiconductor layers 124 has a thickness T1 (in the Z-axis direction) in a range of about 8 nm to about 10.5 nm. In some embodiments, the thickness T1 of each of the second semiconductor layers 124 may slightly vary in the X-axis direction. For example, a center portion of the second semiconductor layer 124 may be slightly thinner than an edge portion of the same second semiconductor layer 124 due to the selective chemical dry etching process 370' shown in FIG. 19A. In some embodiments, the thickness variation ((distance between a highest point and a lowest point of the surface)/(2 times thickness T1)) of the second semiconductor layer 124 is greater than 0, e.g., less than about 0.5 nm. The thickness variation is a measure of surface uniformity. Decreasing the thickness variation increases the uniformity of the surfaces of the second semiconductor layer 124. The surface of the second semiconductor layer 124 is smooth (due to the selective chemical dry etching process 370' shown in FIG. 19A) that benefits for electrical mobility and the quality improvements of the gate structure 230.

As mentioned above, $SiF_2H$— may remain on interfaces 126 of the second semiconductor layers 124 and the S/D epitaxial structure 190 (i.e., the sidewalls 126 of the second semiconductor layers 124). As such, $SiF_2H$— may be detected on the interfaces 126. Or, the second semiconductor layers 124 include F and/or H on the interfaces 126. Or, the second semiconductor layers 124 include Si—H bonds and/or Si—F bonds on the interfaces 126.

Similarly, $SiF_2H$— may remain on interfaces 127 of the second semiconductor layers 124 and the gate structure 230 (i.e., the surfaces 127 of the second semiconductor layers 124). As such, $SiF_2H$— may be detected on the interfaces 127. Or, the second semiconductor layers 124 include F and/or H on the interfaces 127. Or, the second semiconductor layers 124 include Si—H bonds and/or Si—F bonds on the interfaces 127.

The transistor 100 further includes the inner spacers 180 between the gate structure 230 and the S/D epitaxial layers to isolate the gate structure 230 and the S/D epitaxial layers. The inner spacers 180 reduce RC delay and boost ring oscillator (RO) performance of the transistor 100. In some embodiments, the thickness T2 of the inner spacers 180 (in the Y-axis direction) is in a range of about 5 nm to about 65 nm. Further, each of the inner spacers 180 has its thickness T2, and the variation of these thicknesses T2 is lower than about 6%. For example, if one of the inner spacers 180 has a thickness T2 of about 8 nm, another one of the inner spacers 180 have a thickness T2 in a range of about 7.5 nm to about 8.5 nm. As such, the thicknesses T2 of the inner spacers 180 are substantially uniform. This is because during the selective chemical dry etching process 370, the fluorine-containing gas and the hydrogen-containing gas uniformly etch the first semiconductor layers 122 (see FIGS. 11A and 11B). Further, in some embodiments, the hydrogen radical treatment 350 (see FIG. 9A) and/or the cleaning process 360 (see FIG. 10A) are performed before the selective chemical dry etching process 370. The removal of the oxygen impurities and/or oxides benefits for effectively recessing/etching of the first semiconductor layers 122.

Figures 21D, 21E:
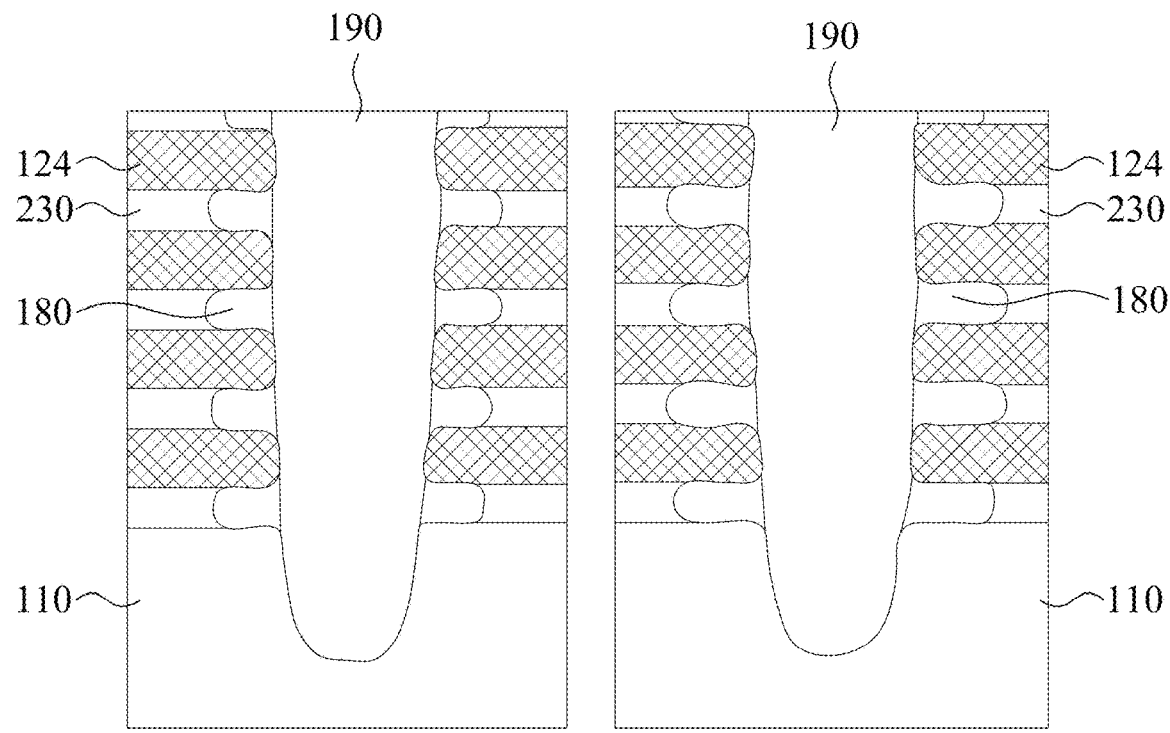
Figures 21F, 21G:
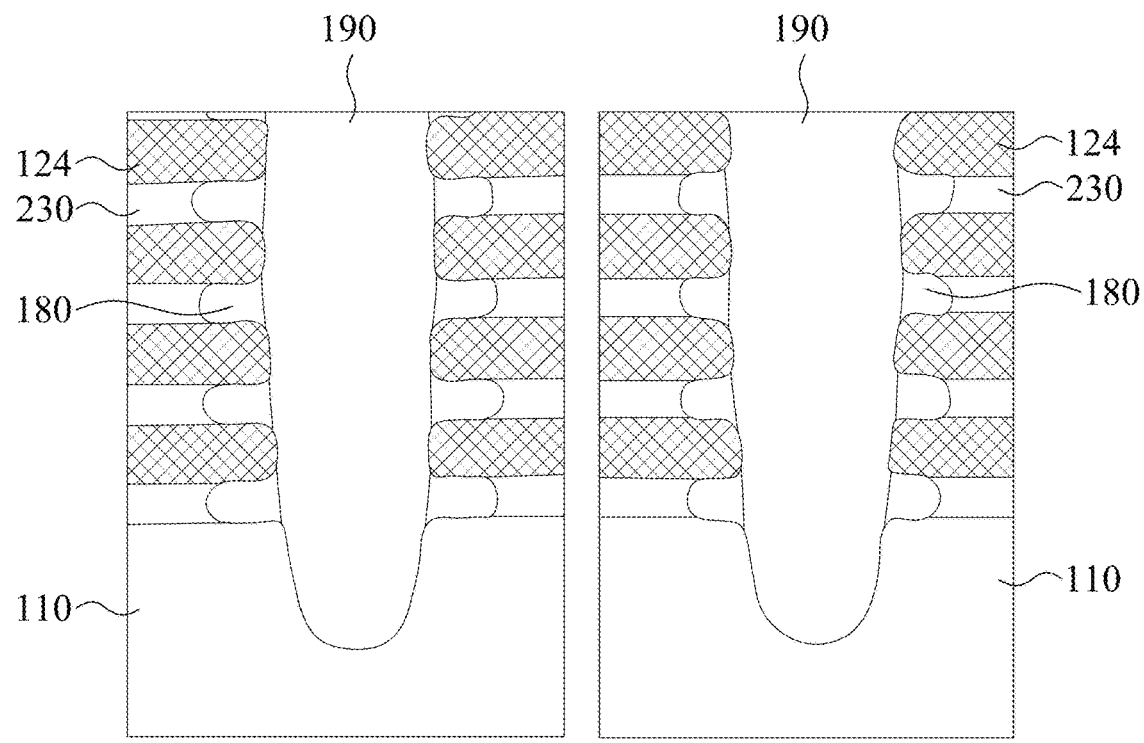
Figure 21H:
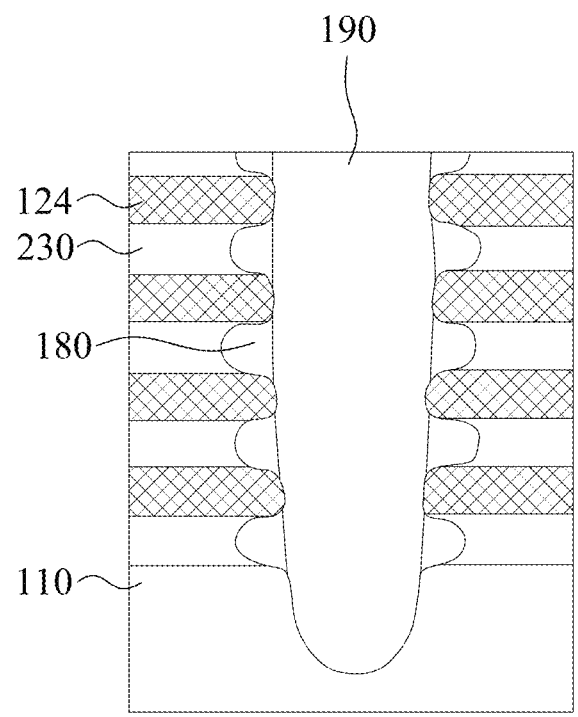
Figure 21I:
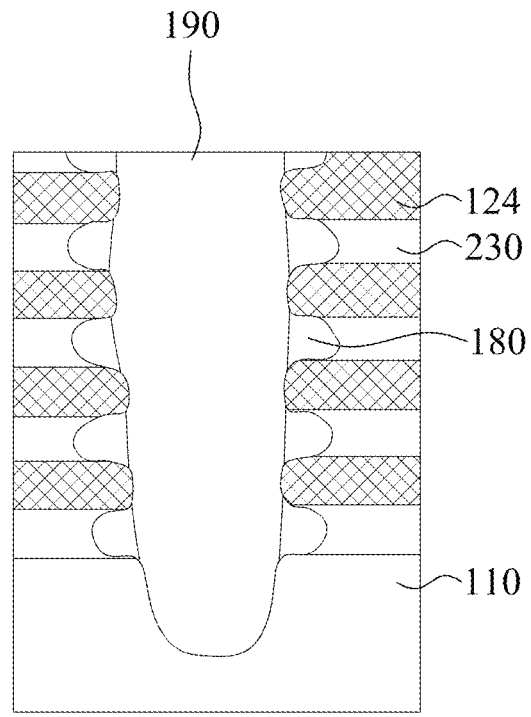
Figure 21J:
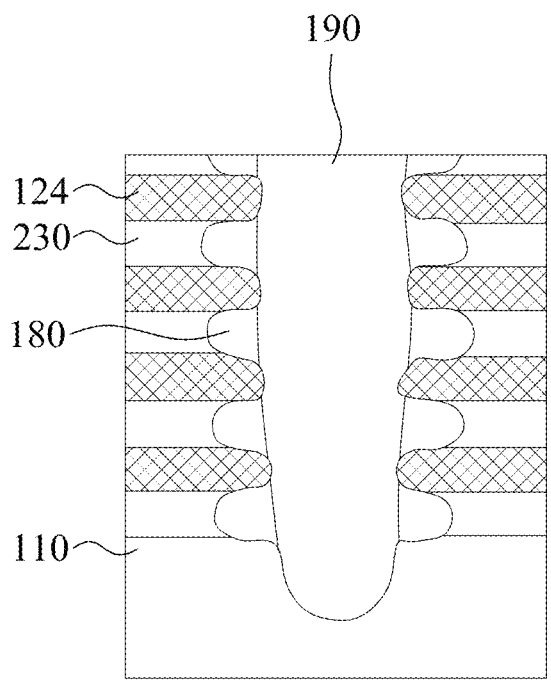

FIGS. 21D-21J are enlarged views of a portion of the etched fin structure shown in FIG. 21B during the selective chemical dry etching process 370, according to some other embodiments. In FIG. 21D, the selective chemical dry etching process 370 was performed by using a gas mixture with a $F_2$ gas/HF gas flow rate ratio about 20 at about 40 degrees Celsius. In FIG. 21E, the selective chemical dry etching process 370 was performed by using a gas mixture with a $F_2$ gas/HF gas flow rate ratio about 40 at about 40 degrees Celsius. In FIG. 21F, the selective chemical dry etching process 370 was performed by using a gas mixture with a $F_2$ gas/HF gas flow rate ratio about 60 at about 40 degrees Celsius. In FIG. 21G, the selective chemical dry etching process 370 was performed by using a gas mixture with a $F_2$ gas/HF gas flow rate ratio about 80 at about 40 degrees Celsius. In FIG. 21H, the selective chemical dry etching process 370 was performed at a temperature about 40 degrees Celsius. In FIG. 21I, the selective chemical dry etching process 370 was performed at a temperature about 60 degrees Celsius. In FIG. 21J, the selective chemical dry etching process 370 was performed at a temperature about 80 degrees Celsius.

Figure 23A:
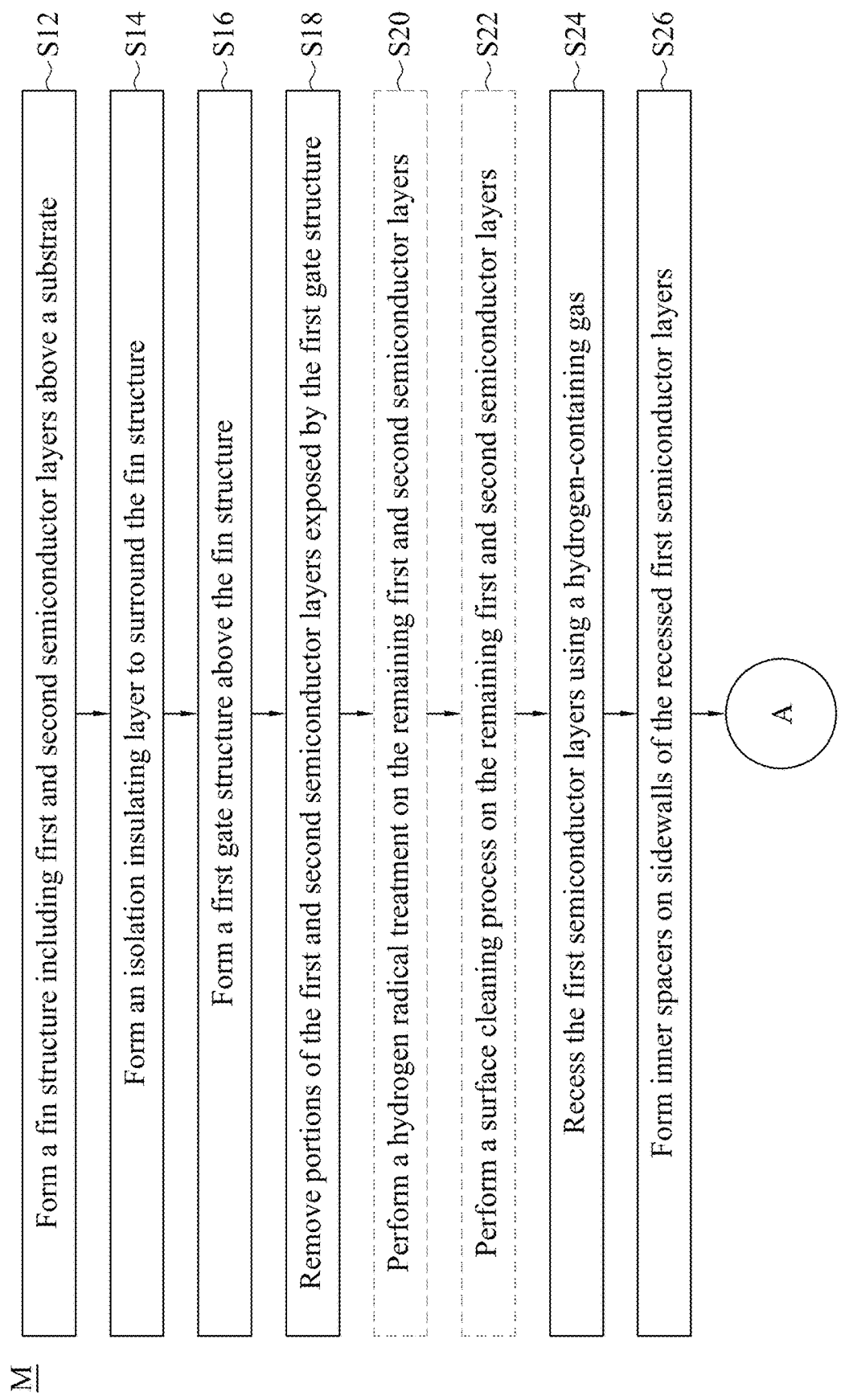
FIGS. 23A and 23B are a flow chart of a method for forming a semiconductor device in accordance with some embodiments of the present disclosure.
Figure 23B:
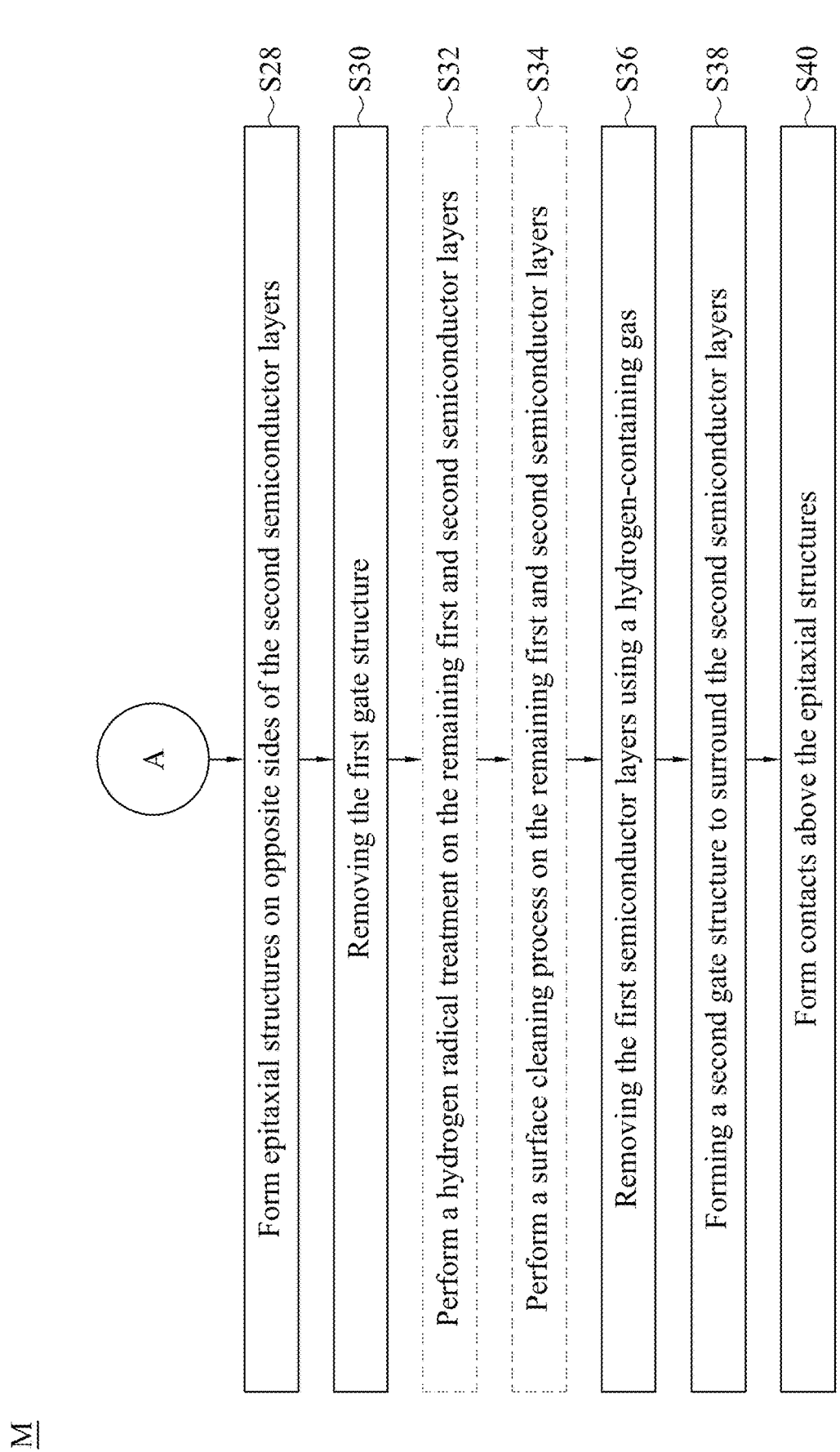

FIGS. 23A and 23B are a flow chart of a method M for forming a semiconductor device in accordance with some embodiments of the present disclosure. Although the method M is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At block S12, a fin structure including first and second semiconductor layers is formed above a substrate, wherein the first and second semiconductor layers are stacked alternately. FIGS. 1-2 illustrate perspective views of some embodiments corresponding to act in block S12. At block S14, an isolation insulating layer is formed to surround the fin structure. FIGS. 3-4 illustrate perspective views of some embodiments corresponding to act in block S14. At block S16, a first gate structure is formed above the fin structure. FIGS. 5-6 illustrate perspective views of some embodiments corresponding to act in block S16. At block S18, portions of the first and second semiconductor layers exposed by the first gate structure are removed. FIGS. 8A and 8B illustrate a perspective view and a cross-sectional view of some embodiments corresponding to act in block S18. At block S20, a hydrogen radical treatment is performed on the remaining first and second semiconductor layers. FIG. 9A illustrates a perspective view of some embodiments corresponding to act in block S20. At block S22, a surface cleaning process is performed on the remaining first and second semiconductor layers. FIG. 10A illustrates a perspective view of some embodiments corresponding to act in block S22. At block S24, the first semiconductor layers are recessed using a hydrogen-containing gas. FIGS. 11A and 11B illustrate a perspective view and a cross-sectional view of some embodiments corresponding to act in block S24. At block S26, inner spacers are formed on sidewalls of the recessed first semiconductor layers. FIGS. 12A-13B illustrate a perspective view and a cross-sectional view of some embodiments corresponding to act in block S26. At block S28, epitaxial structures are formed on opposite sides of the second semiconductor layers. FIG. 14 illustrates a perspective view of some embodiments corresponding to act in block S28. At block S30, the first gate structure is removed. FIG. 16 illustrates a perspective view of some embodiments corresponding to act in block S30. At block S32, a hydrogen radical treatment is performed on the remaining first and second semiconductor layers. FIG. 17 illustrates a perspective view of some embodiments corresponding to act in block S32. At block S34, a surface cleaning process is performed on the remaining first and second semiconductor layers. FIG. 18 illustrates a perspective view of some embodiments corresponding to act in block S34. At block S36, the first semiconductor layers are removed using a hydrogen-containing gas. FIGS. 19A and 19B illustrate a perspective view and a cross-sectional view of some embodiments corresponding to act in block S36. At block S38, a second gate structure is formed to surround the second semiconductor layers. FIGS. 20A-20C illustrate a perspective view and cross-sectional views of some embodiments corresponding to act in block S38. At block S40, contacts are formed above the epitaxial structures. FIGS. 21A-21C illustrate a perspective view and cross-sectional views of some embodiments corresponding to act in block S40. In some embodiments, the blocks S20, S22, S32 and/or S34 can be omitted.

Figure 25:
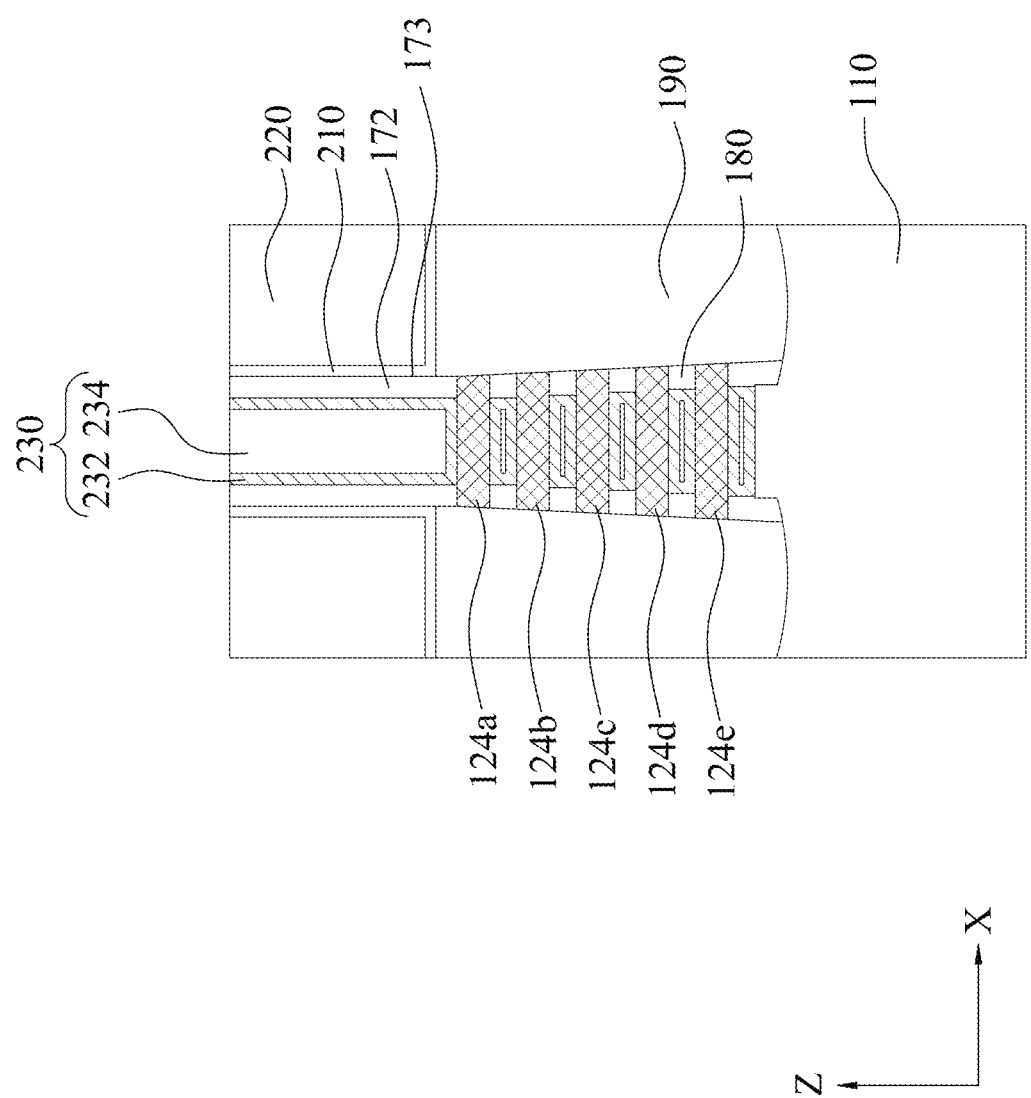
FIG. 25 is a cross-sectional view of a semiconductor device in accordance with some embodiments of the present disclosure.

FIG. 25 is a cross-sectional view of a semiconductor device in accordance with some embodiments of the present disclosure. The difference between the semiconductor devices of FIG. 25 and FIG. 21B pertains to the shape of the second semiconductor layers 124. In FIG. 25, the second semiconductor layers 124a-124e have different lengths. For example, the second semiconductor layers 124a is shorter than the second semiconductor layers 124b, the second semiconductor layers 124b is shorter than the second semiconductor layers 124c, the second semiconductor layers 124c is shorter than the second semiconductor layers 124d, and the second semiconductor layers 124d is shorter than the second semiconductor layers 124e. The inner spacers 180, however, have substantially the same thickness. Other relevant structural details of the semiconductor devices of FIG. 25 are similar to or the same as the semiconductor devices of FIGS. 21A-21C, and, therefore, a description in this regard will not be repeated hereinafter.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the selective chemical dry etching process improves the profiles of the recessed first semiconductor layers, such that the inner spacers formed on the sides of the first semiconductor layers have uniform profile. Another advantage is that the selective chemical dry etching process also improves the profile (e.g., the surface roughness) of the second semiconductor layers (channels), such that the electrical mobility and the quality of the gate structure are both improved. Further, the selective chemical dry etching process can be performed at a high temperature with good etching selectivity between the first and second semiconductor layers, thereby benefiting on chamber maintenance (for mass production).

According to some embodiments, a method including forming a fin structure including a plurality of first semiconductor layers and a plurality of second semiconductor layers alternately stacked over a substrate. A dummy gate structure is formed across the fin structure such that the dummy gate structure covers a first portion of the fin structure while second portions of the fin structure are exposed. The exposed second portions of the fin structure are removed. After removing the second portions of the fin structure, a selective etching process is performed, using a gas mixture including a hydrogen-containing gas and a fluorine-containing gas, to laterally recess the first semiconductor layers in the first portion of the fin structure. The selective etching process etches the first semiconductor layers at a faster etching rate than etching the second semiconductor layers. Inner spacers are formed on opposite end surfaces of the laterally recessed first semiconductor layers of the first portion of the fin structure. Source/drain epitaxial structures are formed on opposite end surfaces of the second semiconductor layers in the first portion of the fin structure. The dummy gate structure is removed to expose the first portion of the fin structure. The laterally recessed first semiconductor layers in the exposed first portion of the fin structure are removed while leaving the second semiconductor layers in the exposed first portion of the fin structure suspended above the substrate. A gate structure is formed to surround each of the suspended second semiconductor layers.

According to some embodiments, a method including forming a stacked structure of a plurality of first semiconductor layers and a plurality of second semiconductor layers alternately stacked over a substrate. The stacked structure is patterned into a fin structure extending along a first direction. A dummy gate structure is formed extending across the fin structure along a second direction substantially perpendicular to the first direction. The exposed second portions of the fin structure are removed. Gate spacers are formed respectively on opposite sides of the dummy gate structure. The dummy gate structure is removed to form a gate trench between the gate spacers. A hydrogen radical treatment is performed to the first and second semiconductor layers of the fin structure in the gate trench to remove oxygen in the first and second semiconductor layers. After performing the hydrogen radical treatment, the first semiconductor layers are selectively removed from the gate trench while leaving the second semiconductor layers suspended in the gate trench. After selectively removing the first semiconductor layers from the gate trench, a gate structure is formed in the gate trench.

According to some embodiments, a device including forming a plurality of channel layers, a gate structure, a source/drain epitaxial structure, and a plurality of inner spacers. The channel layers are arranged one above another in a spaced apart manner over a substrate. The gate structure surrounds each of the plurality of channel layers. The source/drain epitaxial structure are connected to the plurality of channel layers. The plurality of channel layers includes Si—H bonds on interfaces between the source/drain epitaxial structure and the plurality of channel layers. The inner spacers are between the source/drain epitaxial structure and the gate structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a fin structure comprising a plurality of first semiconductor layers and a plurality of second semiconductor layers alternately stacked over a substrate;
   forming a dummy gate structure across the fin structure such that the dummy gate structure covers a first portion of the fin structure while second portions of the fin structure are exposed;
   removing the exposed second portions of the fin structure;
   after removing the exposed second portions of the fin structure, performing a first oxygen-removal process, using hydrogen radicals, to remove oxy ens in the first semiconductor layers;
   after removing the exposed second portions of the fin structure, performing a second oxygen-removal process, using a hydrogen-containing gas mixture, to remove a native oxide layer formed on sidewalls of the first semiconductor layers, wherein the hydrogen radicals used in the first oxygen-removal process has sizes smaller than the hydrogen-containing gas mixture used in the second oxygen-removal process;

after performing the first oxygen-removal process, performing a selective etching process, using an etching gas mixture comprising a hydrogen-containing gas and an $F_2$ gas, to laterally recess the first semiconductor layers in the first portion of the fin structure, wherein the selective etching process etches the first semiconductor layers at a faster etching rate than etching the second semiconductor layers;

forming inner spacers on opposite end surfaces of the laterally recessed first semiconductor layers of the first portion of the fin structure;

forming source/drain epitaxial structures on opposite end surfaces of the second semiconductor layers in the first portion of the fin structure;

removing the dummy gate structure to expose the first portion of the fin structure;

removing the laterally recessed first semiconductor layers in the exposed first portion of the fin structure while leaving the second semiconductor layers in the exposed first portion of the fin structure suspended above the substrate; and forming a gate structure to surround each of the suspended second semiconductor layers.

2. The method of claim 1, wherein the hydrogen-containing gas of the etching gas mixture is HF gas.

3. The method of claim 1, wherein a temperature for performing the selective etching process is in a range from about 0 degrees Celsius to about 90 degrees Celsius.

4. The method of claim 1, wherein the first oxygen-removal process and the selective etching process are performed in a same processing chamber.

5. The method of claim 1, wherein a power for providing the hydrogen radicals is in a range from about 500 W to about 5000 W.

6. The method of claim 1, wherein the exposed second portions of the fin structure are removed by an etching process using an oxygen-containing gas mixture.

7. The method of claim 1, wherein a gas ratio of the hydrogen-containing gas to the $F_2$ gas is from about 20 to about 120.

8. The method of claim 1, wherein the first oxygen-removal process is further performed to remove oxygens in the second semiconductor layers.

9. The method of claim 1, wherein the second oxygen-removal process is performed after the first oxygen-removal process is performed.

10. A method comprising:
forming a stacked structure of a plurality of first semiconductor layers and a plurality of second semiconductor layers alternately stacked over a substrate;
patterning the stacked structure into a fin structure extending along a first direction;
forming a dummy gate structure extending across the fin structure along a second direction substantially perpendicular to the first direction;
forming gate spacers respectively on opposite sides of the dummy gate structure;
removing the dummy gate stricture to form a gate trench between the gate spacers;
performing a hydrogen radical treatment to the first and second semiconductor layers of the fin structure in the gate trench to remove oxygen in the first and second semiconductor layers;
after performing the hydrogen radical treatment, selectively removing the first semiconductor layers from the gate trench while leaving the second semiconductor layers suspended in the gate trench; and
after selectively removing the first semiconductor layers from the gate trench, forming a gate structure in the gate trench.

11. The method of claim 10, wherein selectively removing the first semiconductor layers from the gate trench is performed in-situ with the hydrogen radical treatment.

12. The method of claim 10, further comprising removing native oxides on surfaces of the first semiconductor layers prior to selectively removing the first semiconductor layers from the gate trench.

13. The method of claim 12, wherein removing the native oxides on the surfaces of the first semiconductor layers is performed using a HF gas.

14. The method of claim 12, wherein removing the native oxides on the surfaces of the first semiconductor layers is performed using a $NH_3$ gas as catalyst.

15. The method of claim 12, wherein selectively removing the first semiconductor layers from the gate trench is in-situ performed with removing the native oxides on the surfaces of the first semiconductor layers.

16. The method of claim 10, wherein selectively removing the first semiconductor layers is performed by using a gas mixture of an $F_2$ gas and a HF gas.

17. A method comprising:
forming a fin structure comprising a plurality of first semiconductor layers and a pluralit$^y$, of second semiconductor layers alternately stacked over a substrate;
forming a dummy gate structure across the fin structure;
removing portions of the fin structure not covered by the dummy gate structure;
after removing portions of the fin structure, performing a first oxygen-removal process, using hydrogen radicals, to remove oxygens in the first semiconductor layers;
after removing portions of the fin structure, performing a second oxygen-removal process, using a hydrogen-containing gas mixture, to remove a native oxide layer formed on sidewalk of the first semiconductor layers, wherein the hydrogen adicals used in the first oxygen-removal process has sizes smaller than the hydrogen-containing gas mixture used in the second oxygen-removal process;
after performing the first oxygen-removal process, performing a selective etching process to laterally recess the first semiconductor layers, wherein the selective etching process etches the first semiconductor layers at a faster etching rate than etches the second semiconductor layers;
forming inner spacers on opposite end surfaces of the laterally recessed first semiconductor layers;
forming source/drain epitaxial structures on opposite end surfaces of the second semiconductor layers; and
replacing the dummy gate structure and the first semiconductor layers with a gate structure.

18. The method of claim 17, wherein the hydrogen-containing gas mixture used in the second oxygen-removal process comprises $NH_3$ and HF.

19. The method of claim 17, wherein a gas mixture used in the selective etching process comprises HF and $F_2$.

20. The method of claim 17, wherein the second oxygen-removal process and the selective etching process are performed under vacuum conditions and without breaking vacuum.

* * * * *